(12) United States Patent
Asai et al.

(10) Patent No.: US 6,643,921 B2
(45) Date of Patent: Nov. 11, 2003

(54) CIRCUIT-COMPONENT MOUNTING METHOD AND CIRCUIT-COMPONENT MOUNTING SYSTEM

(75) Inventors: Koichi Asai, Nagoya (JP); Seigo Kodama, Aichi-ken (JP); Shinsuke Suhara, Kariya (JP)

(73) Assignee: Fuji Machine Mfg. Co., Ltd., Chiryu (JP)

(*) Notice: Subject to any disclaimer, the term of this patent is extended or adjusted under 35 U.S.C. 154(b) by 125 days.

(21) Appl. No.: 09/873,392

(22) Filed: Jun. 5, 2001

(65) Prior Publication Data

US 2001/0025413 A1 Oct. 4, 2001

Related U.S. Application Data

(62) Division of application No. 09/015,521, filed on Jan. 29, 1998, now Pat. No. 6,286,202.

(30) Foreign Application Priority Data

Feb. 4, 1997 (JP) .............................................. 9-21674

(51) Int. Cl.[7] ................................................ H05K 3/30
(52) U.S. Cl. ............................ 29/833; 29/832; 29/740; 29/759
(58) Field of Search ......................... 29/840, 832, 833, 29/740, 759; 356/394, 375, 376; 414/416, 427

(56) References Cited

U.S. PATENT DOCUMENTS

| | | |
|---|---|---|
| 4,677,473 A | 6/1987 | Okamoto et al. |
| 4,696,104 A | 9/1987 | Vanzetti et al. |
| 4,914,808 A | 4/1990 | Okumura et al. |
| 5,588,200 A * | 12/1996 | Schudel .................. 29/603.01 |
| 5,686,994 A * | 11/1997 | Tokura ....................... 356/394 |
| 5,689,756 A * | 11/1997 | Taki et al. .................... 399/33 |
| 5,747,102 A | 5/1998 | Smith et al. |
| 5,758,410 A * | 6/1998 | Asai et al. .................... 29/740 |
| 5,825,500 A * | 10/1998 | Iino et al. ................... 356/394 |

FOREIGN PATENT DOCUMENTS

| | | |
|---|---|---|
| JP | A-4-284249 | 10/1992 |
| JP | A-6-23946 | 2/1994 |
| JP | A-6-106705 | 4/1994 |
| JP | A-6-238867 | 8/1994 |
| JP | A-6-342998 | 12/1994 |
| JP | A-7-76065 | 3/1995 |
| JP | B2-7-26810 | 3/1995 |
| JP | B2-8-20213 | 3/1996 |

* cited by examiner

Primary Examiner—Carl J. Arbes
Assistant Examiner—Tai V. Nguyen
(74) Attorney, Agent, or Firm—Oliff & Berridge, PLC

(57) ABSTRACT

A system for mounting a plurality of circuit components on a circuit substrate, including a substrate supporting device which supports the circuit substrate, a component mounting device which mounts each of the circuit components on the circuit substrate supported by the substrate supporting device, a testing device which tests an actual state in which the each circuit component is mounted on the circuit substrate by the component mounting device, and a control device which controls the component mounting device to mount the each of the circuit components on the circuit substrate and controls the testing device to test, each time one of the circuit components is mounted on the circuit substrate by the component mounting device, an actual state in which the one circuit component is mounted on the circuit substrate.

10 Claims, 39 Drawing Sheets

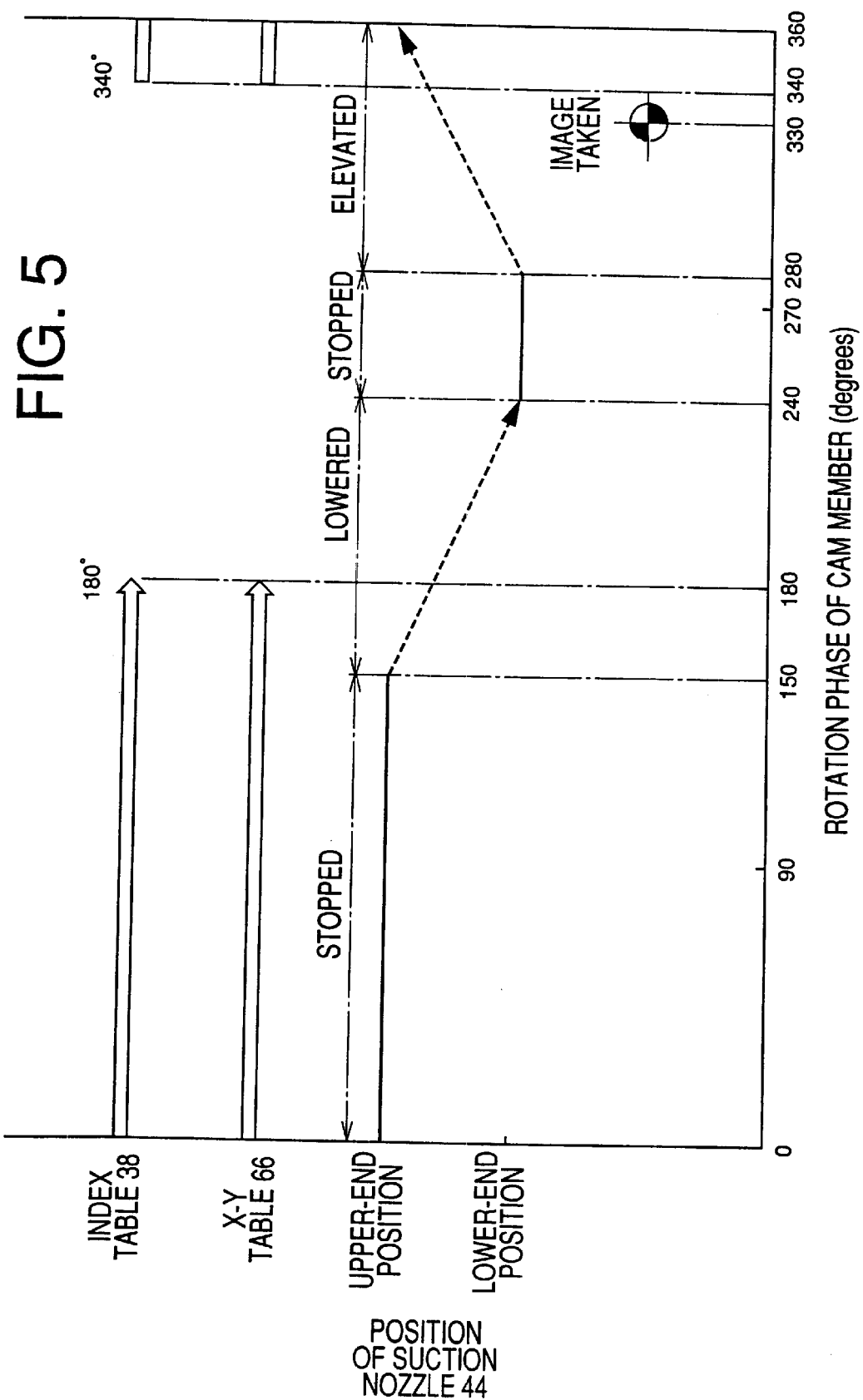

SMALL CC 18

RAW IMAGE TAKEN
BY CAMERA 194

TALL CC 18

RAW IMAGE TAKEN
BY CAMERA 194

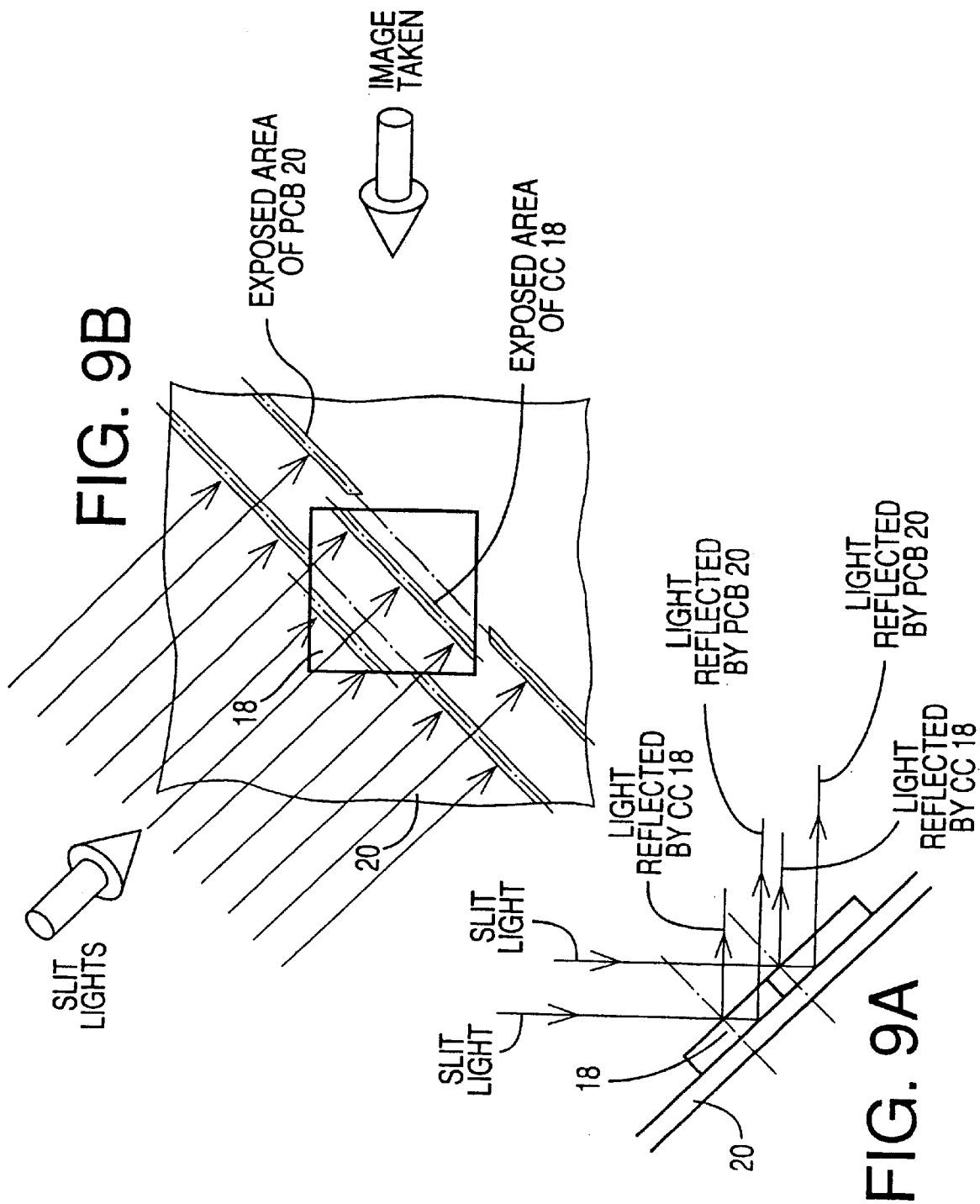

RAW IMAGE TAKEN
BY CAMERA 194

(RAW)

(BIN)

(RAW)

(BIN)

SMALL CC 318

RAW IMAGE TAKEN
BY CAMERA 194

CIRCUIT-COMPONENT MOUNTING METHOD AND CIRCUIT-COMPONENT MOUNTING SYSTEM

This application is a Division of Ser. No. 09/015,521 filed on Jan. 29, 1998; now U.S. Pat. No. 6,286,202.

BACKGROUND OF THE INVENTION

1. Field of the Invention

The present invention relates to a method and an apparatus for mounting a plurality of circuit components on a circuit substrate and thereby producing an electric circuit.

2. Related Art Statement

It is practiced to test, when an electric circuit ("EC") is produced by mounting a plurality of circuit components ("CCs") on a circuit substrate ("CS"), a state in which the CCs are mounted on the CS. For example, it is judged whether one or more CCs have not been mounted on a CS, and/or whether a position where a CC is mounted on a CS, or an attitude taken by a CC mounted on a CS is not appropriate. This test may be performed after CCs are temporarily fixed to a CS with an adhesive, a solder paste, or the like, or after the CCs are finally fixed to the CS by hardening the adhesive, soldering the solder paste, or the like. In the former case, even if the test shows that one or more CCs have not been mounted, or have not been appropriately mounted, on a CS, the CCs can be finally fixed to the CS after an operator removes those problems. Thus, the yield of good electric circuits is improved. Alternatively, the operator can discard one or more CSs for which some problem relating to the mounting of one or more CCs thereon has been found. Thus, no useless, finally fixing operation is performed. In addition, it is possible to identify a position error of a CC which is produced in a temporarily fixing operation, from that produced in a finally fixing operation. In the last case, the operator can take appropriate measures against each of those problems.

However, in the conventional manner, a test after a temporarily fixing operation is performed after all CCs are mounted on a CS. Hence, it is required to dispose a testing device between a CC mounting device which temporarily fixes the CCs to the CS, and a finally fixing device such as a hardening furnace which finally fixes the CCs to the CS. This leads to increasing the overall length of an EC assembly line and the cost of the same.

SUMMARY OF THE INVENTION

It is therefore an object of the present invention to provide a circuit-component mounting method and a circuit-component mounting system each of which is free from the above-identified disadvantage.

The present invention provides a circuit-component mounting method and a circuit-component mounting system which have one or more of the technical features which are described below in respective paragraphs given parenthesized sequential numbers (1) to (16). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed.

(1) According to a first feature of the present invention, there is provided a method of mounting a plurality of circuit components on a circuit substrate for producing an electric circuit, comprising the step of testing, each time one of the circuit components is mounted on the circuit substrate, a state in which said one circuit component is mounted on the circuit substrate. The test result may show that one circuit component ("CC") has not been mounted, or has not been appropriately mounted, on the circuit substrate ("CS"). In the present CC mounting method, each time one of the CCs is mounted on the CS, a state in which said one CC is mounted on the CS is tested. This test step may be carried out each time one CC is temporarily fixed to the CS. Since the present method does not require that a testing device be provided between a CC mounting device and a finally fixing device, neither the overall length of an electric-circuit ("EC") assembly line nor the cost of the same is increased.

(2) According to a second feature of the present invention, there is provided a system for mounting a plurality of circuit components on a circuit substrate, comprising, a substrate supporting device which supports the circuit substrate; a component mounting device which mounts each of the circuit components on the circuit substrate supported by the substrate supporting device; a testing device which tests an actual state in which the each circuit component is mounted on the circuit substrate by the component mounting device; and a control device which controls the component mounting device to mount the each of the circuit components on the circuit substrate and controls the testing device to test, each time one of the circuit components is mounted on the circuit substrate by the component mounting device, an actual state in which the one circuit component is mounted on the circuit substrate. In the present CC mounting system, the control device controls the mounting device to mount each of the CCs on the CS, and controls the testing device to test, each time one of the CCs is mounted on the CS by the mounting device, an actual state in which said one CC is mounted on the CS. Accordingly, the present CC mounting system may be employed for carrying out the CC mounting method according to the first feature (1). It is preferred that the testing device be one which can identify whether a position where each CC is mounted on the CS and an attitude taken by each CC mounted on the CS are appropriate. However, the testing device may be one which can identify only whether a position where each CC is mounted on the CS is appropriate, or one which can identify only whether each CC has not been mounted on the CS. Regarding the CC-position test, in particular, it is preferred to test not only (a) a position or positions of a reference point (e.g., center point) of each CC in one or two directions parallel to a surface of the CS but also (b) a position of the same in a direction perpendicular to the CS surface. However, it is possible to test only either one of the above two sorts of positions (a), (b). In the case of the position or positions (a), it is preferred to test two positions of the reference point of each CC in two directions which perpendicularly intersect each other in a plane parallel to the CS surface. Regarding the CC-attitude test, it is preferred to test not only (c) an angle of inclination of a reference line (e.g., center axis line) of each CC with respect to a direction parallel to the CS surface but also (d) an angle of inclination of the reference line with respect to a direction perpendicular to the CS surface. However, it is possible to test only either one of the above two sorts of positions (c), (d). The position error (b) and attitude (angle) error (d) of each CC with respect to the direction perpendicular to the CS surface result from the "unfixed" state of said each CC on the CS surface. A CC may erroneously take an upright attitude, i.e., lie on its one side. This can be said as a 90-degree inclination of the CC with respect to the direction perpendicular to the CS surface.

(3) According to a third feature of the present invention which includes the second feature (2), the testing device comprises an image taking device which takes an image of at least a portion of the each circuit component mounted on the circuit substrate; and judging means for judging whether the actual state of the each circuit component is appropriate, by comparing, with a reference state of the each circuit component, the actual state thereof determined based on the image taken by the image taking device. Testing the state in which each CC is mounted on the CS involves detecting said each CC. The detection of each CC may be carried out by a contact-type detector, but a non-contact-type detector is preferable to the contact-type detector. Of various sorts of non-contact-type detectors, an optical detector that can detect an object at a high speed is preferable, and an image taking device is particularly preferable since it can easily obtain various sorts of information. The image taking device is advantageously provided by a surface-image taking device such as a CCD (charge-coupled device) camera, but may be provided by a line-image taking device such as a line sensor. The actual state of each CC may be indicated in terms of any of the various states and amounts exemplified in the context of the CC mounting system according to the second feature (2), and the reference state of each CC may be indicated in terms of the same. In addition, the reference state of each CC may be a standard state in which the CC is ideally mounted on the CS; a boundary state in which the CC is mounted on the CS with the largest tolerable error; or a cautious state in which the CC is mounted on the CS with a large tolerable error which may lead to the boundary state and accordingly need an appropriate action to reduce the error. In the case where the reference state is the standard state, the testing device may judge whether the actual state of each CC is appropriate, based on whether the difference between the actual state and the standard state is large or not. In the case where the reference state is the boundary or cautious state, the testing device may judge whether the actual state of each CC is appropriate, based on whether the actual state goes beyond the boundary or cautious state or not.

(4) According to a fourth feature of the present invention which includes the third feature (3), the testing device additionally comprises a slit-light emitting device which emits a slit light along a plane which is inclined with respect to a surface of the circuit substrate and intersects a surface of the each circuit component mounted on the surface of the circuit substrate, and wherein the image taking device takes an image of at least an area of the surface of the each circuit component which area is exposed to the slit light emitted by the slit-light emitting device. The testing device may not only judge whether each CC is present or absent on the CS, but also determine a position where each CC is mounted on the CS and/or an attitude taken by each CC mounted on the CS. For a certain reason, e.g., the reason that the surface of the CS is much darker than that of each CC, it may be difficult to take an image of an area of the surface of the CS which area is exposed to the slit light. Even in this case, it is possible to test the presence or absence of each CC on the CS, the position of each CC on the CS and/or the attitude of each CC on the CS, based on only the image of the area of the surface of each CC which area is exposed to the slit light. However, in the case where the testing device can take both of the above two images, the testing device can easily determine the position and attitude of each CC with respect to the direction perpendicular to the CS surface. In addition, since the present CC mounting system uses the image or images of only a small area or areas, it can a process image data representing those image or images in a short time. Thus, the present system can mount each CC on the CS at a short interval of time, while reliably testing the actual state in which said each CC is mounted on the CS.

(5) According to a fifth feature of the present invention which includes the fourth feature (4), the slit-light emitting device comprises a plural-slit-lights emitting device which emits a plurality of slit lights along a plurality of planes, respectively, which are parallel to each other.

(6) According to a sixth feature of the present invention which includes the fourth or fifth feature (4) or (5), the slit-light emitting device comprises two slit-light emitters which emit respective slit lights parallel to respective directions which are inclined with respect to the surface of the circuit substrate in respective planes which are perpendicular to each other and each of which is perpendicular to the surface of the circuit substrate, so that the respective slit lights emitted by the two slit-light emitters substantially perpendicularly intersect each other on the surface of the each circuit component mounted on the surface of the circuit substrate.

(7) According to a seventh feature of the present invention which includes any one of the second to sixth features (6), the circuit-component mounting system further comprises a memory which stores data indicating the each circuit component, when the testing device provides a test result that the actual state of the each circuit component is not appropriate; and a test-result output device which outputs, after all the circuit components are mounted on the circuit substrate, the data stored in the memory, so that an operator can recognize the each circuit component indicated by the data outputted by the test-result output device. In the present CC mounting system, even if it is found during a CC mounting operation that one or more CCs have not been mounted, or have been inappropriately mounted, on the CS, the CC mounting operation is continued without being interrupted and, after all the CCs to be mounted on the CS are actually mounted on the CS, the test-result output device is operated to output the data stored in the memory. In the case where the testing device finds the inappropriate mounting of at least one CC on the CS, it is desirable that when the output device outputs the data, stopping means which may be provided by a portion of the control device be operated for automatically stopping the operation of the CC mounting device. The test-result output device may be an optical display device such as a liquid crystal display or a cathode ray tube display, or a printer which records the test result on a sheet of paper. In either case, when the output device outputs the test result after the CC mounting operation, the operator can recognize the CC or CCs which has or have not been mounted, or has or have inappropriately mounted, on the CS and can take appropriate measures against those problems. For example, in the case where a certain CC has not been mounted on the CC, the operator can manually mount the CC on the CS; and in the case where a CC is mounted on the CS with an excessively great position error, the operator can correct the position of the CC on the CS and then place the CS on the following device such as another CC mounting device, an adhesive hardening device, a solder reflowing surface, or the like. Alternatively, based on the test result outputted by the output device, the operator can adjust, for preventing the re-occurrence of the same sort of inappropriate CC mounting, the CC mounting device, or a control panel or a controllable section of an adhesive applying device or a solder-paste applying device which is provided on an upstream side of the CC mounting device in the direction in which the CS is conveyed.

(8) According to an eighth feature of the present invention which includes the seventh feature (7), the circuit-component mounting system further comprises candidate specifying means for specifying at least one candidate for a cause of the test result that the actual state of the each circuit component is not appropriate, wherein the test-result output device comprises a candidate output device which outputs the candidate specified by the candidate specifying means.

(9) According to a ninth feature of the present invention which includes the eighth feature (8), the testing device further comprises information obtaining means for obtaining information relating to a component-mount position where the each circuit component is mounted on the circuit substrate, and wherein the candidate specifying means comprises component-mount-position-dependent candidate specifying means for specifying the candidate by taking into account the information obtained by the information obtaining means. There are candidates which can be specified based on the information relating to the component-mount position where each CC is mounted on the CS. Those candidates may include the amount or amounts of difference (i.e., distance or distances) between the actual position or positions of each CC mounted on the CS and the correct position or positions of each CC, and the direction or directions of difference of the former position or positions from the latter position or positions. The actual position or positions of each CC are an example of the above-described actual state of each CC, and the correct position or positions of each CC are an example of the above-described reference state of each CC.

(10) According to a tenth feature of the present invention which includes the eighth or ninth feature (8) or (9), the circuit-component mounting system further comprises a temporarily-fixing-material applying device which is provided on an upstream side of the component mounting device in a direction of conveying of the circuit substrate and which applies, to a component-mount place on a surface of the circuit substrate, a temporarily fixing material which temporarily and stably fixes the each circuit component to the component-mount place, wherein the candidate specifying means comprises applied-material-state testing means for testing a state in which the temporarily fixing material is applied by the temporarily-fixing-material applying device to the component-mount place on the surface of the circuit substrate; and applied-material-state-dependent candidate specifying means for specifying the candidate by taking into account the state of the temporarily fixing material tested by the applied-material-state testing means. The state of the temporarily fixing material tested by the applied-material-state testing means may include at least one of an amount and a position of the applied temporarily fixing material. If the temporarily fixing material is not appropriately applied to the CS, each CC may not be appropriately mounted on the CS.

(11) According to an eleventh feature of the present invention which includes any one of the second to tenth features (2) to (10), the circuit-component mounting system comprises a controllable device which is controllable for preventing the circuit components from being inappropriately mounted on the circuit substrate; and a controllable-device control device which controls the controllable device based on the actual state of the each circuit component tested by the testing device. In the present circuit-component mounting system, the controllable-device control device controls the controllable device to carry out automatically the operation or operations which should be carried out by the operator based on the circuit component or components indicated by the data outputted by the test-result output device in accordance with the seventh feature (7). Although the present system does not essentially need the test-result output device, it is preferred that the present system include not only the controllable device and the controllable-device control device but also the test-result output device. In the case where the controllable-device control device starts controlling the controllable device when the error of the position where a CC is mounted on a CS or the attitude taken by a CC mounted on a CS exceeds a permissible range or limit, the present system effectively prevents the return or re-occurrence of inappropriate mounting of a CC or CCs on a CS or CSs. In the case where the controllable-device control device starts controlling the controllable device when the error of the position where a CC is mounted on a CS or the attitude taken by a CC mounted on a CS exceeds a threshold range or value narrower or smaller than the permissible range or limit, the present system surely prevents the occurrence of inappropriate mounting of a CC or CCs on a CS or CSs beyond the permissible range or limit. The control device of the CC mounting system in accordance with the second feature (2) may comprise (a) automatically stopping means for automatically stopping the component mounting device when the error of the position where a CC is mounted on a CS or the attitude taken by a CC mounted on a CS exceeds a permissible range or limit; and (b) an operable member which is operable by the operator for re-starting the component mounting device after he or she has carried out a necessary operation or operations.

(12) According to a twelfth feature of the present invention which includes the eleventh feature (11), the component mounting device comprises at least one component holder which holds the each circuit component, and a holder moving device which moves the component holder to a desired position in a holder-conveying plane parallel to a surface of the circuit substrate supported by the substrate supporting device, and wherein the controllable device comprises the holder moving device. For example, the component holder may be one which includes a suction pipe which sucks and holds a CC by applying a negative pressure thereto. In this case, if the suction pipe is not straight, i.e., includes a bent portion, the CC held thereby would have X-direction- and/or Y-direction-position errors if the suction pipe is rotated about its axis line for changing the angular or rotation position of the CC according to a control program, or correcting the rotation-position error of the CC. The greater the degree of bending of the suction pipe or the angle of rotation of the suction pipe is, the greater the X-direction-and/or Y-direction-position errors are. Since the degree of bending of the suction pipe can be estimated based on the past data indicative of the X-direction- and/or Y-direction-position errors of CCs, and the rotation position of each CC at the time when it is mounted on a CS can be obtained from the control program, the holder moving device can be controlled to move the component holder by corrected X-direction and/or Y-direction distances which minimize the X-direction- and/or Y-direction-position errors of each CC. Thus, the holder moving device corresponds to the controllable device which is controllable for preventing a CC from being inappropriately mounted on a CS.

(13) According to a thirteenth feature of the present invention which includes the eleventh or twelfth feature (11) or (12), the circuit-component mounting system further comprises a temporarily-fixing-material applying device which is provided on an upstream side of the component mounting device in a direction of conveying of the circuit substrate and which applies, to a component-mount place on a surface of the circuit substrate, a temporarily fixing material which temporarily and stably fixes the each circuit component to the component-mount place, wherein the controllable device comprises the temporarily-fixing-material applying device.

(14) According to a fourteenth feature of the present invention which includes the thirteenth feature (13), the temporarily-fixing-material applying device comprises a adhesive dispenser including a syringe in which an adhesive as the temporarily fixing material is stored; a nozzle connected to the syringe; and a pressurized-gas supplying device which supplies a pressurized gas to the syringe for causing an amount of the adhesive to be released from the nozzle so that a spot of the adhesive is formed on the surface of the circuit substrate, wherein the controllable device comprises an adjusting device which adjusts at least one of the amount of the adhesive dispensed by the adhesive dispenser and a position where the adhesive is dispensed by the adhesive dispenser. In this case, the adjusting device comprises at least one of (a) an adhesive-amount adjusting device which adjusts the amount of the adhesive dispensed by the adhesive dispenser and (b) an adhesive-dispensing-position adjusting device which adjusts a position where the adhesive is dispensed by the adhesive dispenser.

(15) According to a fifteenth feature of the present invention which includes the thirteenth feature (13), the temporarily-fixing-material applying device comprises a screen printing device including a screen having a plurality of holes at a plurality of positions, respectively, which correspond to a plurality of positions on the surface of the circuit substrate where a solder paste as the temporarily fixing material is to be applied; and a squeegee which applies, through the screen, the solder paste to the surface of the circuit substrate, and wherein the controllable device comprises an adjusting device which adjusts at least one of an amount of the solder paste applied by the screen printing device and a position where the solder paste is applied by the screen printing device. In this case, the adjusting device includes at least one of (a) a solder-paste-amount adjusting device which adjusts an amount of the solder paste applied by the screen printing device and (b) a solder-paste-applying-position adjusting device which adjusts a position where the solder paste is applied by the screen printing device. It is usual that the solder paste has a high viscosity immediately after CCs are mounted on a CS. Thus, the solder paste functions as the temporarily fixing material which temporarily fixes the CCs to the CS.

(16) According to a sixteenth feature of the present invention which includes any one of the second to fifteenth features (2) to (15), the component mounting device comprises a plurality of component holders which are revolvable around a common axis line; and a holder revolving device which revolves the holders around the common axis line and stops each of the holders at at least one predetermined stop position, wherein the substrate supporting device comprises a substrate moving device which moves the circuit substrate in a direction parallel to a surface of the circuit substrate, so that a component-mount place on the surface of the circuit substrate is positioned at a component mounting position corresponding to the predetermined stop position, and wherein the testing device comprises an image taking device which takes an image of at least a portion of the each circuit component mounted on the circuit substrate and which is fixed at a position, near the component mounting position, where the image taking device can take the image of the portion of the each circuit component. The holder revolving device may be one which essentially includes an intermittently rotatable body which holds a plurality of component holders in a peripheral portion thereof such that the component holders are equiangularly spaced from each other about an axis line thereof, and which is intermittently rotatable about the axis line such that it is continuously rotated by a predetermined intermittent-rotation angle in a first step and then is stopped in a second step and the first and second steps are repeated. Alternatively, the holder revolving device may be one which is disclosed in U.S. patent application Ser. No. 08/769,700 assigned to the Assignee of the present U.S. patent application, that is, one which includes a plurality of rotary members which holds a plurality of component holders, respectively, and which are rotated about a common axis, independent of each other. The present CC mounting system can mount each CC on a CS at a shortened interval of time, that is, with an improved efficiency. In addition, the image taking device need not be moved, i.e., can be fixed. In the case where the image taking device is iteratively moved and stopped together with the component holder which is moved while holding the CC, it is difficult to increase the speed of movement of the image taking device because the image taking device has a considerably great mass and accordingly it is difficult to improve the efficiency of mounting of CCs. In contrast, the present CC mounting system is equipped with the fixed image taking device, which leads to improving easily the efficiency of mounting of CCs.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which:

FIG. 5 is a chart indicating a timing at which a CCD camera shown in FIG. 1 takes an image of a CC held by a suction nozzle shown in FIG. 1;

FIG. 9A is a view corresponding to FIG. 7A, in the case where a CC and a PCB are exposed to two slit lights in a manner different from that in which the CC and the PCB are exposed to the single slit light shown in FIGS. 7A to 7C or FIGS. 8A to 8C; and FIG. 9B is a plan view showing respective exposed linear areas of the CC and the PCB;

DETAILED DESCRIPTION OF PREFERRED EMBODIMENTS

Referring to FIGS. 1 to 23, there will be described a circuit-component ("CC") mounting system 10 to which the present invention is applied.

Figure 1:
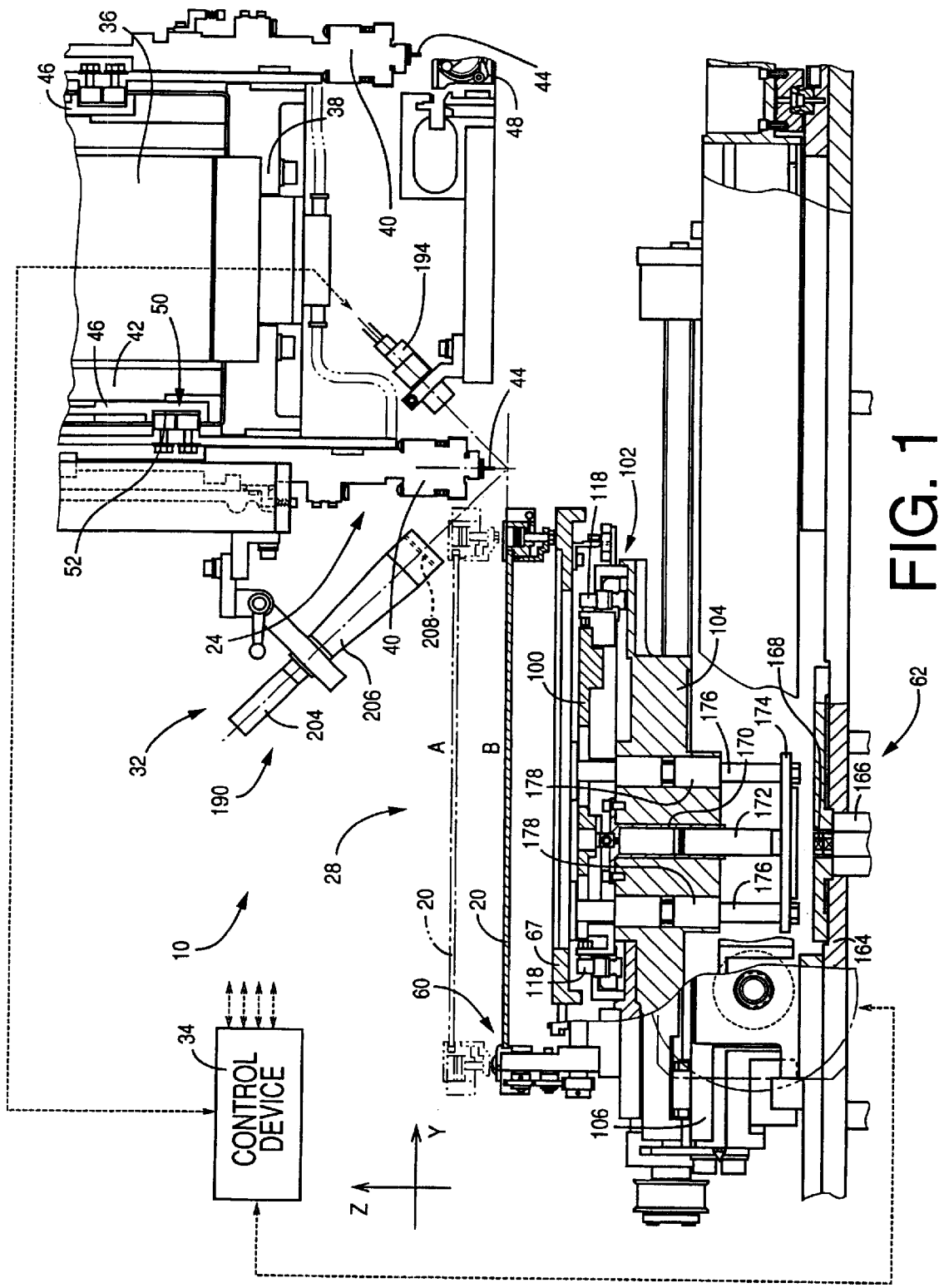
FIG. 1 is a partly cross-sectioned, front elevation view of a circuit-component ("CC") mounting system to which the present invention is applied.

FIG. 1 is a partly cross-sectioned, front elevation view of an essential portion of the CC mounting system 10. The CC mounting system 10 includes a CC mounting device 24 which mounts CCs 18 (FIG. 6) on a printed circuit board ("PCB") 20 as a circuit substrate; a PCB supporting device 28 which supports and moves the PCB 20; and an inspecting or testing device 32 which inspects or tests a state in which the CCs 18 are mounted on the PCB 20. The CC mounting system 10 additionally includes a CC supplying device 48 which supplies the CCs 18 to the CC mounting device 24; and a control device 34 which controls the CC mounting device 24, the PCB supporting device 28, the testing device 32, and the CC supplying device.

The CC mounting device 24 is of a so-called "index" type which is disclosed in Japanese Patent Application laid open for inspection purposes under Publication No. 6(1994)-342998. The CC mounting device 24 is described below as needed for helping understand the present invention. The CC mounting device 24 includes a stationary cylindrical member 36 whose center axis line extends in a vertical direction ("Z direction") in FIG. 1; an index table 38 which is provided below the cylindrical member 36 such that the index table 38 is rotatable about the axis line of the cylindrical member 36; twenty CC mounting units 40 (two units 40 shown in FIG. 1) each as a component holder which are provided on an outer cylindrical surface of the index table 38 such that the twenty units 40 are equidistant from one another on the outer surface of the index table 38 and such that each one of the twenty units 40 is movable independent of the other units 40 in the Z direction; a cylindrical cam 42 which moves, i.e., elevates and lowers the twenty CC mounting units 40 in the Z direction as the index table 38 is rotated; and two elevating and lowering members 46 one of which lowers and elevates, in the Z direction, one CC mounting unit 40 being positioned at a CC sucking and holding position where a suction nozzle 44 of said one unit 40 sucks and holds a CC 18 and the other of which lowers and elevates, in the Z direction and independent of said one unit 40, another CC mounting unit 40 being positioned at a CC mounting position where the CC 18 sucked and held by the suction nozzle 44 of said another unit 40 is mounted on the PCB 20. The CC supplying device 48 is provided in the form of a CC feeder 48 which feeds the CCs 18 one by one to a CC supplying position, i.e., the CC sucking and holding position shown on a right-hand side of the index table 38 in FIG. 1. The CC mounting position is shown on a left-hand side of the index table 38 in FIG. 1. The suction nozzle 44 of each CC mounting unit 40 sucks and holds a CC 18 by applying a vacuum, i.e., a negative pressure thereto.

An outer cylindrical surface of the cylindrical cam 42 has a cam groove (not shown), and each of the CC mounting units 40 includes a cam follower 50 which is engaged with the cam groove of the cylindrical cam 42. The engagement of the cam follower 50 of each unit 40 with the cam groove of the cam 42 defines a position of said each unit in the Z direction. The twenty CC mounting units 40 are rotation-symmetric with one another with respect to the axis line of the cylindrical member 36. The index table 38 is intermittently rotated at an intermittent-rotation angle of 18 degrees about the axis line of the cylindrical member 36 by a cam mechanism (not shown) which is independent of the cylindrical cam 42 and the cam followers 50. The angle of 18 degrees is obtained by dividing 360 degrees by the total number, 20, of the CC mounting units 40. As the index table 38 is intermittently rotated, each of the twenty units 40 is moved over a regular distance and stopped, and this moving and stopping are repeated. Since, however, the cylindrical cam 42 is not rotated, the cam follower 50 of each unit 40 is rolled over in the cam groove of the cylindrical cam 42. Since the cam groove includes a portion whose position in the Z direction continuously changes, the Z-direction position of each unit 40 is continuously changed when the cam follower 50 of said each unit 40 is rolled over in that portion of the cam groove. By employing a cylindrical cam 42 whose cam groove have a desired shape or pattern, it is possible to freely determine, in advance, the locus of Z-direction movement of the lower end of the suction nozzle 44 of each unit 40. In the present embodiment, the cam groove of the cylindrical cam 42 is so formed that each of the CC mounting units 40 takes respective Z-direction positions, shown in FIG. 1, at the CC supplying position (i.e., the CC sucking and holding position) and the CC mounting position, respectively. In FIG. 1, the two elevating and lowering members 46 take their upper dead positions.

The two elevating and lowering members 46 have respective auxiliary cam grooves 52 which cooperate with the main cam groove of the cylindrical cam 42 to provide a generally annular cam groove. The two members 46 are lowered and elevated in the Z direction by two elevating and lowering devices (not shown), respectively, independent of each other. Each of the two elevating and lowering devices lowers and elevates a corresponding one of the two members 46 in a state in which the auxiliary cam groove 52 of said one member 46 is engaged with the cam follower 50 of one CC mounting unit 40 being positioned at a corresponding one of the CC supplying position and the CC mounting position. The timing at which each member 46 lowers and elevates one unit 40 will be described later.

As shown in FIGS. 1 to 4, the PCB supporting device 28 includes a PCB conveying device 58 which conveys the PCB 20; a PCB holding device 60 which positions and holds the PCB 20 which has been conveyed by the PCB conveying device 58; an elevating and lowering device 62 which elevates and lowers, in the vertical Z direction, the PCB conveying device 58 and the PCB holding device 60 between a PCB receiving and handing-over height position indicated at two-dot chain line in FIG. 1 and a CC mounting height position indicated at solid line; a height-position adjusting device 64 which adjusts the CC mounting height position of the PCB holding device 60 (and the PCB conveying device 58); and an X-Y table 66 which supports the PCB holding device 60 via the height-position adjusting device 64 and moves the PCB holding device 60 to a desired position in a horizontal plane.

The PCB conveying device 58 conveys the PCB 20 in an X direction perpendicular to the plane of the drawing sheet of FIG. 1, and the PCB holding device 60 positions and holds the PCB 20 which has been conveyed to a predetermined position by the PCB conveying device 58. With the PCB conveying device 58 being elevated to the PCB receiving and handing-over height position by the elevating and lowering device 62, the PCB conveying device 50 conveys one PCB 20 on which the CCs 18 have been mounted, and hands over the PCB 20 to a PCB carry-out device (not shown), and then receives another PCB 20 on which CCs 18 are to be mounted, from a PCB carry-in device (not shown) and conveys the PCB 20 to the predetermined position. With the PCB holding device 60 and the PCB conveying device 58 being lowered to the CC mounting height position by the elevating and lowering device 62, the height-position adjusting device 64 adjusts the respective height positions of the PCB holding device 60 and the PCB conveying device 58, thereby adjusting the height position of the PCB 20 held by the PCB holding device 60, depending upon the height (i.e., Z-direction dimension) of the CCs 18 to be mounted on the PCB 20. The X-Y table 66 moves the PCB holding device 60 and the PCB conveying device 58 being at the CC mounting height position, to a desired position in a horizontal plane, so that a place on the PCB where a CC 18 is to be mounted is moved and positioned right below the suction nozzle 44 of one CC mounting unit being at the CC mounting position.

While the general construction of the PCB supporting device 28 has been described above, the PCB supporting device 28 will be described in more detail below, because the present invention relates to this device 28.

Figure 2:
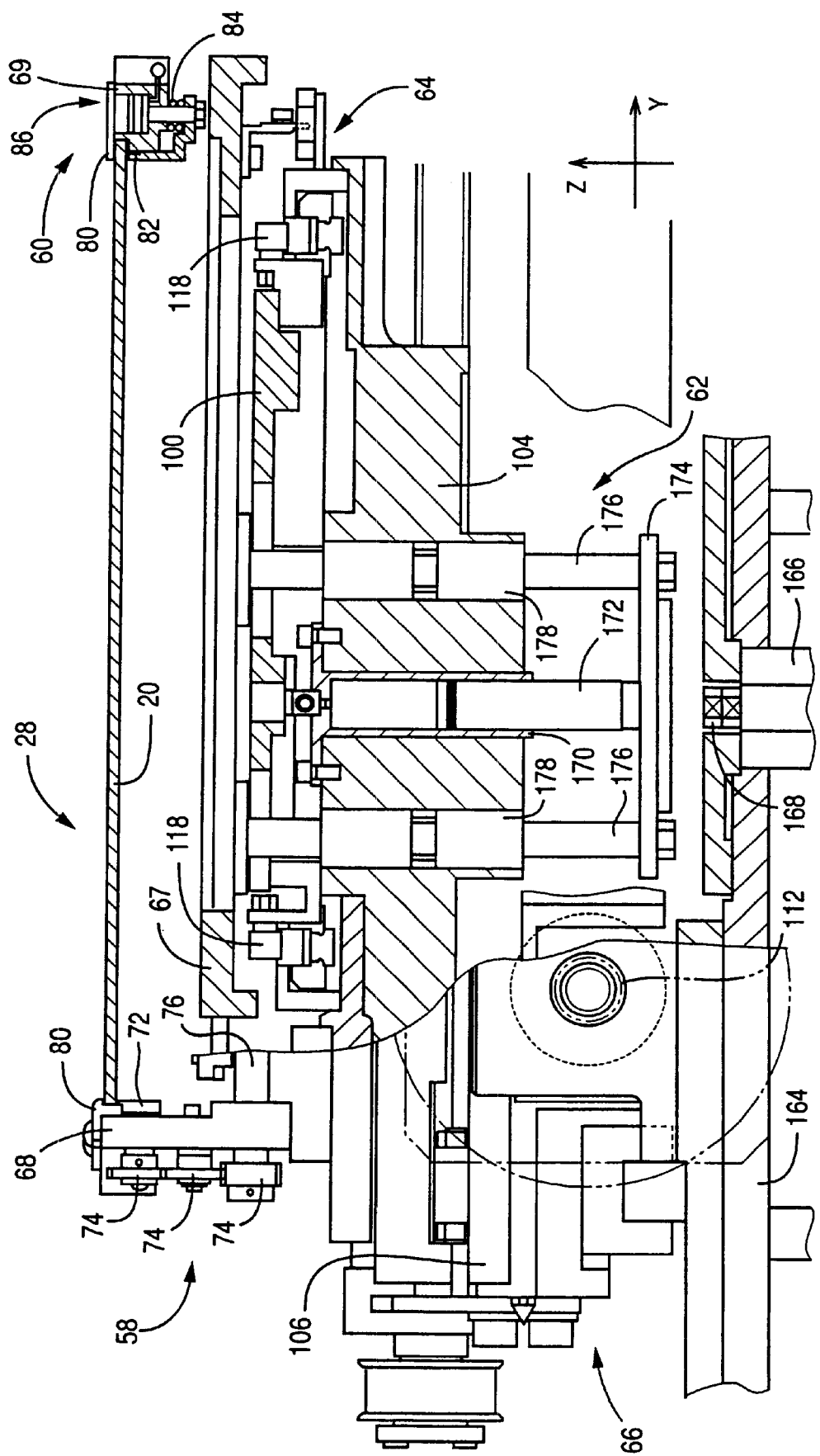
FIG. 2 is a partly cross-sectioned, front elevation view of a printed-circuit-board ("PCB") supporting device of the CC mounting system of FIG. 1.

FIG. 2 is an enlarged, front elevation view of the PCB supporting device 28 shown in FIG. 1. The PCB conveying device 58 includes a main frame 67 which has a central opening and extends in a horizontal direction; and a pair of side frames 68, 69 which are supported by the main frame 67. The main frame 67 is elevated and lowered by the elevating and lowering device 62 and, at the CC mounting height position, the height position of the main frame 62 is adjusted by the height-position adjusting device 64, so that the two side frames 68, 69 are elevated and lowered and the height position thereof is adjusted. The PCB conveying device 58 includes a pair of conveying belts 72 (one belt 72 is shown in FIG. 2) which extend parallel to each other; and a rotation transmitting device including a plurality of gears 74 and a rotatable axis member 76 which cooperate with each other to operate or move the pair of belts 72. The pair of belts 72 supports opposite end portions of the PCB 20. When the axis member 76 is rotated by an electric motor (not shown), the pair of belts 72 are moved at the same speed, so that the PCB 20 is stably conveyed at that speed.

The PCB holding device 60 includes two fixed clamping members 80 which are fixed to the two side frames 68, 69, respectively; and two movable clamping members 82 (only one member 82 provided on the side of the side frame 69 is shown in FIG. 2) which cooperate with the corresponding fixed clamping members 80 to clamp the opposite end portions of the PCB 20. The movable clamping members 82 are normally biased by springs 84 as biasing members, so that they are held at their inoperative positions below the belts 72 away from the fixed clamping members 80. When air-operated cylinder devices 86 are operated, the movable clamping members 82 are moved toward the corresponding fixed clamping members 80 against the biasing forces of the springs 84, so that the movable and fixed clamping members 82, 80 cooperate with each other to clamp the PCB 20.

Figure 3:
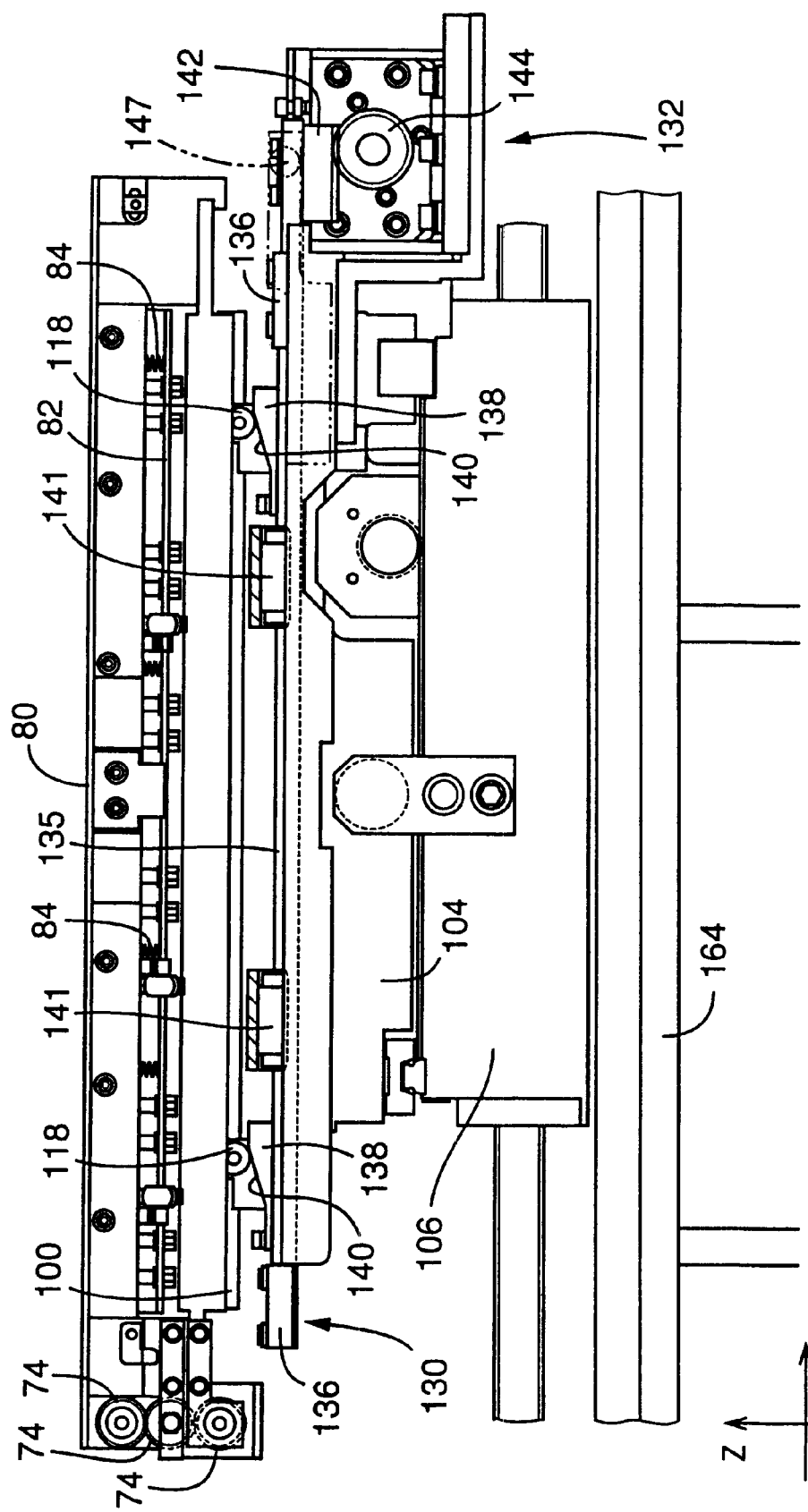
FIG. 3 is a right-hand elevation view of the PCB supporting device of FIG. 2.
Figure 4:
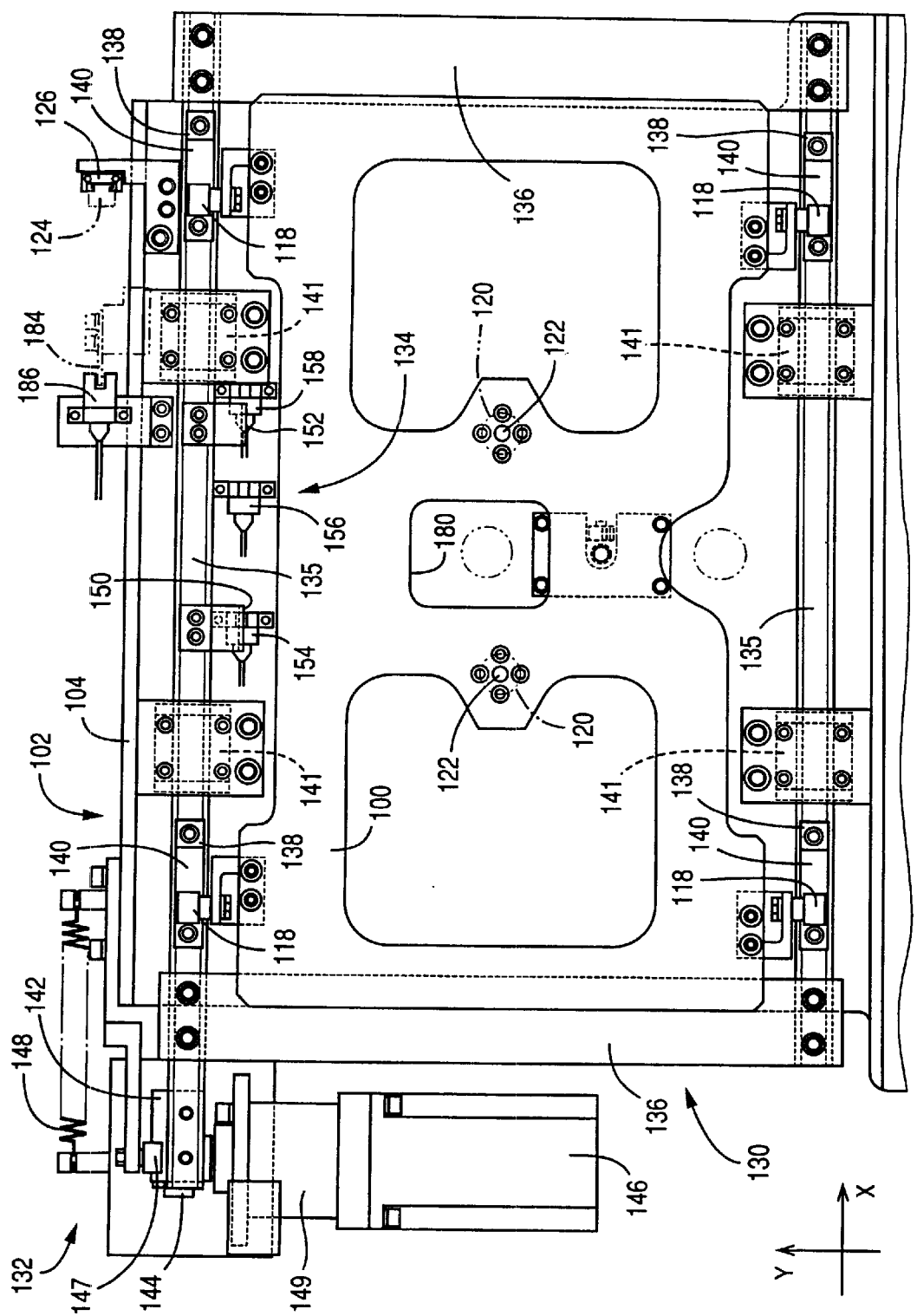
FIG. 4 is a plan view of a Z table and a Z-table moving device shown in FIGS. 1 to 3.

As shown in FIGS. 3 and 4, the height-position adjusting device 64 includes a Z table 100 which supports, under the lower surface of the main frame 67, the main frame 67 of the PCB moving device 58 being at the CC mounting height position; and a Z table moving device 102 which moves the Z table 100 in the Z direction. As is apparent from FIG. 4, the Z table 100 is equipped with four rollers 118 at four locations on its side surfaces, respectively, such that the rollers 118 are rotatable about their axis lines parallel to a horizontal plane. When the four rollers 118 are moved in the Z direction by the Z-direction moving device 102, the Z table 100 is moved in the Z direction. The Z table 100 is equipped with two positioning bushings 120 in which two positioning shafts 122 fixed to a Y table 104 are fitted, respectively, so that the Z table 100 and the Y table 104 are inhibited from being moved relative to each other in the X direction and a Y direction perpendicular to the X direction. The main frame 67 is equipped with a horizontal control mechanism (not shown), and the main frame 67 is supported by the Z table 100 via the horizontal control mechanism, so that an upper surface of the main frame 67, i.e., an upper surface of the PCB 20 can maintain an accurately horizontal attitude. As shown in FIG. 4, the main frame 67 is equipped with a rail 124, and the Y table 104 is equipped with a linear guide 126 (the members 124, 126 are omitted from the other figures), so that the main frame 67 and the Y table 104 can be smoothly moved relative to each other and can be effectively prevented from being moved out of position relative to each other in the X and Y directions.

The Z-table moving device 102 includes a wedge block frame 130; a wedge-block-frame moving device 132 which moves, on the Y table 104, the wedge block frame 130 relative to the Y table 104 in the X direction; and a relative-position detector 134 which detects a position of the wedge block frame 130 relative to the Y table 104 in the X direction.

The wedge block frame 130 is a rectangular frame which is provided by two rails 135 and two connection members 136 which connect the two rails 135 to each other such that the two rails 135 extend parallel to each other in the X direction. Two identical wedge blocks 138 are provided at two places on each of the two rails 135. Thus, the wedge block frame 130 is equipped with four wedge blocks 138 in total. Each of the four wedge blocks 138 has an inclined surface 140, and a vector representative of a normal line of the inclined surface 140 does not have any Y-direction component and has only a Z-direction and a X-direction component. The respective inclined surfaces 140 of the four wedge blocks 138 are engageable with the four rollers 118 of the Z table 100, respectively. The wedge block frame 130 is moved, on the Y table 104, by the wedge-block-frame moving device 132 (described later) relative to the Y table 104 in the X direction, so that the wedge blocks 138 provided on the frame 130 are also moved relative to the Y table 104 in the X direction. However, the Z table 100 having the rollers 118 with which the wedge blocks 138 are engageable are inhibited from being moved relative to the Y table 104 in the X and Y directions, as described above. Therefore, when the wedge block frame 130 is moved relative to the Y table 104 in the X direction, the Z table 100 is moved relative to the Y table 104 in the Z direction only while the rollers 118 roll on the inclined surfaces 140 of the wedge blocks 138.

The wedge-block-frame moving device 132 includes four linear guides 141 which are fixed to the Y table 104, two of which cooperate with each other to hold a corresponding one of the two rails 135 such that said one rail 135 is movable relative thereto in the X direction, and the other two of which cooperate with each other to hold the other rail 135 in the same manner; a rack 142 which is attached to an end portion of one of the two rails 135; a pinion 144 which is meshed with the rack 142; an electric motor 146 which rotates the pinion 144; a hold-down roller 147 which holds down the rack 142 on the pinion 144 for preventing the rack 142 and the pinion 144 from being separated from each other in a direction perpendicular to a longitudinal direction of the rack 142 and a direction parallel to an axis line of rotation of the pinion 144; and a spring 148 which prevents backlash which may occur due to the meshing of the rack 142 and the pinion 144. Each of the two rails 135 is hung by corresponding two of the four linear guides 141, so that said each rails 135 can be smoothly moved relative to the Y table 104. When the pinion 144 engaged with the rack 142 is rotated by the electric motor 146, the wedge block frame 130 is moved relative to the Y table 104 in the X direction. A reduction gear unit 149 is disposed between the electric motor 146 and the pinion 144. The electric motor 146 is controlled by the control device 34. One end of the spring 148 is connected to the rack 142, and the other end of the spring 148 is connected to the Y table 104, so that the spring 148 biases the rack 142 rightward in FIG. 4.

The Z-table moving device 102 includes the relative-position detector 134, as described above. The relative-position detector 134 includes two detection plates 150, 152 which are attached to the rail 135 to which the rack 142 is attached; and three photointerruptors 154, 156, 158 which are attached to the Y table 104. In the state shown in FIG. 4, the first photointerruptor 154 is detecting the first detection plate 150, and the second and third interrupters 156, 158 are not detecting any detection plates 150, 152. The respective outputs of the three interrupters 154, 156, 158 are supplied to the control device 34. The distance between the second and third interrupters 156, 158 defines a range in which the wedge block frame 130 and the Y table 104 are moved relative to each other in the X direction. More specifically, when the control device 34 recognizes that the third interrupter 158 has detected the second plate 152, the control device 34 controls the electric motor 146 so that the wedge block frame 130 is not moved any more rightward in FIG. 4 and, when the control device 34 recognizes that the second interrupter 156 has detected the second plate 152, it controls the motor 146 so that the frame 130 is not moved any more leftward in FIG. 4. At the former timing, the distance between the Z table 100 and the Y table 104 becomes maximum, so that the main frame 67 takes its highest position and, at the latter timing, the distance becomes minimum, so that the main frame 67 takes its lowest position.

The relative position of the first plate 150 and the first interrupter 154 defines the origin of relative position of the wedge block frame 130 and the Y table 104 in the X direction. More specifically, the control device 34 defines, as the origin, the position of one of opposite ends of the first plate 150 which are opposite to each other in the X direction. In the present embodiment, the right-hand end of the first plate 150 defines the origin. In the state shown in FIG. 4, the wedge block frame 130 is positioned slightly rightward from the origin relative to the Y table 104. The present PCB supporting device 28 additionally includes two relative-position detectors each identical with the relative-position detector 134, one for detecting the relative position of the Y table 104 and an X table 106 in the Y direction and the other for detecting the relative position of the X table 106 and the CC mounting device 26 in the X direction.

The elevating and lowering device 62 includes, as shown in FIGS. 1 and 2, a pressurized-air-operated cylinder device ("air cylinder") 166 which is provided on a base 164 and which includes a piston rod 168; an air cylinder 170 which is fixed to the Y table 104 and which includes a plunger 172; two guide shafts 176 whose upper ends are fixed to the main frame 67 and whose lower ends are connected to the plunger 172 via a connection member 174; and two guide bushings 178 in which the two guide shafts 176 are axially movably fitted, respectively, and which are fixed to the Y table 104. The air cylinders 170, the guide shafts 176, and the guide bushings 178 extend in the Z direction.

In a state in which the pressure chamber of the air cylinder 166 is communicated with the atmosphere, the piston rod 168 of the cylinder 166 is advanced upward by a biasing spring (not shown) to project from the housing of the cylinder 166. The advanced piston rod 168 butts against the connection member 174 and additionally thrusts up the connection member 174, the guide shafts 176, and the main frame 67. Thus, the PCB 20 can be moved up to the PCB receiving and handing-over height position A indicated at two-dot chain line in FIG. 1. On the other hand, when a pressurized air is supplied to the respective pressure chambers of the air cylinder 166 and the air cylinder 170, the plunger 172, the guide shafts 176, and the main frame 67 are moved downward, so that the main frame 67 rests on the Z table 100 and the PCB 20 is moved down to the CC mounting height position B indicated at solid line in FIG. 1. In the latter state, the pressure chamber of the air cylinder 170 maintains the pressurized air, so that the main frame 67 is held in pressed contact with the Z table 100 and the four rollers 118 of the Z table 100 are pressed on the respective inclined surfaces 140 of the four wedge blocks 138 of the wedge block frame 130. When a photointerruptor 186 (FIG. 4) provided on the Y table 104 detects a detection plate 184 provided on the main frame 67, the control device 34 recognizes, based on an output signal supplied from the interrupter 186, that the PCB 20 has been moved to the CC mounting height position B.

As shown in FIG. 1, the testing device 32 includes a slit-light emitting device 190 as a lighting device; a CCD (charge-coupled device) camera 194 as an image taking device; and a data processing device 198 (FIG. 14) as a judging means for measuring, as an actual state where a CC 18 is mounted on a PCB 20, a position where the CC 18 is mounted on the PCB 20, based on the image taken by the CCD camera 194, comparing the measured position with a prescribed position where the CC 18 should be mounted on the PCB 20 as a reference state in which the CC 18 should be mounted on the PCB 20, and judging whether the actual state in which the CC 18 is mounted on the PCB 20 is appropriate, based on the thus obtained comparison result. The data processing device 198 provides part of the control device 34.

The slit-light emitting device 190 includes a semiconductor laser device 204; a beam expander 206 which enlarges the diameter of the laser beam emitted by the laser device 204, and converts the enlarged laser beam into parallel rays having a generally circular cross section; and a slit plate 208 having a slit or slits for converting the parallel rays into a slit light. The slit plate 208 is selected from various slit plates 208 each of which is employable for use with the slit-light emitter 190, which have different numbers of slit or slits, and whose slits have different widths. Thus, the slit-light emitter 190 can emit various sorts of slit lights as described later. However, the slit-light emitter 190 may be replaced with a different sort of device which can emit a slit light, such as one which includes a combination of cylindrical lenses or aspherical lenses.

In the present embodiment, the slit-light emitter 190 and the CCD camera 194 are provided such that respective optical axes of the two devices 190, 194 are perpendicular to each other and each are inclined by 45 degrees with respect to a normal line of the PCB 20. However, the two devices 190, 194 may be provided relative to each other in different manners. Generally, if respective surfaces of two articles have different positions in a direction in which a slit light is incident to the two surfaces, the slit light is reflected at the different positions, so that an observer who observes the two articles in a direction different from the slit-light-incidence direction can identify the different positions from each other. This is true, irrespective of which shapes the articles may have, such as a rectangular parallelopiped, a cylindrical, or a spherical shape. FIGS. 6 to 11 show a CC 18 having a rectangular parallelopiped shape. In this case, too, the slit-light emitter 190 and the CCD camera 194 can be provided such that the CCD camera 194 can receive respective lights or images reflected at different positions on the respective surfaces of the CC 18 and the PCB 20. The manner, shown in FIG. 1, in which the slit-light emitter 190 and the CCD camera 194 are provided relative to each other is just an example.

FIG. 5 is a chart indicating a timing at which the CCD camera 194 takes an image of the CC 18 mounted on the PCB 20. The chart of FIG. 5 also indicates a relationship between respective timings at which the index table 38, the X table 106, the Y table 104, and the suction nozzle 44 are moved. Each time the index table 38 is intermittently rotated by 18 degrees by the previously-mentioned cam mechanism (not shown), one CC 18 is mounted on the PCB 20. The horizontal axis of the chart of FIG. 5 is indicative of the rotation angle of a cam member of the cam mechanism. The one full rotation (i.e., 360 degrees) of the cam member corresponds to the 18-degree rotation of the index table 38. The cam member is fully rotated at a predetermined period of 60 ms and accordingly one CC 18 is mounted during each period of 60 ms. FIG. 5 shows that the index table 38, the X table 106, and the Y table 104 are moved during a time duration when the cam member takes its rotation angle from 340 degrees to 180 degrees. The elevating and lowering member 46 associated with the CC mounting position is lowered during a time duration when the cam member takes its rotation angle from 150 degrees to 240 degrees, and is elevated during a time duration when the cam member takes its rotation angle from 280 degrees to 360 degrees. In FIG. 5, the change of the Z-direction position of the suction nozzle 44 is indicated at broken straight lines. However, in fact, the suction nozzle 44 is lowered or elevated at not a constant speed but a smoothly accelerated or decelerated speed. While the cam member takes its rotation angle from 150 degrees to 180 degrees and from 340 degrees to 360 degrees, both the index table 38 and the elevating and lowering member 46 are concurrently moved. During those time durations, the cam follower 50 of one CC mounting unit 40 rolls in the auxiliary cam groove 52 of the elevating and lowering member 46. The CCD camera 194 takes an image of the CC 18 held by the suction nozzle 44 of the above one CC mounting unit 40, at a timing corresponding to a rotation angle, 330 degrees, of the cam member, as indicated in the chart of FIG. 5.

Figure 6A:
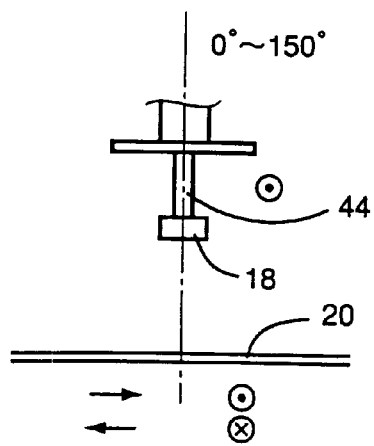
FIGS. 6A to 6F are views showing sequential steps in which the CC held by the suction nozzle is mounted on the PCB as an index table shown in FIG. 1 is rotated by a cam mechanism (not shown)
Figure 6B:
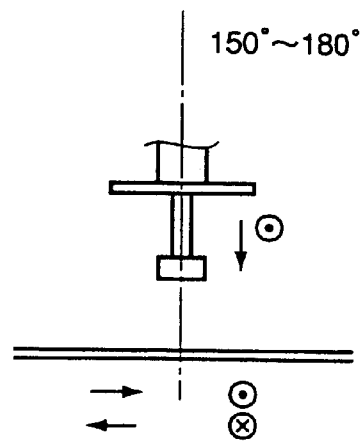
Figure 6C:
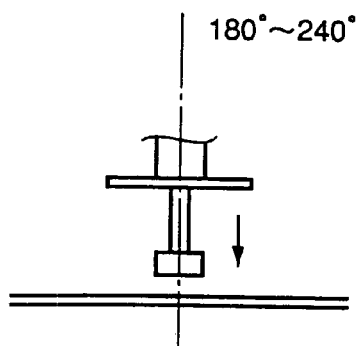
Figure 6D:
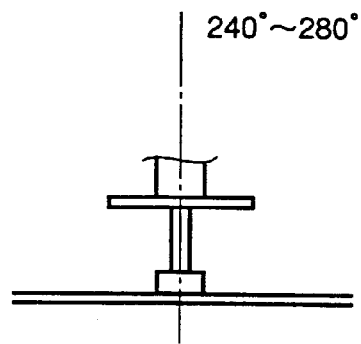
Figure 6E:
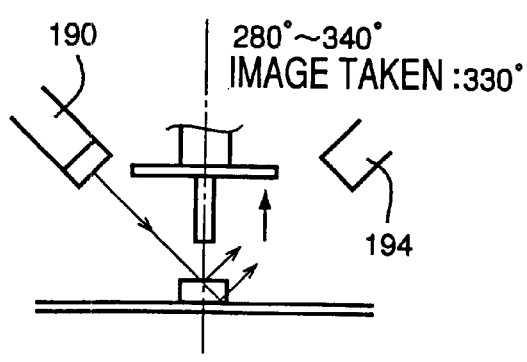
Figure 6F:
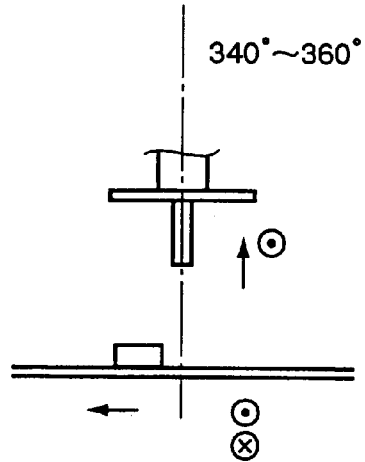

FIGS. 6A to 6F shows a relationship between six ranges of the rotation angle of the cam member and corresponding six relative positions of the suction nozzle 44 and the PCB 20. FIGS. 6A to 6F correspond to the range of 0 to 150 degrees, the range of 150 to 180 degrees, the range of 180 to 240 degrees, the range of 240 to 280 degrees, the range of 280 to 340 degrees, and the range of 340 to 360 degrees, respectively, of the rotation angle of the cam member. FIG. 6E shows that the CCD camera 194 takes an image of the CC 18 mounted on the PCB 20 at the timing corresponding to the rotation angle, 330 degrees, of the cam member. At this timing, the movement of the PCB 20 has not been started, but the mounting of the CC 18 on the PCB 20 has been finished and the elevating of the suction nozzle 44 has been started. Accordingly, the CCD camera 194 can take an image of the CC 18 which has just been mounted on the PCB 20, without being interfered with by the suction nozzle 44. It is required that the CCD camera 194 finish taking the image during a time duration when the cam member takes its rotation angle from 330 to 340 degrees, because when the rotation angle of the cam member takes 340 degrees, the X table 106 and the Y table 104 start their movements so that the PCB 20 is moved. This time duration is equal to ⅙₀₀ second {=60 (ms)×(10 (seconds)/360 (degrees)}. Thus, the CCD camera 104 is required to have a shutter speed of ⅙₀₀ second, or a higher one. However, the data processing device 198 is not required to finish processing the image data indicative of the image taken by the CCD camera 194, but is required to finish it during the period of 60 ms at which each CC 18 is mounted on the PCB 20. For example, in the case where the data processing device 198 needs 33.3 ms for obtaining the image data from the CCD camera 194, the processing device 198 is required to finish processing the image data during the remaining time duration, i.e., 26.7 ms {=60 (ms)–33.3 (ms)}.

Figure 7A:
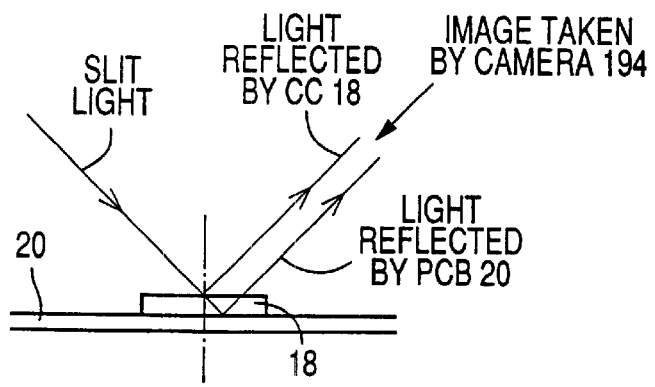
FIG. 7A is a front elevation view showing a geometrical relationship between a slit light emitted by a slit-light emitter shown in FIG. 1 and respective lights reflected by a CC and a PCB.
Figure 7B:
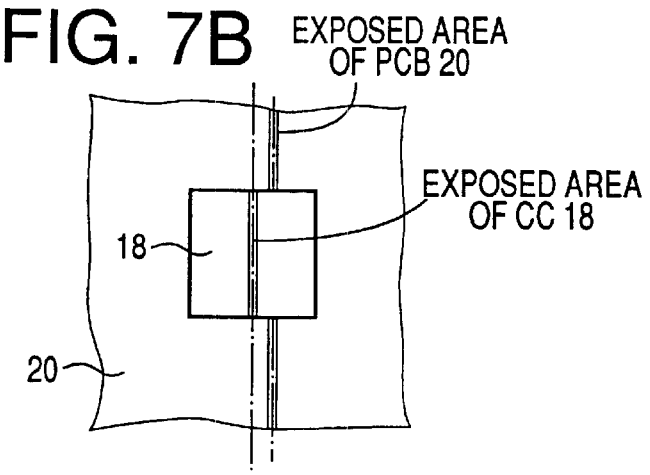
FIG. 7B is a plan view showing respective exposed linear areas of the CC and the PCB.
Figure 7C:
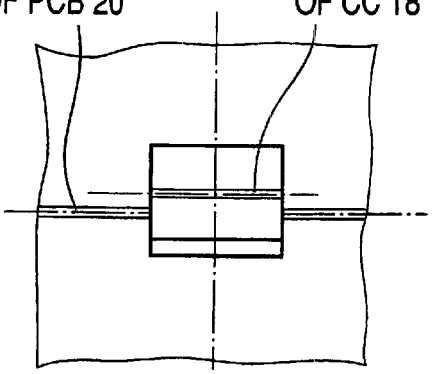
FIG. 7C is a view showing a raw image taken by the CCD camera 194.
Figure 8A:
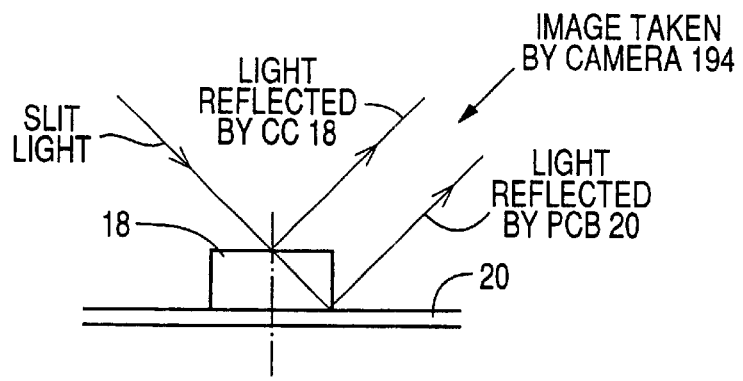
FIGS. 8A, 8B, and 8C are views corresponding to FIGS. 7A, 7B, and 7C, respectively, in the case where the size of a CC used is greater than that of the CC used in FIGS. 7A, 7B, and 7C.
Figure 8B:
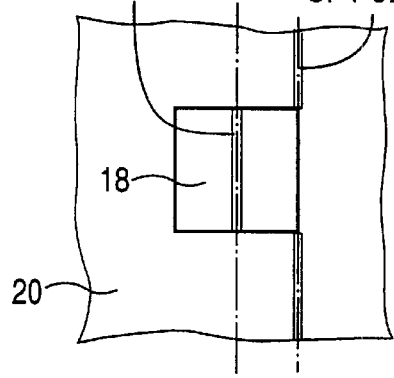
Figure 8C:
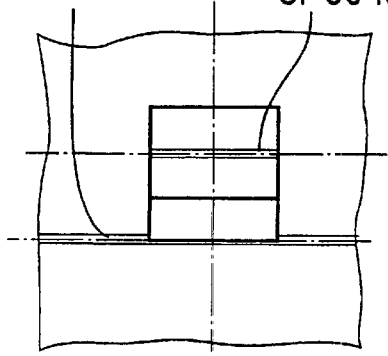

FIG. 7A or FIG. 8A is a front elevation view showing a geometrical relationship between the slit light incident to respective upper surfaces of the CC 18 and the PCB 20 and respective light reflected therefrom; FIG. 7B or 8B is a plan view showing the slit light incident to the respective upper surfaces of the CC 18 and the PCB 20; and FIG. 7C or 8C is a view showing a raw image taken by the CCD camera 194. FIGS. 7A, 7B, and 7C show the case where the CC 18 mounted on the PCB 20 is small; and FIGS. 8A, 8B, and 8C show the case where the CC 18 mounted on the PCB 20 is tall. From the raw image shown in FIG. 7C or 8C, the data processing device 198 can clearly distinguish the position of a linear area of the upper surface of the CC 18 which is exposed to the slit light, from the position of a linear area of the upper surface of the PCB 20 which is exposed to the slit light. Since the slit-light emitter 190 and the CCD camera 194 are inclined by different angles (45 degrees and 135 degrees) with respect to the upper surface of the PCB 20 as shown in FIG. 1, the exposed linear area of the CC 18 is not aligned with the exposed linear area of the PCB 20 in the raw image taken by the CCD camera 194. Based on the measured positions of the two exposed linear areas, the data processing device 198 can test the actual state in which the CC 18 is mounted on the PCB 20. However, regarding the example shown in FIG. 7C or 8C, the data processing device 198 can measure a position of the CC 18 in only the left-right direction in the taken raw image, based on the respective positions of the two linear exposed areas in the Y direction.

FIG. 9A shows an elevation view showing a geometrical relationship between two slit lights incident to respective upper surfaces of the CC 18 and the PCB 20 and respective lights reflected therefrom, in the case where the slit-light emitter 190 emits the two slit lights through the slit plate 208 having two slits parallel to each other, and is inclined by 135 degrees with respect to the CCD camera 194 in a plan view shown in FIG. 9B. In this case, based on the image taken by the CCD camera 194, the data processing device 198 can measure respective positions of the CC 18 in both the left-right direction and the up-and-down direction in the taken image, based on the measured respective positions of the two exposed linear areas of the CC 18 and the two exposed linear areas of the PCB 20.

Figure 10A:
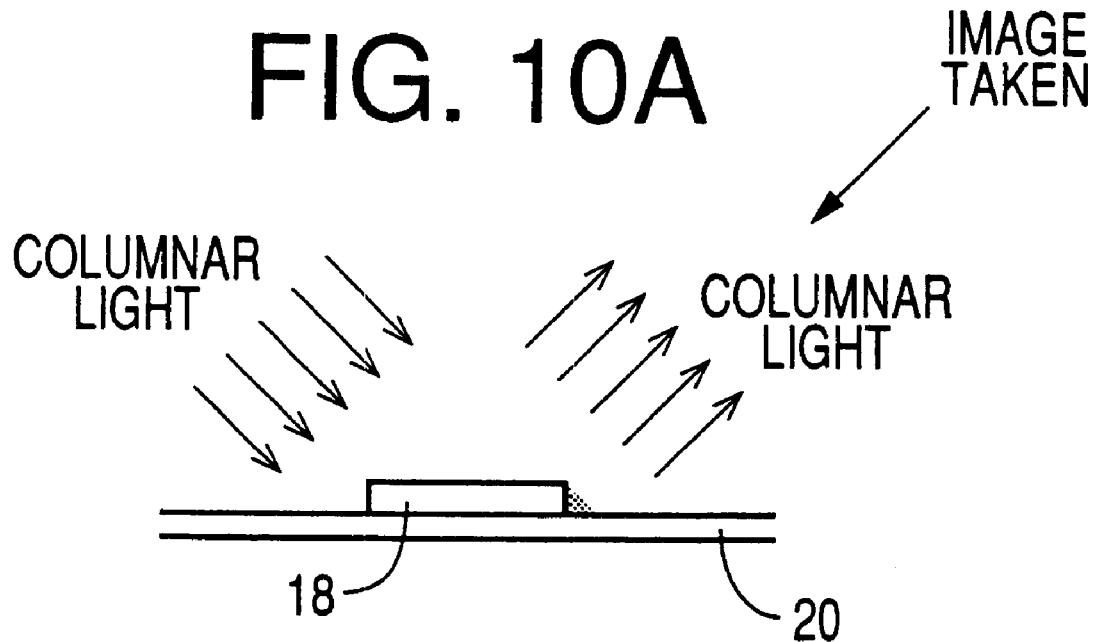
FIG. 10A is a view corresponding to FIG. 7A, in the case where the light emitter shown in FIG. 1 does not have a slit plate shown in FIG. 1.
Figure 10B:
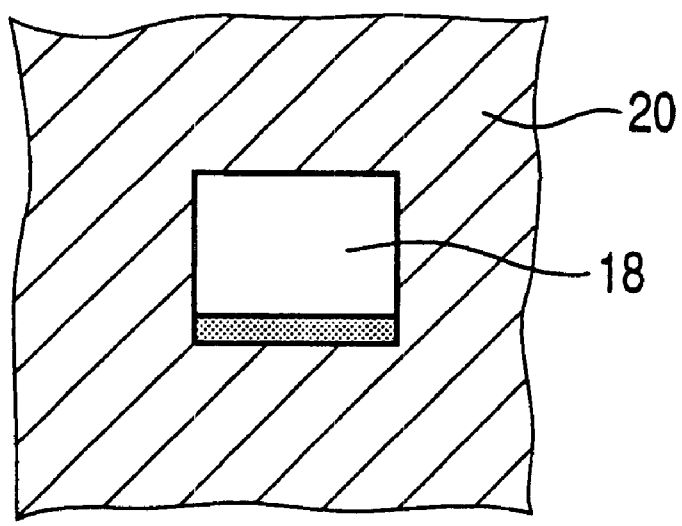
FIG. 10B is a view corresponding to FIG. 7C.

FIG. 10A shows a geometrical relationship between a columnar light emitted by the light emitter 190 without the slit plate 208, and a columnar light reflected from the same CC 18 and PCB 20 as those shown in FIG. 17A, and FIG. 10B shows a raw image taken by the CCD camera 194. In many cases, the intensity of the columnar light reflected from the CC 18 differs from that of the columnar light reflected from the PCB 20, because a coating material which is green in many cases is applied to the upper surface of each PCB 20 and is not applied to the upper surface of each CC 18 and because each PCB 20 and each CC 18 have different colors. In addition, the respective surfaces of each PCB 20 and each CC 18 have different degrees of smoothness, and accordingly the respective lights reflected from those surfaces have different intensities. The data processing device 198 can determine, based on the difference of the intensities of the reflected lights, the boundary line between the CC 18 and the PCB 20 in the image taken by the CCD camera 194, and can measure the position and attitude of the CC 18 based on the thus determined boundary line.

Figure 11:
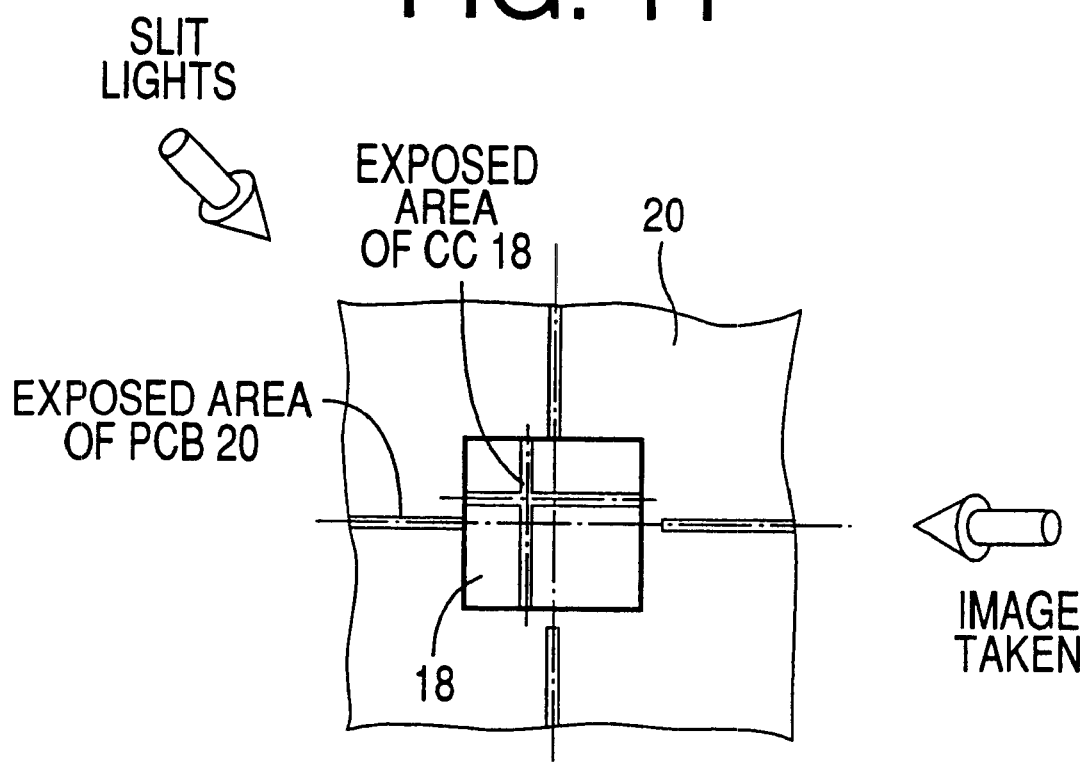
FIG. 11 is a plan view showing respective exposed areas of a CC and a PCB, in the case where a slit-light emitter is provided at a position, β, indicated in FIG. 12 and has a slit plate having a cross slit.

FIG. 11 is a plan view showing respective exposed areas of the CC 18 and the PCB 20, in the case where the slit-light emitter 190 provided at a position, α, in the embodiment shown in FIG. 1 is moved to a position, β, shown in FIG. 11 and the slit plate 208 shown in FIG. 1 is replaced with another slit plate 208 having a cross slit wherein two slits cross each other. Since the slit-light emitter 190 provided at the position β emits the cross-slit light toward the CC 18, the data processing device 198 can measure the respective positions of the CC 18 in both the left-right (horizontal) direction and the up-down (vertical) direction in the image taken by the CCD camera 194. In order to obtain a cross exposed area of the CC 18 wherein two exposed areas perpendicularly intersect each other, it is required that the two slits of the slit plate 208 should intersect each other at an angle other than 90 degrees. It is preferred that this angle is adjustable. However, it is not essentially required that the two exposed areas of the CC 18 should perpendicularly intersect each other as shown in FIG. 11. That is, even though the two exposed areas of the CC 18 may not perpendicularly intersect each other, the data processing device 198 can measure the respective positions of the CC 18 in the horizontal and vertical directions in the image taken by the CCD camera 194.

Figure 12:
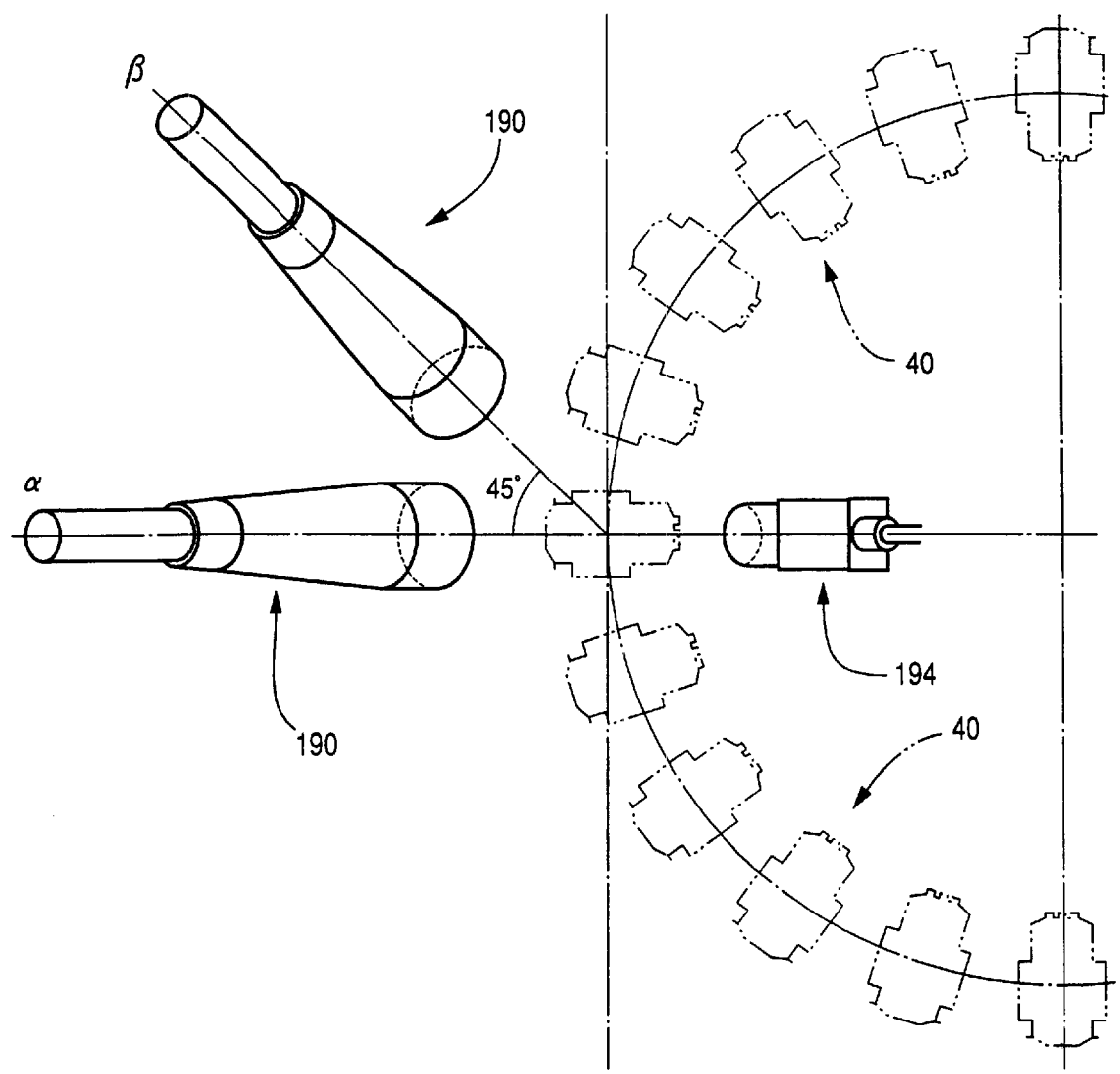
FIG. 12 is a plan view of the slit-light emitter, shown in FIG. 1, provided at a position, α, and another slit-light emitter provided at a position β.
Figure 13:
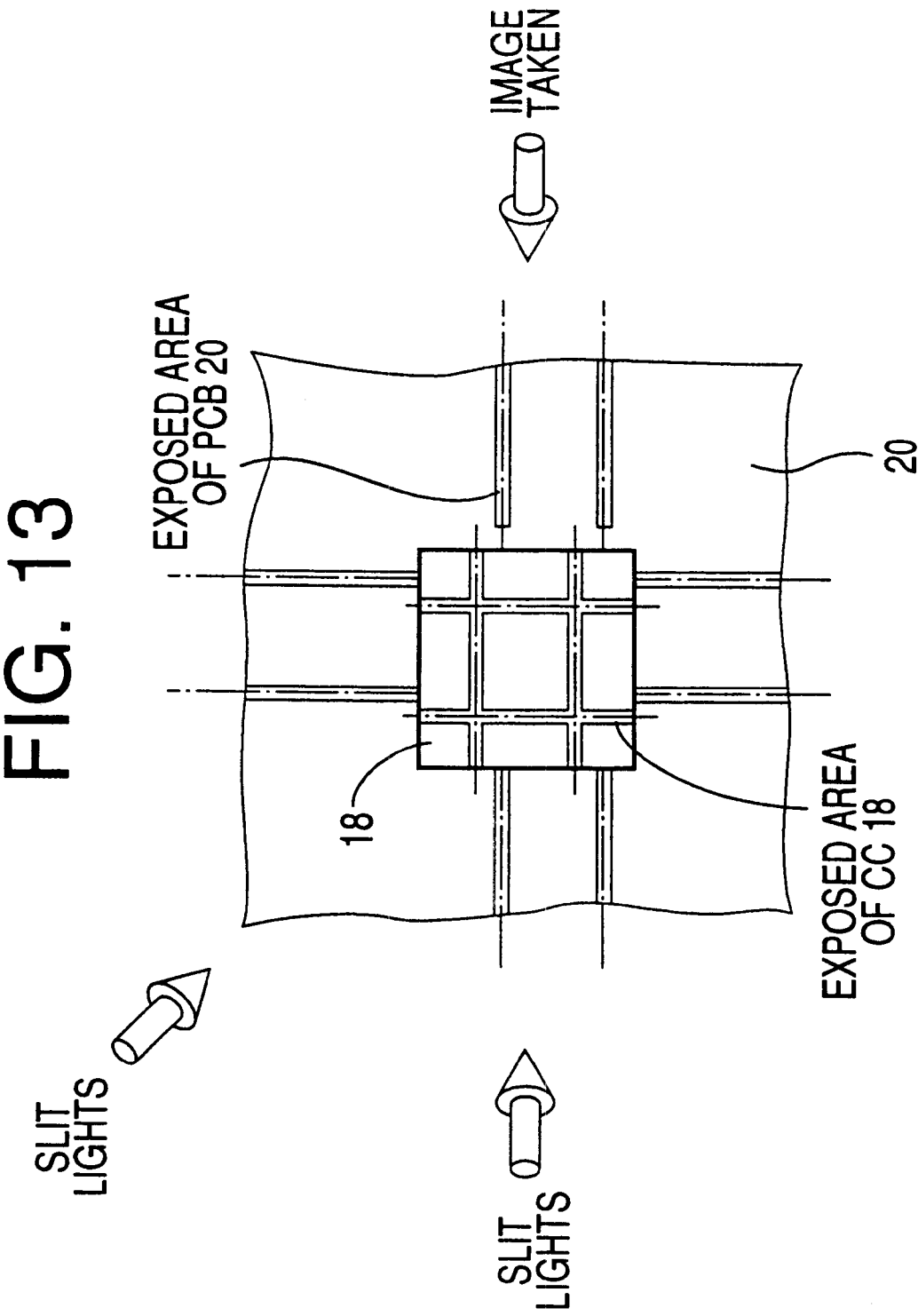
FIG. 13 is a plan view showing respective exposed areas of a CC and a PCB, in the case where two slit-light emitters are provided at the positions α, β indicated in FIG. 12 so that two parallel slit lights emitted by one emitter perpendicularly intersect two parallel lights emitted by the other emitter on the upper surface of the CC mounted on the PCB.

FIG. 13 is a plan view showing respective exposed areas of the CC 18 and the PCB 20, in the case where two slit-light emitters 190 are provided at the positions α, β indicated in FIG. 12 so that two parallel slit lights emitted by one emitter 190 perpendicularly intersect two parallel lights emitted by the other emitter 190, on the upper surface of the CC 18 mounted on the PCB 20. The two slit lights emitted by each of the two emitters 190 are parallel to each other, and the four slit lights in total are used. One slit-light emitter 190 provided at the position α indicated in FIG. 12 emits two parallel slit lights which expose or irradiate two linear areas of the CC 18 and four linear areas of the PCB 20 which extend in an up-down direction, i.e., a vertical direction in FIG. 13; and the other emitter 190 provided at the position β indicated in FIG. 12 emits two parallel slit lights which expose or irradiate two linear areas of the CC 18 and four linear areas of the PCB 20 which extend in a right-left direction, i.e., a horizontal direction in FIG. 13. Based on the images of those exposed areas of the CC 12 and the PCB 20, the data processing device 198 can measure both the position and attitude of the CC 18 mounted on the PCB 20. In the case shown in FIG. 11 in which two slit lights, i.e., a cross slit light is used, the accuracy of measurement of a rotation-position error of the CC 18 may not be sufficiently high, in particular, if the CC 18 is correctly mounted on the PCB 20 at its prescribed X-direction and Y-direction positions. However, in the case shown in FIG. 13 in which two slit lights are added and the four slit lights in total are used, the accuracy of measurement of rotation-position error of the CC 18 is improved. The distance between the two slits formed in the slit plate 208 of each of the two emitters 190 is so required that the distance between the two parallel slit lights incident to the upper surface of the CC 18 be smaller than the dimension of the CC 18 as measured in a direction in which the two slit lights are distant from each other. However, if the distance between the two slits of the slit plate 208 is too small, the accuracy of measurement of rotation-position error of the CC 18 is lowered. Hence, it is desirable that the distance between the two slit lights be adjustable depending upon the size of a CC 18 to be tested. For example, the slit plate 208 of each of the two emitters 190 may be one which is replaceable with another slit plate 208, or a great number of emitters 190 may be employed which have respective slit plates 208 the two parallel slits of each one of which are distant from each other by a length different from those of the other slit plates 208. In the latter case, appropriate two emitters 190 are selected from the number of emitters 190 depending upon the size of a CC 18 to be tested. In either case, the distance between the two parallel slit lights incident to the upper surface of the CC 18 is adjustable or changeable.

The single slit-light emitter 190 or each of the two or more slit-light emitters 190 is not required to emit one or more slit lights for a long period of time. In fact, the or each emitter 190 is required to emit the slit light or lights toward the CC 18 and the PCB 20 only at the time when the CCD camera 194 takes the image of the CC 18 and the PCB 20. Therefore, the or each emitter 190 may be controlled to emit the slit light or lights only during a short time duration including the time corresponding to the rotation angle, 330 degrees, of the above-described cam member. In the last case, the semiconductor laser device 204 is required to emit the laser beam only intermittently, that is, at a low duty ratio, which leads to increasing the life expectancy of the device 204. In addition, the testing device 32 can effectively prevent the laser beam from being unnecessarily reflected from the circuit pattern on the PCB 20 or the CCs 18 which have already been mounted on the PCB 20. In the case where a plurality of slit-light emitters 190 are employed, the emitters 190 may be controlled to emit respective slit lights at different timings. In this case, the data processing device 198 can test the actual state of the CC 18 based on the image taken using the slit light emitted by each one of the emitters 190, independent of testing the same based on the image taken using the slit light or slits emitted by the other emitter or emitters 190. For example, the data processing device 198 may test the actual state of a CC 18 based on an image of the CC 18 taken using the slit light emitted in the manner shown in FIG. 7 and may test the same 18 based on an image thereof taken using the columnar light emitted in the manner shown in FIG. 10. In the last case, two combinations of data processing device 198 and CCD camera 194 may be employed one of which is used for testing the CC 18 based on the image thereof taken using the slit light emitted in the manner shown in FIG. 7 and the other of which is used for testing the CC 18 based on the image thereof taken using the slit light emitted in the manner shown in FIG. 10. Thus, if two or more slit-light emitters 190 are employed, those emitters 190 can emit respective slit lights in various manners. The following description relates to, however, the slit-light emitting manner shown in FIG. 13.

Figure 14:
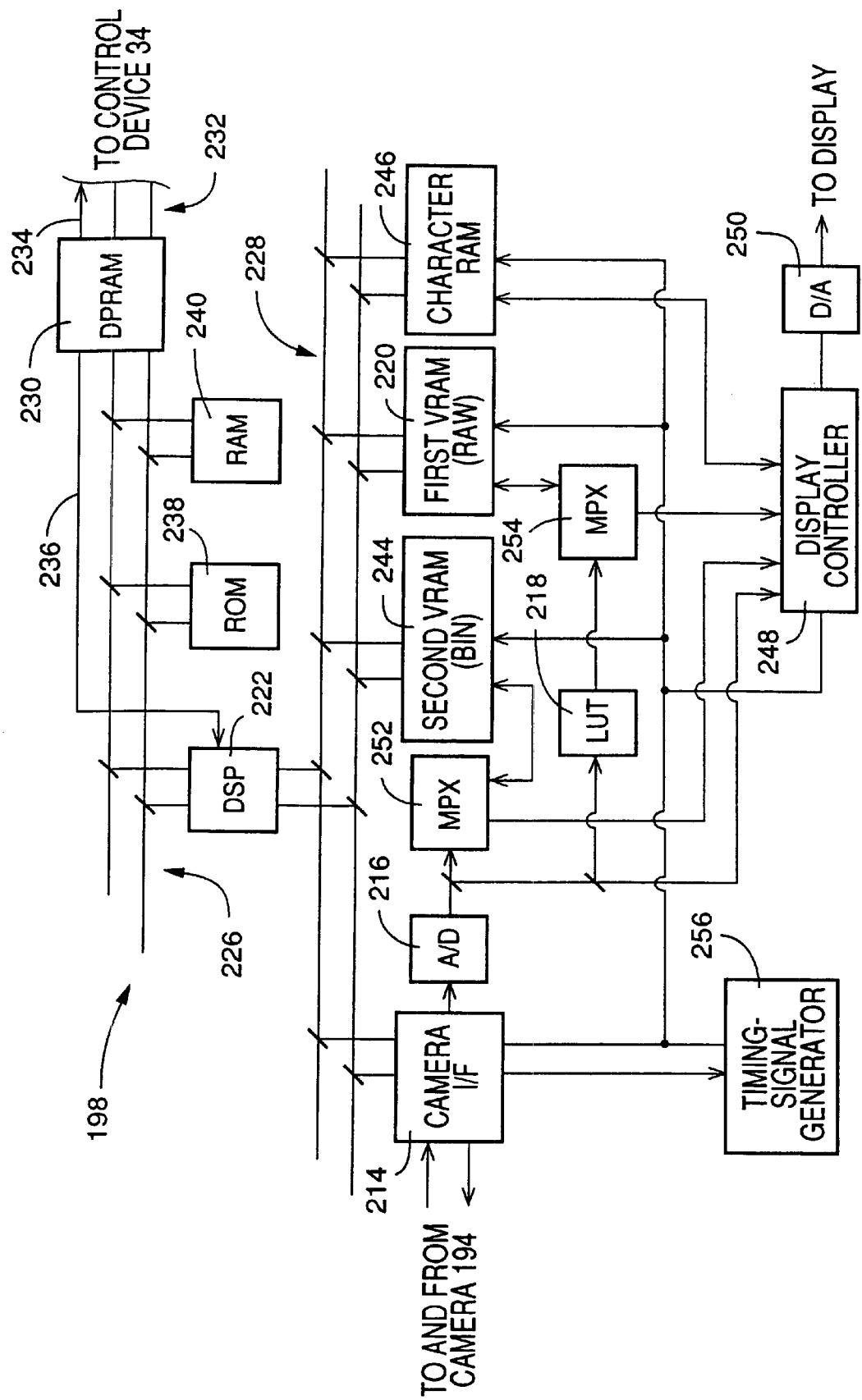
FIG. 14 is a diagrammatic view of a data processing device as part of a control device shown in FIG. 1.

FIG. 14 is a diagrammatic view showing a construction of the data processing device 198. In the data processing device 198, analog signals supplied from the CCD camera 194 connected to a camera interface (I/F) 214 are converted by an analog to digital (A/D) converter 216 into multiple-value digital image data which in turn are converted into two-value (i.e., binary) image data by a look-up table (LUT) 218. The binary image data are stored in a first video random access memory (VRAM) 220 which is provided by a dual port memory, and the binary image data stored in the first VRAM 220 are analyzed by a digital signal processor (DSP) 222. Thus, the position and attitude of the CC 18 mounted on the PCB 20 are determined based on the analog signals supplied from the CCD camera 194. The DSP 222 is connected to a first and a second DSP bus 226, 228. The first DSP bus 226 is connected to a bus 232 of the control device 34 via a dual port random access memory (DPRAM) 230. The DPRAM 230 has a function of alternately supplying an interrupt signal to the DSP 222 and the control device 34. The interrupt signal from the DPRAM 230 to the control device 34 is transmitted through an interrupt-signal line 234, and the interrupt signal from the control device 34 to the DPRAM 230 is transmitted through an interrupt-signal line 236. A read only memory (ROM) 238 in which a control program according to which the DSP 222 is operated is stored, and a RAM 240 are also connected to the first DSP bus 226.

To the second DSP bus 228, the above-indicated first VRAM 220, a second VRAM 244 in which the multiple-value image data produced by the A/D converter 216 are stored, and a character RAM 246 in which character information is essentially stored and which is used in displaying the conditions under which the analog image signals are processed and/or the results obtained from the processing, are connected. Like the first video VRAM 220, the second VRAM 244 and the character RAM 246 are provided by dual port memories, respectively. The multiple-value image data (i.e. "raw" image data) produced by the A/D converter 216, the multiple-value image data stored in the second VRAM 244, the binary image data stored in the first VRAM 220, and the information stored in the character RAM 246 can be displayed on a display (not shown) via a display controller 248 and a digital to analog (D/A) converter 250. The display controller 248 is employed for superimposing, on a screen of the display, a desired set of data or information on a desired area of an underlying set of data or information out of the above-indicated various sets of data or information. The term "superimposing" is defined such that when two or more sets of data overlap each other on the screen of the display, only the top set of data is imaged on the overlapped area of the underlying set of data. Alternatively, the display controller 248 can display two or more sets of data which overlap each other, such that all the overlapping sets of data are imaged on the screen. A multiplexer (MPX) 252 is selectively switched to a state in which the multiple-value image data received from the A/D converter 216 are supplied to the second VRAM 244, and a state in which the multiple-value image data received from the second VRAM 244 are supplied to the display controller 248. Meanwhile, an MPX 254 is selectively switched to a state in which the binary image data received from the LUT 218 are supplied to the first VRAM 220, and a state in which the binary image data received from the first VRAM 220 are supplied to the display controller 248. A timing-signal generator 256 supplies a timing signal to the CCD camera 194, the second VRAM 244, first VRAM 220, etc. The timing signal contains at least a vertical synchronizing signal for the CCD camera 194. According to the timing signal, the timing at which data or information are or is read from the second VRAM 244, the first VRAM 220, or the character RAM 246 is synchronized with the timing at which data or information are or is sent to the display.

The timing signal is synchronized with a shutter signal which is produced by the DSP 222. The shutter signal is supplied from the DSP 222 to the camera I/F via the second DSP bus 228, based on the interrupt signal supplied from the control device 34 to the DSP 222 via the DPRAM 230 having the above-described interrupt-signal generating function. A timing signal is generated at the period, 60 ms, at which each CC 18 is mounted on the PCB 20. The camera I/F 214 supplies the shutter signal to the timing-signal generator 256 and the CCD camera 194. The LUT 218, the MPXes 252, 254, and the display controller 248 are connected, like the camera I/F 214, to the second DSP bus 228, although not shown in FIG. 14. Because of this connection, the DSP 222 can change LUT data, i.e., data used for converting multiple-value image data into binary image data stored in the LUT 218; supplies the shutter signal to the camera I/F 214 in response to the interrupt signal supplied from the control device 34; controls the display controller 248 to change the current image on the display to another image; and changes the current state of each of the MPXes 252, 254 to another state thereof.

Figure 15A:
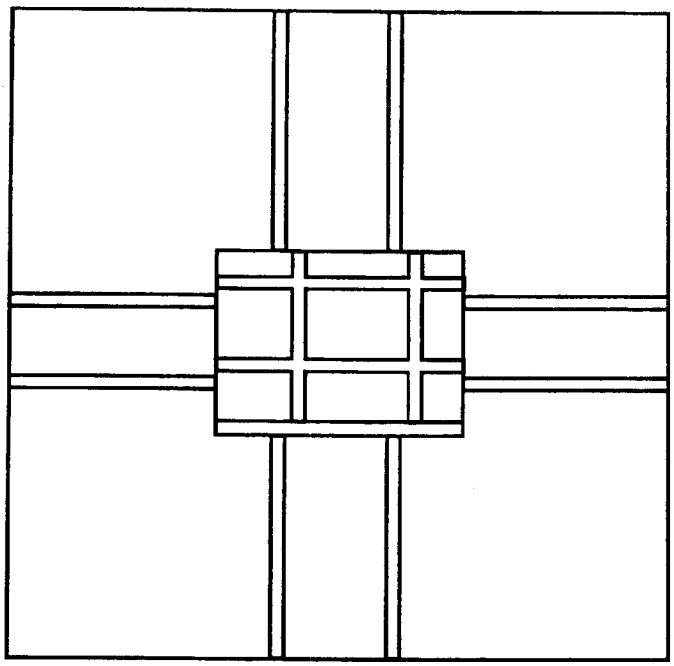
FIG. 15A is a view showing an image which is indicated on a screen of a display based on multiple-value image data which are obtained from a CC normally mounted on a PCB using the slit lights shown in FIG. 13 and are stored in a second VRAM shown in FIG. 14.
Figure 15B:
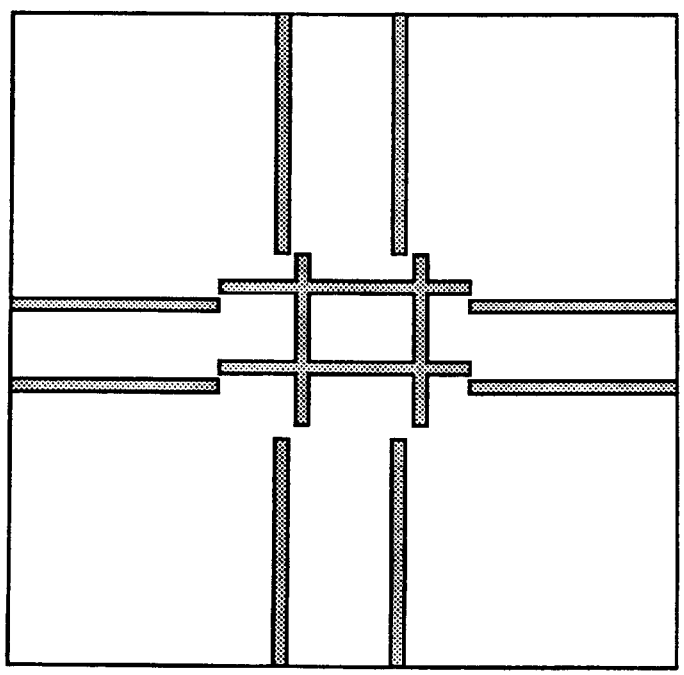
FIG. 15B is a view showing an image which is indicated on the screen of the display based on binary image data which are converted from the multiple-value image data and stored in a first VRAM shown in FIG. 14.

FIG. 15A shows a "raw" image, displayed on the screen of the display, which is represented by the multiple-value image data stored in the second VRAM 244, and FIG. 15B shows a "bin (i.e., binary)" image, displayed on the screen, which is represented by the binary image data stored in the first VRAM 220. Those images or those sets of data are obtained from a CC 18 which is mounted at its correct positions on a PCB 20. On the other hand, FIGS. 16A and 16B correspond to FIGS. 15A and 15B, respectively, but shows the raw and bin images or the sets of data which are obtained from a CC 18 which is not mounted at its correct positions on a PCB 20. The following description relates to the procedure according to which the actual state in which a CC 18 is mounted on a PCB 20 is tested based on the binary image data obtained from the CC 18 mounted on the PCB 20.

Figure 40:
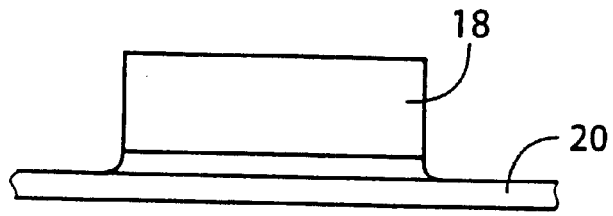
FIG. 40 is an elevation view showing a CC which is mounted on a CS correctly at a reference z-direction position with an appropriate amount of temporary fixing material being applied to the PCB.
Figure 41:
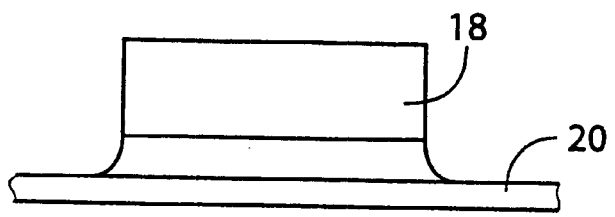
FIG. 41 is an elevation view showing a CC which is mounted on a PCB at an incorrect z-direction position with an excessive amount of temporary fixing material being applied to the PCB.
Figure 42:
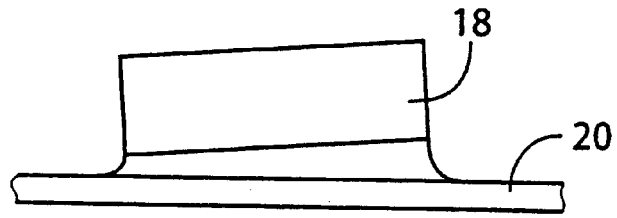
FIG. 42 is an elevation view showing a CC which is inclined on a PCB with an excessive amount of temporary fixing material being applied to the PCB.
Figure 43:
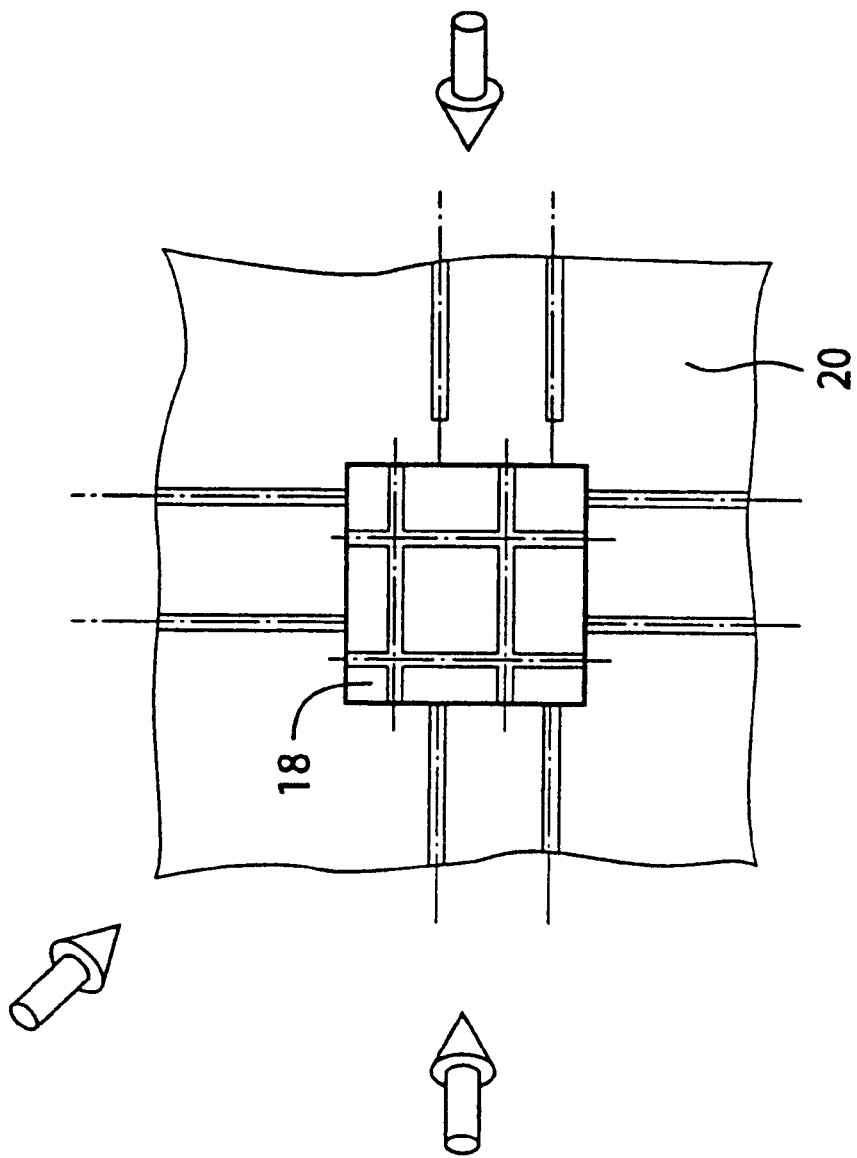
FIG. 43 is a plan view corresponding to FIG. 13, showing the CC which is inappropriately mounted on the PCB as shown in FIG. 41.
Figure 44:
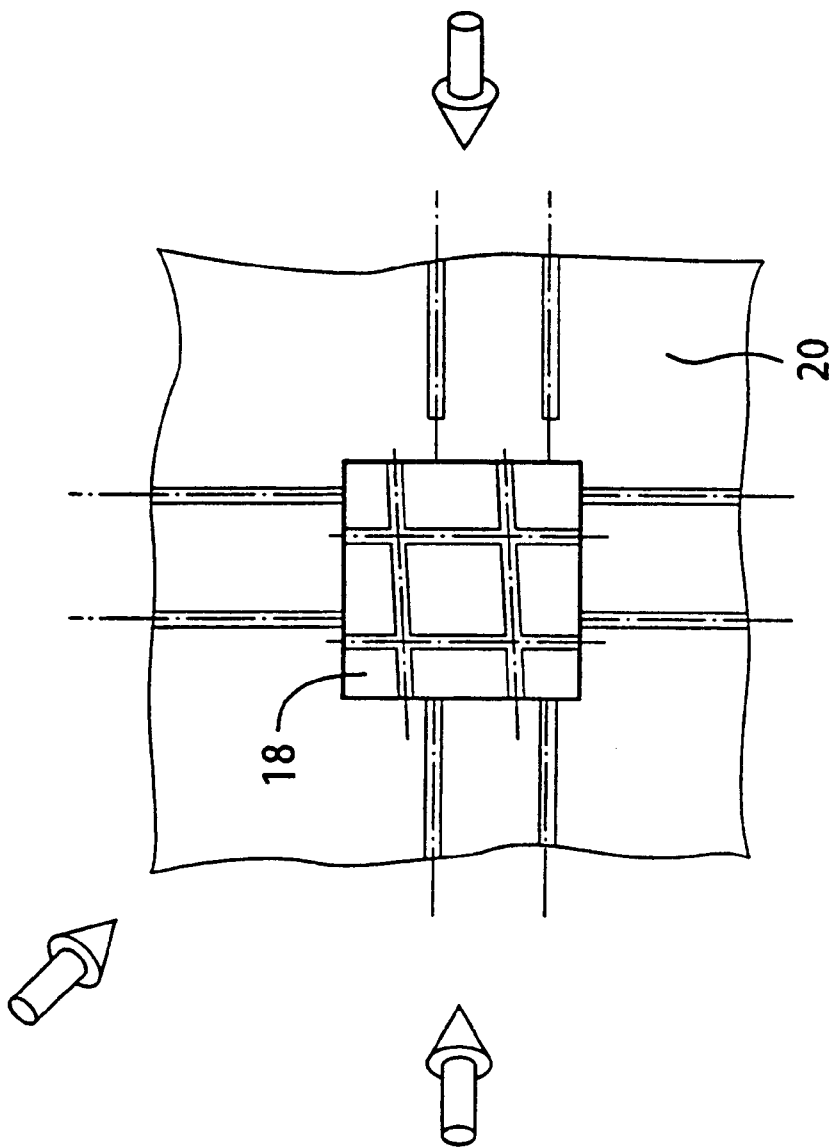
FIG. 44 is a plan view corresponding to FIG. 13, showing the CC which is inappropriately mounted on the PCB as shown in FIG. 42.

FIG. 40 is an elevation view showing a CC 18 which is mounted on a PCB 20 correctly at a reference z-direction position with an appropriate amount of temporary fixing material, such as adhesive or solder paste, being applied to the PCB 20. FIG. 41 is an elevation view showing CC 18 which is mounted on a PCB 20 in a "floating" or "unfixed" state, i.e., at an incorrect z-direction position, with an excessive amount of temporary fixing material being applied to the PCB 20. FIG. 42 is an elevation view showing a CC 18 which is inclined on a PCB 20, i.e., in a "floating" or "unfixed" state, with an excessive amount of temporary fixing material being applied to the PCB 20. FIG. 43 is a plan view corresponding to FIG. 13, showing the CC 18 which is inappropriately mounted on the PCB 20 as shown in FIG. 41, and FIG. 44 is a plan view corresponding to FIG. 13, showing the CC 18 which is inappropriately mounted on the PCB 20 as shown in FIG. 42.

Figure 17:
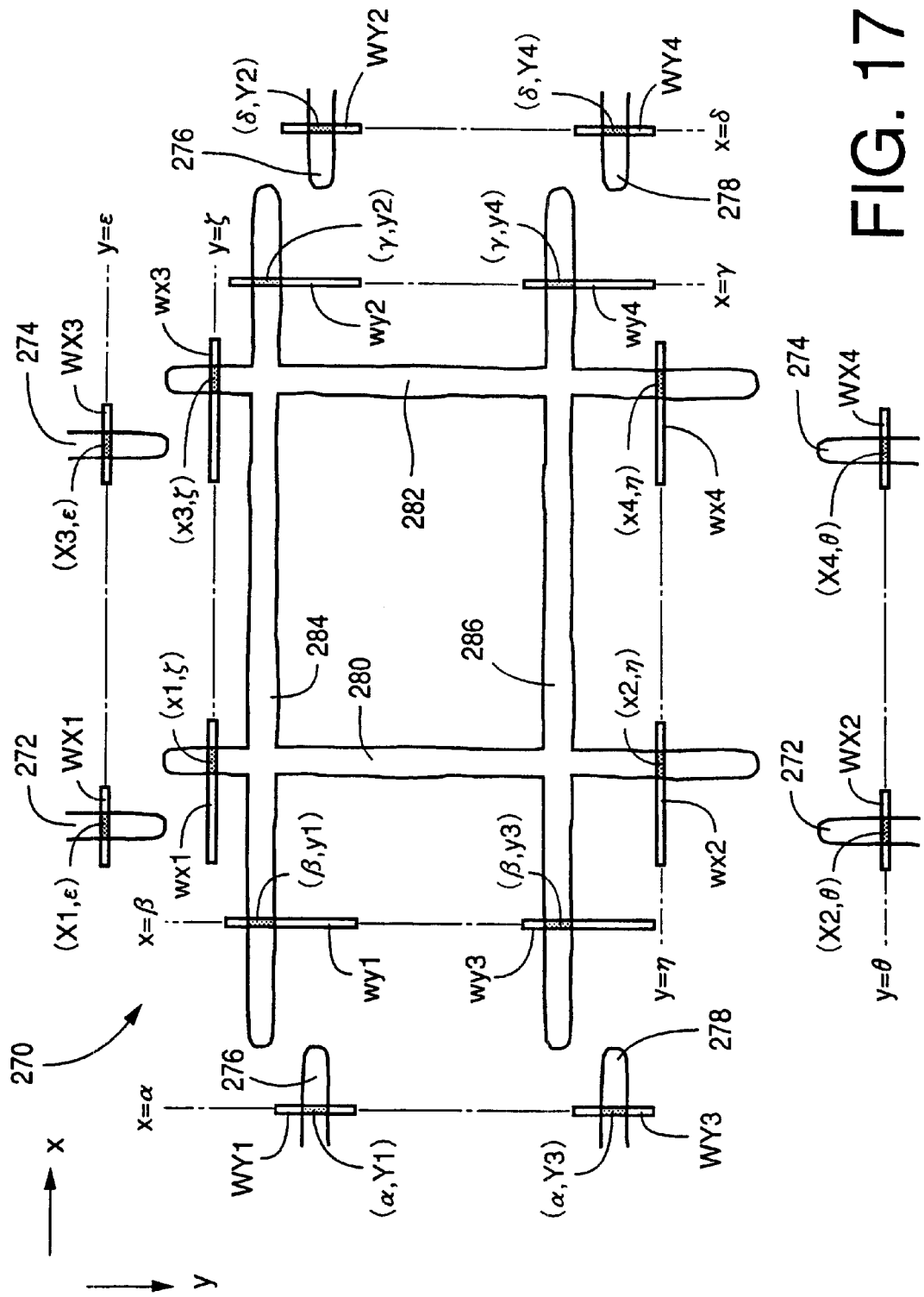
FIG. 17 is an enlarged view showing the binary-data image shown in FIG. 15B together with a first group of windows.

FIG. 17 is an enlarged view of the binary-data or "bin" image, shown in FIG. 15B, which is obtained from the CC 18 which is mounted at its prescribed positions on the PCB 20. The binary data representing the bin image are stored in the first VRAM 220. FIG. 17 also shows a first group of windows 270 which consist of sixteen linear windows indicated at WX1, WX2, WX3, WX4, WY1, WY2, WY3, WY4, wx1, wx2, wx3, wx4, and wy1, wy2, wy3, wy4 in FIG. 17. The linear windows 270 are virtually provided for each CC 18 by the DSP 222. To provide virtually the linear windows means to determine, in advance, the respective addresses of linear portions of a matrix of picture elements defined in the first VRAM 220 which portions are used as the linear windows for testing the actual state of the CC 18. Therefore, the linear windows 270 are not actually written in the second VRAM 244 or the first VRAM 220. The DSP 222 carries out the following measurement based on the binary value ("1" or "0") of each of the picture elements of the binary image data stored in the first VRAM 220 which elements overlap each of the virtually provided linear windows 270. In the following description, an X-Y coordinate system is provided for the two-dimensional image taken by the CCD camera 194. Accordingly, the position of each picture element of the camera image is indicated by x and y coordinates. It is assumed that an x direction and a y direction which will be referred to in the following description are parallel to the x and y axes of the x-y coordinate system, respectively. By the way, it is natural that the x and y directions (indicated at small letters "x" and "y") used in relation with the camera image should be distinguished from the X and Y directions (indicated at capital letters "X" and "Y") in which the X-Y table 66 is moved. However, since, in the present embodiment, the x direction coincides with the X direction and the y direction coincides with the Y direction, it is not necessary to distinguish the x and y directions from the X and Y directions. On the other hand, it is desirable that the x and y coordinates used for the picture elements corresponding to the exposed linear areas of the upper surface of the CC 18 be distinguished from those used for the picture elements corresponding to the exposed linear areas of the upper surface of the PCB 20. Hence, in the following description, the small letters "x", "y" are used for indicating the coordinates of the exposed areas of the CC 18, and the capital letters "X", "Y" are used for indicating the coordinates of the exposed areas of the PCB 20.

As shown in FIG. 17, the linear windows WX1, WX2 are used for measuring respective x-direction position of two first PCB exposed linear areas 272 at two y-direction positions, $\epsilon$ and $\theta$, respectively; and the linear windows WX3, WX4 are used for measuring respective x-direction positions of two second PCB exposed linear areas 274 at the two y-direction positions $\epsilon$, $\theta$, respectively. More specifically described, the linear window WX1 is used for determining the x and y coordinates of a center picture element of a portion of the upper first PCB linear exposed area 272 which portion overlaps the linear window WX1, and determining the width (i.e., x-direction dimension) of the upper first PCB exposed area 272 as measured at the center picture element; and the linear window WX2 is used for determining the x and y coordinates of a center picture element of a portion of the lower first PCB exposed area 272 which overlaps the linear window WX2, and determining the width of the lower first PCB exposed area 272 as measured at the center picture element. Similarly, the linear window WX3 is used for determining the x and y coordinates of a center picture element of a portion of the upper second PCB linear exposed area 274 which overlaps the linear window WX3, and determining the width of the upper second PCB exposed area 274 as measured at the center picture element; and the linear window WX4 is used for determining the x and y coordinates of a center picture element of a portion of the lower second PCB exposed area 274 which overlaps the linear window WX4, and determining the width of the lower second PCB exposed area 274 as measured at the center picture element. The x and y coordinates of the thus determined four center picture elements are indicated at (X1, $\epsilon$), (X2, $\theta$), (X3, $\epsilon$), (X4, $\theta$), respectively. The two y coordinates $\epsilon$, $\theta$ are values which are prescribed for each CC 18.

Similarly, the four linear windows WY1, WY2, WY3, WY4 are used for determining the x and y coordinates of respective center picture elements of two third PCB exposed linear areas 276 and two fourth PCB exposed areas 278 and the respective widths of the four areas 276, 278 as measured at the four center picture elements, respectively. The x and y coordinates of the thus determined four center picture elements are indicated at ($\alpha$, Y1), ($\delta$, Y2), ($\alpha$, Y3), ($\delta$, Y4), respectively. The two y coordinates $\alpha$, $\delta$ are values which are prescribed for each CC 18.

Similarly, the two linear windows wx1, wx2 are used for determining the x and y coordinates, (x1, $\zeta$), (x2, $\eta$), of respective center picture elements of two (upper and lower) first CC exposed linear areas 280 and the respective widths of the two areas 280 as measured at the two center picture elements, respectively; the two linear windows wx3, wx4 are used for determining the x and y coordinates, (x3, $\zeta$), (x4, $\eta$), of respective center picture elements of two (upper and lower) second CC exposed linear areas 282 and the respective widths of the two areas 282 as measured at the two center picture elements, respectively; and the four linear windows wy1, wy2, wy3, wy4 are used for determining the x and y coordinates, ($\beta$, y1), ($\gamma$, y2), ($\beta$, y3), ($\gamma$, y4), of respective center picture elements of two third CC exposed linear areas 284 and two fourth CC exposed areas 286 and the respective widths of the four areas 284, 286 as measured at the four center picture elements, respectively. The two x coordinates $\beta$, $\gamma$ and the two y coordinates $\zeta$, $\eta$ are values which are prescribed for each CC 18.

Thus, from the measurement using the first group of linear windows 270, the eight pairs of x and y coordinates and the eight pairs of X and Y coordinates and the sixteen widths as measured at those pairs of coordinates. With the sixteen pairs of coordinates, the Z-direction position of the CC 18 mounted on the PCB 20 can be determined or measured. The linear windows wx1 to wx4, wy1 to wy4 are predetermined such that if the CC mounting device 24 fails to mount the CC 18 on the PCB 20, each of four longer PCB exposed linear areas 272 to 278 overlap corresponding two of the eight linear windows wx1 to wx4, wy1 to wy4. Thus, the testing device 32 can reliably identify that the CC mounting device 24 has failed to mount the CC 18 on the PCB 20. However, the testing device 32 may obtain the above-indicated sixteen pairs of coordinates from a more accurate measurement based on the multiple-value or gray-scale image data stored in the second VRAM 244.

Figure 18:
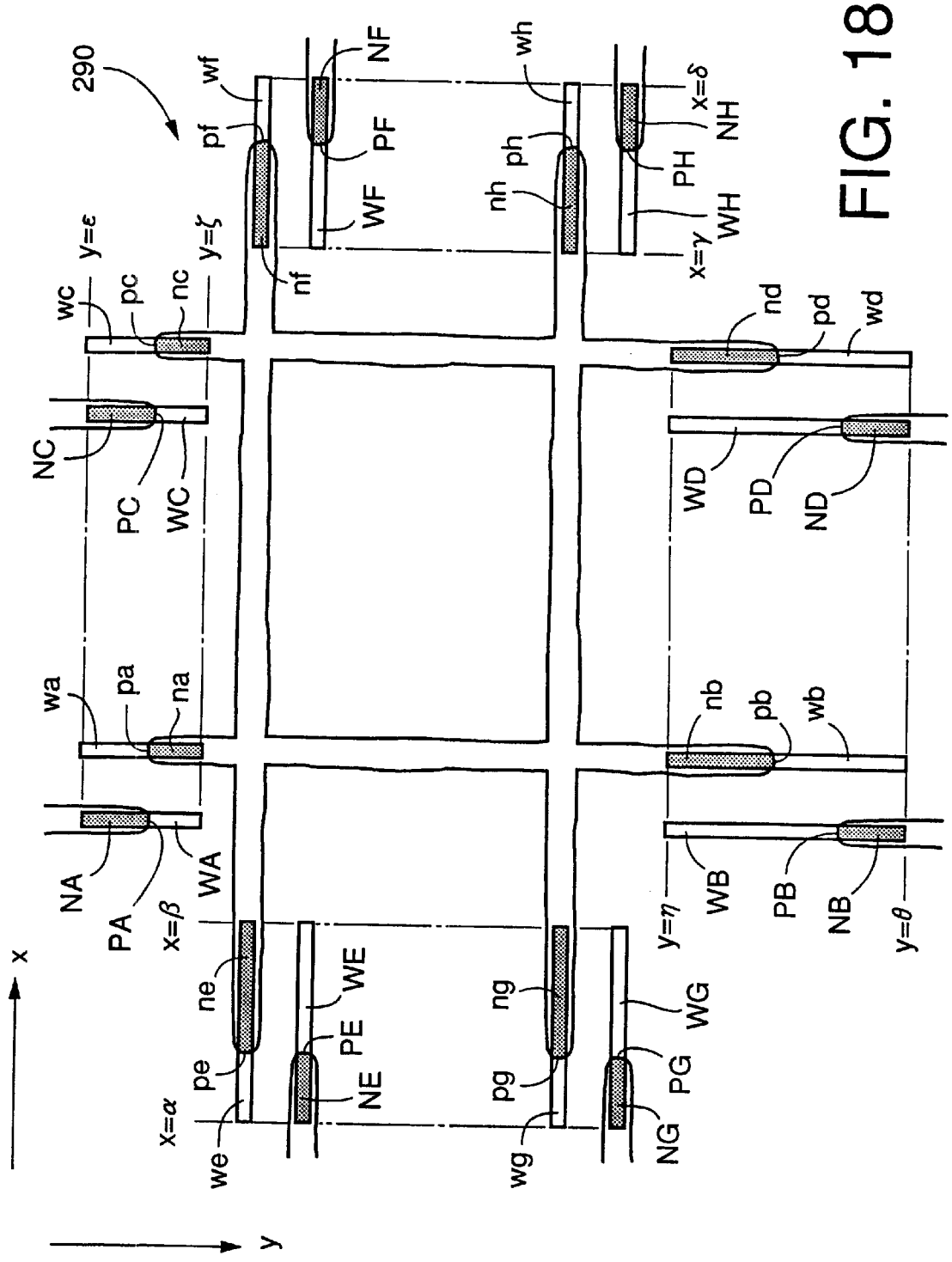
FIG. 18 is an enlarged view showing the binary-data image shown in FIG. 15B together with a second group of windows.

FIG. 18 shows an enlarged view of the "bin" image shown in FIG. 15B, together with a second group of windows 290 which consist of sixteen surface windows indicated at WA, WB, WC, WD, WE, WF, WG, WH, wa, wb, wc, wd, we, wf, wg, wh. The surface windows 290 are virtually provided for each CC 18 by the DSP 222. The DSP 222 obtains eight pairs of x and y coordinates and eight pairs of X and Y coordinates, which will be described later, based on the binary value ("1" or "0") of each of the picture elements of the binary image data stored in the first VRAM 220 which elements overlap each of the surface windows 290. Each of the sixteen surface windows WA to WH, wa to wh is a rectangle defined by its two diagonally opposite vertices having the following X and Y or x and y coordinates (therefore, the four sides of each rectangle are parallel to the X or x direction or the Y or y direction):

WA: (X1−Δ/2, $\epsilon$), (X1+Δ/2, $\zeta$)
WB: (X2−Δ/2, $\eta$), (X2+Δ/2, $\theta$)
WC: (X3−Δ/2, $\epsilon$), (X3+Δ/2, $\zeta$)
WD: (X4−Δ/2, $\eta$), (X4+Δ/2, $\theta$)
WE: ($\alpha$, Y1−Δ/2), ($\beta$, Y1+Δ/2)
WF: ($\gamma$, Y2−Δ/2), ($\delta$, Y2+Δ/2)
WG: ($\alpha$, Y3−Δ/2), ($\epsilon$, Y3+Δ/2)
WH: ($\gamma$, Y4−Δ/2), ($\delta$, Y4+Δ/2)
wa: (x1−Δ/2, $\epsilon$), (x1+Δ/2, $\zeta$)
wb: (x2−Δ/2, $\eta$), (x2+Δ/2, $\theta$)
wc: (x3−Δ/2, $\epsilon$), (x3+Δ/2, $\zeta$)
wd: (x4−Δ/2, $\eta$), (x4+Δ/2, $\theta$)
we: ($\alpha$, y1−Δ/2), ($\alpha$, y1+Δ/2)
wf: ($\gamma$, y2−Δ/2), ($\delta$, y2+Δ/2)
wg: ($\alpha$, y3−Δ/2), ($\beta$, y3+Δ/2)
wh: ($\gamma$, y4−Δ/2), ($\delta$, y4+Δ/2)

In the above-indicated coordinates, the variable, Δ, is selected at a value not greater than the minimum value of the respective widths of the sixteen linear exposed areas 272 to 278, 280 to 286. Generally, when an image consisting of two or more identical subjects and a background is represented by binary data, the boundary line between one of the subjects and the background may differ from the boundary line between the other or another subject and the background because of various factors. Accordingly, the respective widths of the linear exposed areas 272 to 278, and 280 to 286 may differ from one another. Therefore, it is desirable that the width of each of the sixteen windows WA to WH, wa to wh of the second group 290 be smaller than the above-indicated minimum value by an amount corresponding to an amount by which the respective boundary lines of the linear exposed areas 272 to 278, and 280 to 286 may differ from one another. In other words, it is desirable that the width of each window WA to WH, wa to wh be positively smaller than the respective widths of the PCB and CC linear exposed areas 272 to 278, and 280 to 286.

The respective X and Y or x and y coordinates of sixteen points, PA, PB, PC, PD, PE, PF, PG, PH, wa, wb, wc, wd, we, wf, wg, wh, shown in FIG. 18, which correspond to the sixteen surface windows WA to WH, wa to wh, respectively, are determined as follows, based on the number of picture elements of each of the PCB and CC linear exposed areas 272 to 278 which elements overlap a corresponding one of the surface windows WA to WH, wa to wh:

PA: $(X1, \epsilon+NA/\Delta)$

PB: $(X2, \theta-NB/\Delta)$

PC: $(X3, \epsilon+NC/\Delta)$

PD: $(X4, \theta-ND/\Delta)$

PE: $(\alpha+NE/\Delta, Y1)$

PF: $(\delta-NF/\Delta, Y2)$

PG: $(\alpha+NG/\Delta, Y3)$

PF: $(\delta-NH/\Delta, Y4)$ pa: $(x1, \zeta-na/\Delta)$ pb: $(x2, \eta+nb/\Delta)$ pc: $(x3, \zeta+nc/\Delta)$ pd: $(x4, \eta+nd/\Delta)$ pe: $(\beta-ne/\Delta, y1)$ pf: $(\gamma-nf/\Delta, y2)$ pg: $(\beta-ng/\Delta, y3)$ ph: $(\gamma-nh/\Delta, y4)$ In the above-indicated coordinates, the values, NA, NB, NC, ND, NE, NF, NG, NH, na, nb, nc, nd, ne, nf, ng, nh are the respective areas (i.e., the respective numbers of picture elements) of the PCB and CC linear exposed portions 272 to 278, 280 to 286 which overlap the corresponding surface windows WA to WH, wa to wh, respectively. The area of a portion of each exposed area 272 to 278, 280 to 286 which portion overlaps a corresponding one of the surface windows WA to WH, wa to wh is grayed in FIG. 18 or 19.

Figure 16A:
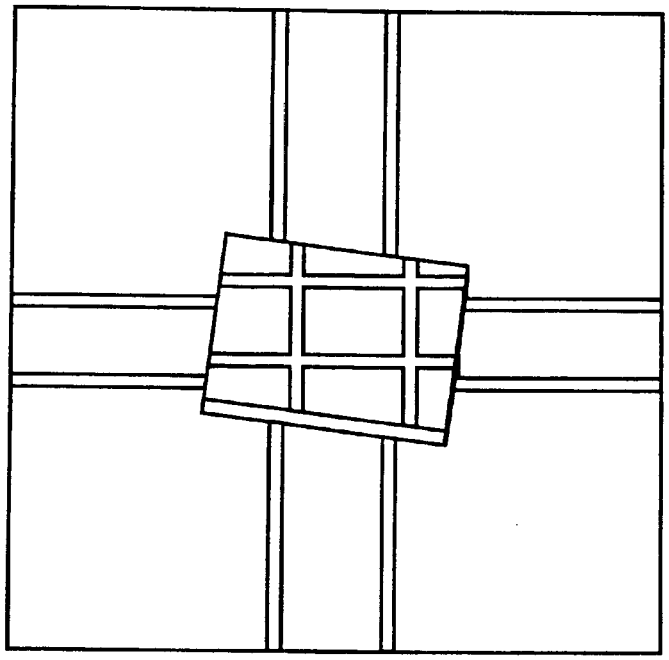
FIGS. 16A and 16B are views corresponding to FIGS. 15A and 15B, respectively, in the case where a CC is not normally mounted on a PCB.
Figure 16B:
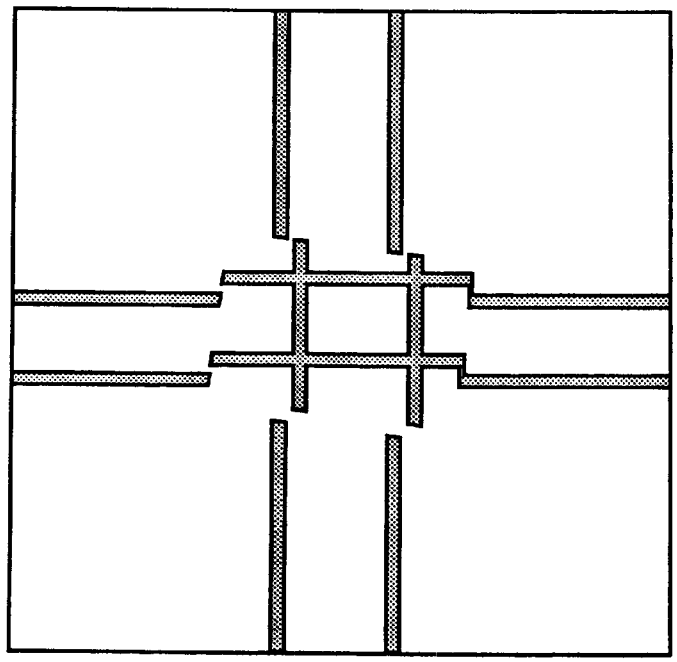
Figure 19:
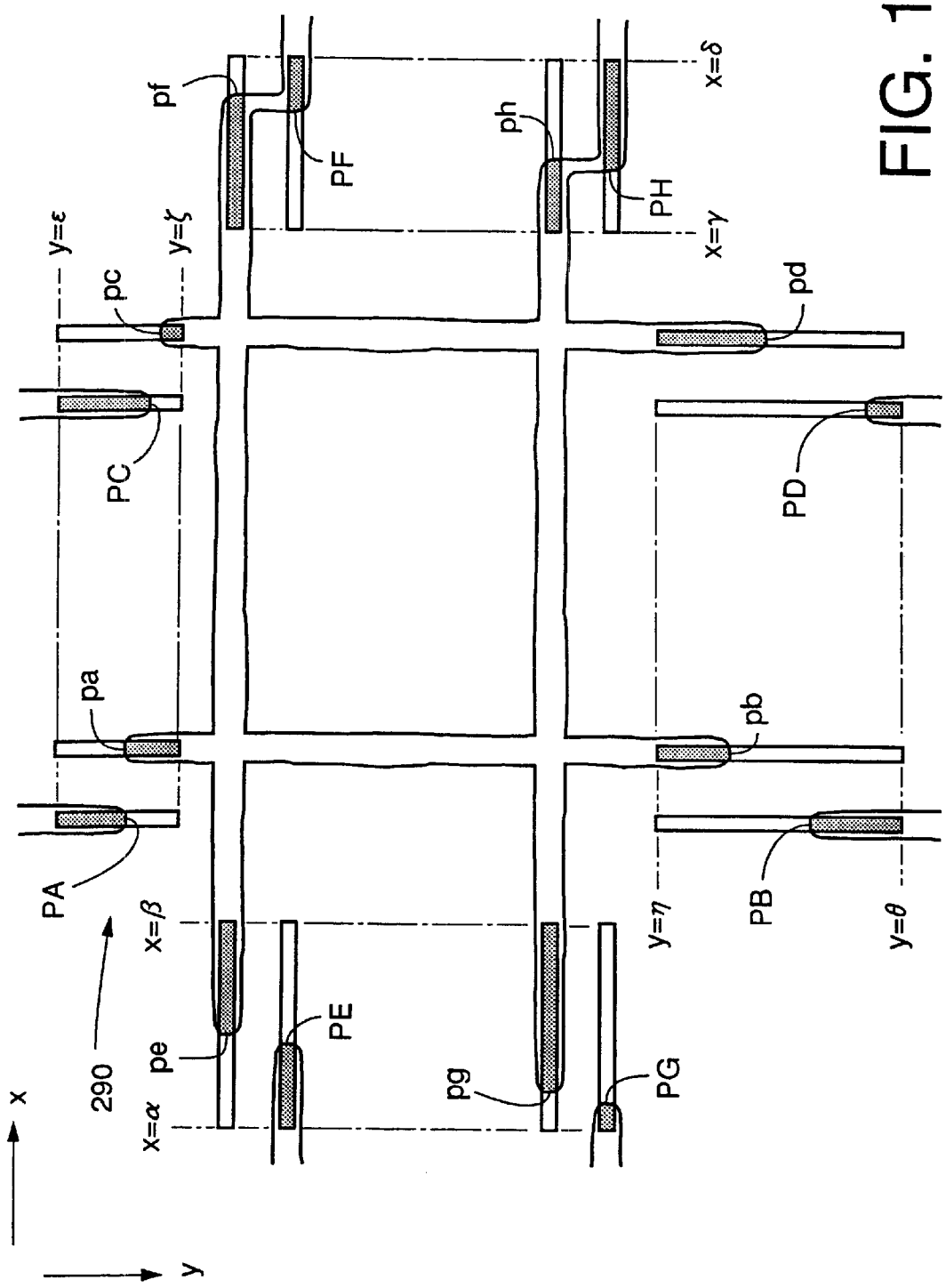
FIG. 19 is an enlarged view showing the binary-data image shown in FIG. 16B together with a second group of windows.

FIG. 19 is an enlarged view of the "bin" image, shown in FIG. 16B, which is obtained from the CC 18 which is not normally mounted on the PCB 20. FIG. 19 also shows the second group of windows 290. Regarding this image, too, the coordinates of the sixteen points PA to PH, wa to wh are determined in the same manner as described above, and are compared with those obtained from the image shown in FIG. 15B or 18. As a result, the data processing device 198 identifies that some of the coordinates of the sixteen points PA to PH, wa to wh determined for the image shown in FIG. 16B or 19 are different from corresponding ones of those obtained from the image shown in FIG. 15B or 18.

Figure 20:
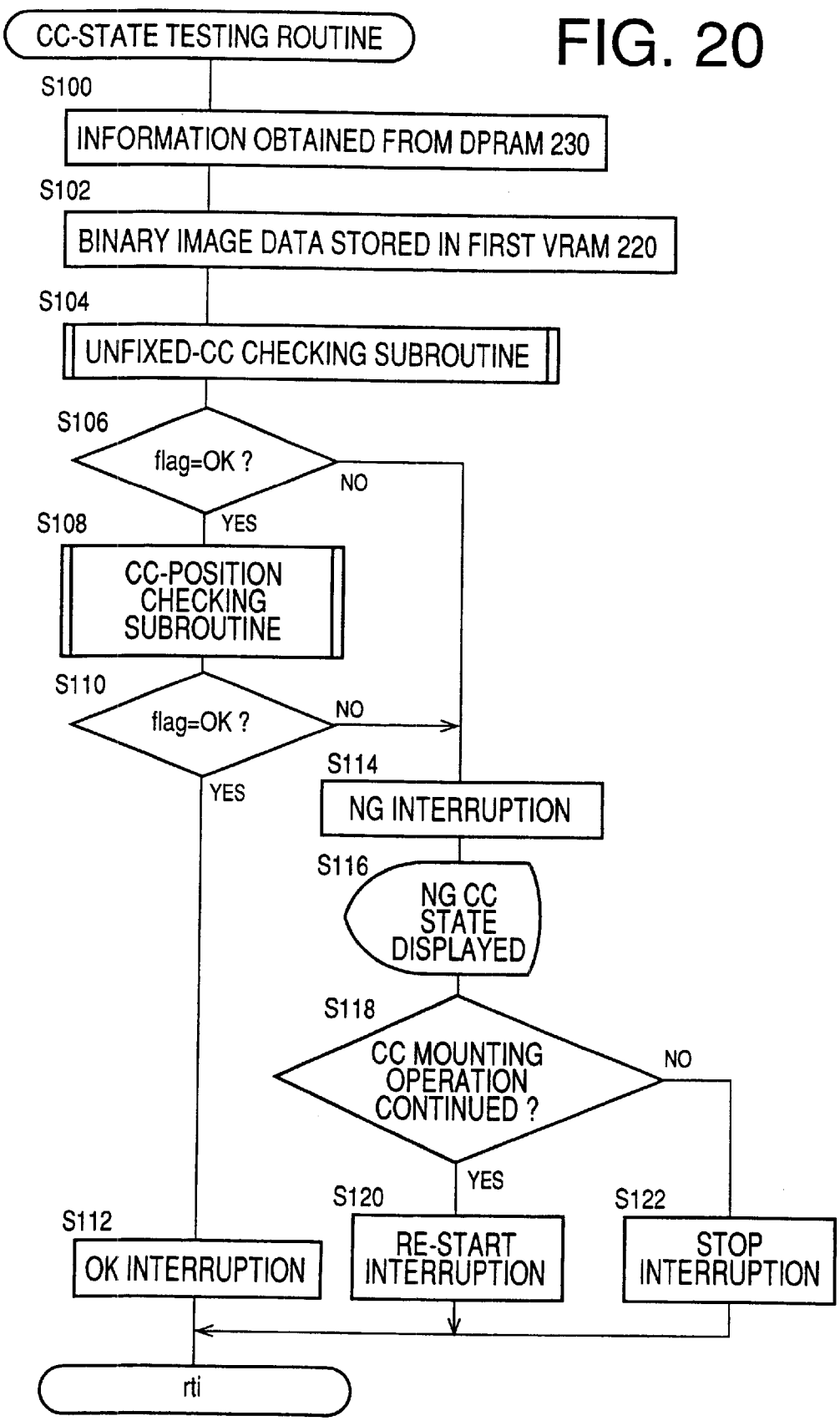
FIG. 20 is a flow chart representing a CC-state testing routine which is stored in a read only memory (ROM) shown in FIG. 14 and which is carried out by a digital signal processor (DSP) shown in FIG. 14.

FIG. 20 is a flow chart representing a control program which is stored in the ROM 238 and which is carried out by the DSP 222 in response to the interrupt signal supplied thereto from the control device 34, for testing the actual state in which each CC 18 is mounted on the PCB 20. That is, this control program is an interrupt routine which is carried out by the DSP 222. Each time one CC 18 is mounted on the PCB 20, the control device 34 supplies one interrupt signal to the DSP 222. First, at Step S100, the DSP 222 obtains information relating to a current CC 18 to be tested. This information is stored in advance in the DPRAM 230 by the control device 34. Before supplying each interrupt signal to the DSP 222, the control device 34 stores the information in the DPRAM 230. The information stored in the DPRAM 230 includes a threshold level used for converting gray-scale image data into binary image data; position data representing the respective positions of the linear and surface windows of the first and second groups 270, 290; coordinate data representing the coordinates of the points PA to PH, wa to wh for the image of the CC 18 which is correctly mounted on the PCB 20. The coordinate data are an example of a value indicative of a reference state in which the CC 18 is mounted on the PCB 20. However, the DSP 222 may not obtain all the information stored in the DPRAM 230. Since a plurality of sets of data are stored at respective addresses in the DPRAM 230, the DSP 222 can obtain only necessary sets of data from the DPRAM 230. The DSP 222 may be adapted to modify the data stored in the LUT 218, based on the above-indicated threshold level.

Step S100 is followed by Step S102 in which the DSP 222 stores the binary image data into the first VRAM 220. The multiple-value or gray-scale image data produced by the CCD camera 194 are converted into the binary image data by the LUT 218 after those data are transmitted via the camera I/F 214 and the A/D converter 216. The binary image data are stored in the first VRAM 220 via the MPX 254. Step S102 is followed by Step S104 to call an unfixed-CC checking subroutine which is represented by a flow chart, shown in FIG. 21, which will be described later. Step S104 is followed by Step S106 to judge whether a flag is set at its "OK" position. If a positive judgment is made at Step S106, the control of the DSP 222 goes to Step S108 to call a CC-position checking subroutine which is represented by a flow chart, shown in FIG. 23, which will be described later. Step S108 is followed by Step S110 to judge whether the flag is set at its "OK" position, like Step S106. The flag is set to its "OK" position or its "NG" position, at Step S104 or Step S108. If the flag is set to the "NG" position at Step S104, the control does not go to Step S108. If a positive judgment is made at Step S110, the control of the DSP 222 goes to Step S112 to carry out an OK interruption for the control device 34 and terminate the CC-state testing routine. The OK interruption means that the DSP 222 writes or stores, in the DPRAM 230, information indicating that the CC 18 is correctly mounted on the PCB 20 and supplies an interrupt signal to the control device 34 via the DPRAM 230. The control device 34 reads, in response to the interrupt signal, the information stored in the DPRAM 230 and recognizes that the CC 18 is correctly mounted on the PCB 20. This will be referred to as the OK recognition.

If a negative judgment is made at Step S106 or S110, the control goes to Step S114 to carry out an NG interruption for the control device 34. The NG interruption means that the DSP 222 writes, in the DPRAM 230, information indicating that the CC 18 is not correctly mounted on the PCB 20 and supplies an interrupt signal to the control device 34 via the DPRAM 230. The control device 34 reads, in response to the interrupt signal, the information stored in the DPRAM 230 and recognizes that the CC 18 is not correctly mounted on the PCB 20. This will be referred to as the NG recognition.

When the control device 34 recognizes the NG interruption, it temporarily stops the operation of the CC mounting device 24. In particular, a negative judgment made at Step S106 indicates that the CC 18 is unfixed or "floating" on the PCB 20; and a negative judgment made at Step S110 indicates that the CC 18 is not unfixed on the PCB 20 but at least one of the X-direction and Y-direction positions of the CC 18 mounted on the PCB 20 is not correct. The information stored in the DPRAM 230 includes data indicative of which one of Steps S106 and S110 provides the negative judgment. Step S114 is followed by Step S116 to write, in the character RAM 246, information indicating that the CC 18 is not correctly mounted on the PCB 20. This information also includes the information stored in the DPRAM 230 at Step S114. The information stored in the character RAM 246 is displayed in the form of characters on the display (not shown). To this end, it is needed to adapt the DSP 222 to be able to control the display controller 248 to display, on the display, the information stored in the character RAM 246.

Step S116 is followed by Step S118 to judge whether an operator wants to continue the CC mounting operation, by judging whether the operator has operated an operable member (not shown). Thus, the operator can either correct the positions of the CC 18 at that moment, or suspend the correction and continue the CC mounting operation. For example, if the operator operates a re-start commanding member (not shown) for re-starting the CC mounting operation and a positive judgment is made at Step S118, the control of the DSP 222 goes to Step S120 to carry out a re-start interruption for the control device 34. The re-start interruption means that the DSP 222 writes, in the DPRAM 230, information indicating that the CC mounting operation should be re-started, and supplies an interrupt signal to the control device 34 via the DPRAM 230. On the other hand, if the operator operates a termination commanding member (not shown) for terminating the CC mounting operation and a negative judgment is made at Step S118, the control of the DSP 222 goes to Step 5122 to carry out a termination interruption for the control device 34. The termination interruption means that the DSP 222 writes, in the DPRAM 230, information indicating that the CC mounting operation should be terminated, and supplies an interrupt signal to the control device 34 via the DPRAM 230. In response to the reception of each sort of interrupt signal, the control device 34 carries out an operation corresponding to the sort of interrupt signal received. For example, when the control device 34 recognizes the NG interruption, it temporarily stops the CC mounting operation. When the control device 34 recognizes the restart interruption, it re-starts the CC mounting operation which has been temporarily stopped. When the control device 34 recognizes the termination interruption, it terminates the current CC mounting operation in which the CCs 18 are mounted on the PCB 20, and controls the PCB conveying device 58 to carry out the PCB 20. A portion of the DSP 222 which carries out the termination interruption and a portion of the control device 34 which recognizes the termination interruption and terminates the CC mounting operation cooperate with each other to provide automatic terminating or stopping means for automatically stopping the CC mounting operation of the CC mounting device 24.

Figure 21:
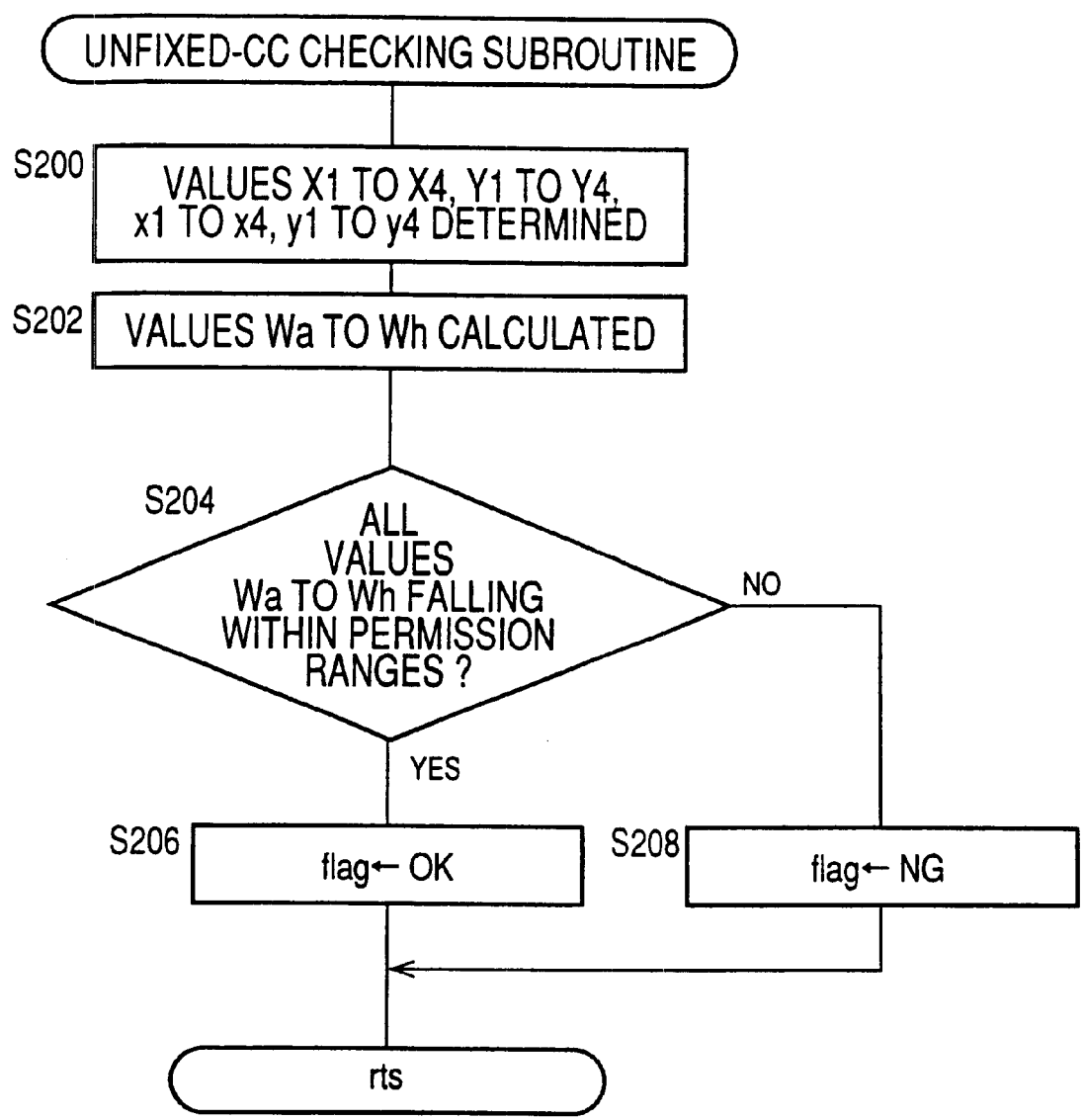
FIG. 21 is a flow chart representing an unfixed-CC checking subroutine which is called at Step S104 of the flow chart of FIG. 20.

FIG. 21 is a flow chart representing the unfixed-CC checking subroutine which is called at Step S104 of FIG. 20. This subroutine is carried out for judging whether each CC 18 is unfixedly mounted on the PCB 20 such that the lower surface of each CC 18 is not in close contact with the upper surface of the PCB 20 because, e.g., one or more leads of the CC 18 are bent downward. Therefore, this subroutine is one example which is carried out for testing the actual state in which each CC 18 is mounted on the PCB 20. First, at Step S200, the DSP 222 determines the coordinate values X1 to X4, Y1 to Y4, x1 to x4, and y1 to y4 in the above-described manner. Step S200 is followed by Step S202 to calculate the following values, Aa, Ab, Ac, Ad, Ae, Af, Ag, Ah, according to the following expressions (1) to (8), respectively:

$$\Delta a = j \cdot X1 + k \cdot X2 + x1 \tag{1}$$

$$\Delta b = m \cdot X1 + n \cdot X2 + x2 \tag{2}$$

$$\Delta c = j \cdot X3 + k \cdot X4 + x3 \tag{3}$$

$$\Delta d = m \cdot X3 + n \cdot X4 + x4 \tag{4}$$

$$\Delta e = p \cdot Y1 + q \cdot Y2 + y1 \tag{5}$$

$$\Delta f = r \cdot Y1 + s \cdot Y2 + y2 \tag{6}$$

$$\Delta g = p \cdot Y3 + q \cdot Y4 + y3 \tag{7}$$

$$\Delta h = r \cdot Y3 + s \cdot Y4 + y4 \tag{8}$$

The variables, j, k, m, n, p, q, r, s which occur in the above-indicated expressions are obtained according to the following expressions (9) to (16), respectively:

$$j = (\zeta - \theta)/(\theta - \epsilon) \tag{9}$$

$$k = (\epsilon - \zeta)/(\theta - \epsilon) \tag{10}$$

$$m = (\eta - \theta)/(\theta - \epsilon) \tag{11}$$

$$n = (\epsilon - \eta)/(\theta - \epsilon) \tag{12}$$

$$p = (\beta - \delta)/(\delta - \alpha) \tag{13}$$

$$q = (\alpha - \beta)/(\delta - \alpha) \tag{14}$$

$$r = (\gamma - \delta)/(\delta - \alpha) \tag{15}$$

$$s = (\alpha - \gamma)/(\delta - \alpha) \tag{16}$$

All the above-indicated variables are negative values because the respective denominators of all the expressions (9) to (16) are positive values and the respective numerators of the same are negative values, as can be understood from FIG. 17. The variables j to s can be calculated in advance for each CC 18 to be mounted, because the values $\alpha$, $\beta$, $\gamma$, $\delta$, $\epsilon$, $\zeta$, $\eta$, $\theta$ are values prescribed for each CC 18. Thus, the calculations according to the expressions (9) to (16) have already been finished before the calculations are carried out according to the expressions (1) to (8) at Step S202. That is, the calculations according to the expressions (9) to (16) are not carried out at Step S202.

Figure 22:
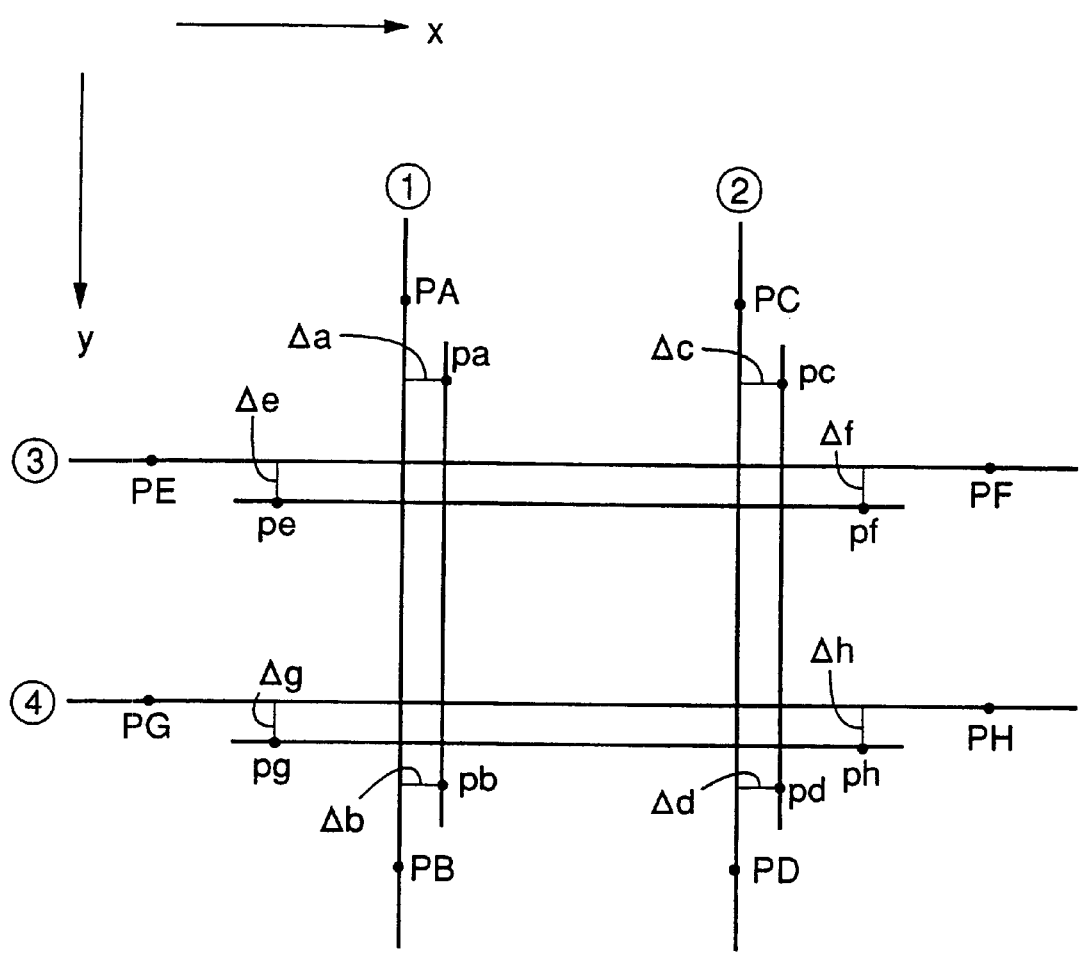
FIG. 22 is a view explaining values determined according to the flow chart of FIG. 20.

The values $\Delta a$, $\Delta b$, $\Delta c$, $\Delta d$, $\Delta e$, $\Delta f$, $\Delta g$, $\Delta h$ defined by the expressions (1) to (8) are illustrated in FIG. 22. The straight lines indicated at numbers 1, 2, 3, and 4 are the respective center lines of the four PCB linear exposed areas 272 to 278 and are defined as follows, respectively:

The straight line (1) passes through the point (X1, $\epsilon$) and the point (X2, $\theta$).

The straight line (2) passes through the point (X3, $\epsilon$) and the point (X4, $\theta$).

The straight line (3) passes through the point ($\alpha$, Y1) and the point ($\alpha$, Y2).

The straight line (4) passes through the point ($\alpha$, Y3) and the point ($\alpha$, Y4).

Thus, the values $\Delta a$, $\Delta b$, $\Delta c$, $\Delta d$, $\Delta e$, $\Delta f$, $\Delta g$, $\Delta h$ have the following meanings, respectively:

The value Δa is the distance between the straight line (1) and the point (x1, ζ) in the x direction and, since the slit lights are angled at 45 degrees with respect to the PCB 20, indicates the relative position between the left-hand and upper portion of the CC 18 (as seen in the raw image) and the PCB 20 in the Z direction.

The value Δb is the distance between the straight line (1) and the point (x2, η) in the x direction and indicates the relative position between the left-hand and lower portion of the CC 18 and the PCB 20 in the Z direction.

The value Δc is the distance between the straight line (2) and the point (x3, ζ) in the x direction and indicates the relative position between the right-hand and upper portion of the CC 18 and the PCB 20 in the Z direction.

The value Δd is the distance between the straight line (2) and the point (x4, η) in the x direction and indicates the relative position between the right-hand and lower portion of the CC 18 and the PCB 20 in the Z direction.

The value Δe is the distance between the straight line (3) and the point (β, y1) in the y direction and indicates the relative position between the left-hand and upper portion of the CC 18 and the PCB 20 in the Z direction.

The value Δf is the distance between the straight line (3) and the point (γ, y2) in the y direction and indicates the relative position between the right-hand and upper portion of the CC 18 and the PCB 20 in the Z direction.

The value Δg is the distance between the straight line (4) and the point (β, y3) in the y direction and indicates the relative position between the left-hand and lower portion of the CC 18 and the PCB 20 in the Z direction.

The value Δf is the distance between the straight line (4) and the point (γ, y4) in the y direction and indicates the relative position between the right-hand and lower portion of the CC 18 and the PCB 20 in the Z direction.

Step S202 is followed by Step S204 to judge whether the difference between each of the measured values Δa, Δb, Δc, Δd, Δe, Δf, Δg, Δh and a corresponding one of reference values prescribed for each CC 18 falls within a corresponding one of permissible ranges prescribed for the same 18. The reference values and the permissible ranges have already been obtained from the DPRAM 230 as described above. If a positive judgment is made at Step S204, the control goes to Step S206 to set the flag to its OK state; and if not, the control goes to Step S208 to set the flag to its NG state. Thus, the unfixed-CC checking subroutine is ended. As described above, data indicative of the reference values and the permissible ranges are contained in the information which is stored in the DPRAM 230 by the control device 34 before the supplying of each interrupt signal. This subroutine is carried out for judging whether the relative position between each of the left and upper portion, the left and lower portion, the right and upper portion, and the right and lower portion of the upper surface of the CC 18 and a corresponding one of the four portions of the upper surface of the PCB 20 in the Z direction is normal or correct. That is, this subroutine is carried out for checking whether each CC 18 is mounted in an "unfixed" state on the PCB 20. This subroutine can be applied to not only the CC 18 having a rectangular parallelopiped shape as shown in FIG. 13 but also a CC having a different shape, e.g., a CC which has a cylindrical shape and is mounted on a PCB 20 such that the center axis line of the cylindrical CC perpendicularly intersects the upper surface of the PCB; or a CC which has a cylindrical shape and is mounted on a PCB 20 such that the center axis line of the cylindrical CC is parallel to the upper surface of the PCB. Independent of the differences in shape of the CCs 18, any error in the relative position between each CC 18 and the PCB 20 in the Z direction can be measured as changes of the above-indicated values Δa to Δh. Accordingly, in the case where the CC 18 is not mounted on the PCB 20 for some reason, each of the values Δa to Δh takes zero.

In the case where the relative position between a CC 18 having a simple shape, such as a rectangular parallelopiped shape shown in, e.g., FIG. 13, and the PCB 20 in the Z direction is measured, it is not necessary to measure all of the values Δa to Δh. For example, it is possible to measure only either the four values Δa to Δd or the four values Δe to Δh, or either the four values Δa, Δd, Δf, Δg or the four values Δb, Δc, Δe, Δh. In this case, the overall time needed for the calculations carried out at Step S202 can be shortened. Moreover, in the case where it can be assumed that each PCB 20 mounted on the PCB 20 has no error with its Z-direction position, it is possible to utilize only some of the measured positions, (x1, ζ), (x2, η), (x3, ζ), (x4, η), (β, y1), (γ, y2), (β, y3), (γ, y4) of the CC exposed linear areas 280 to 286.

Figure 23:
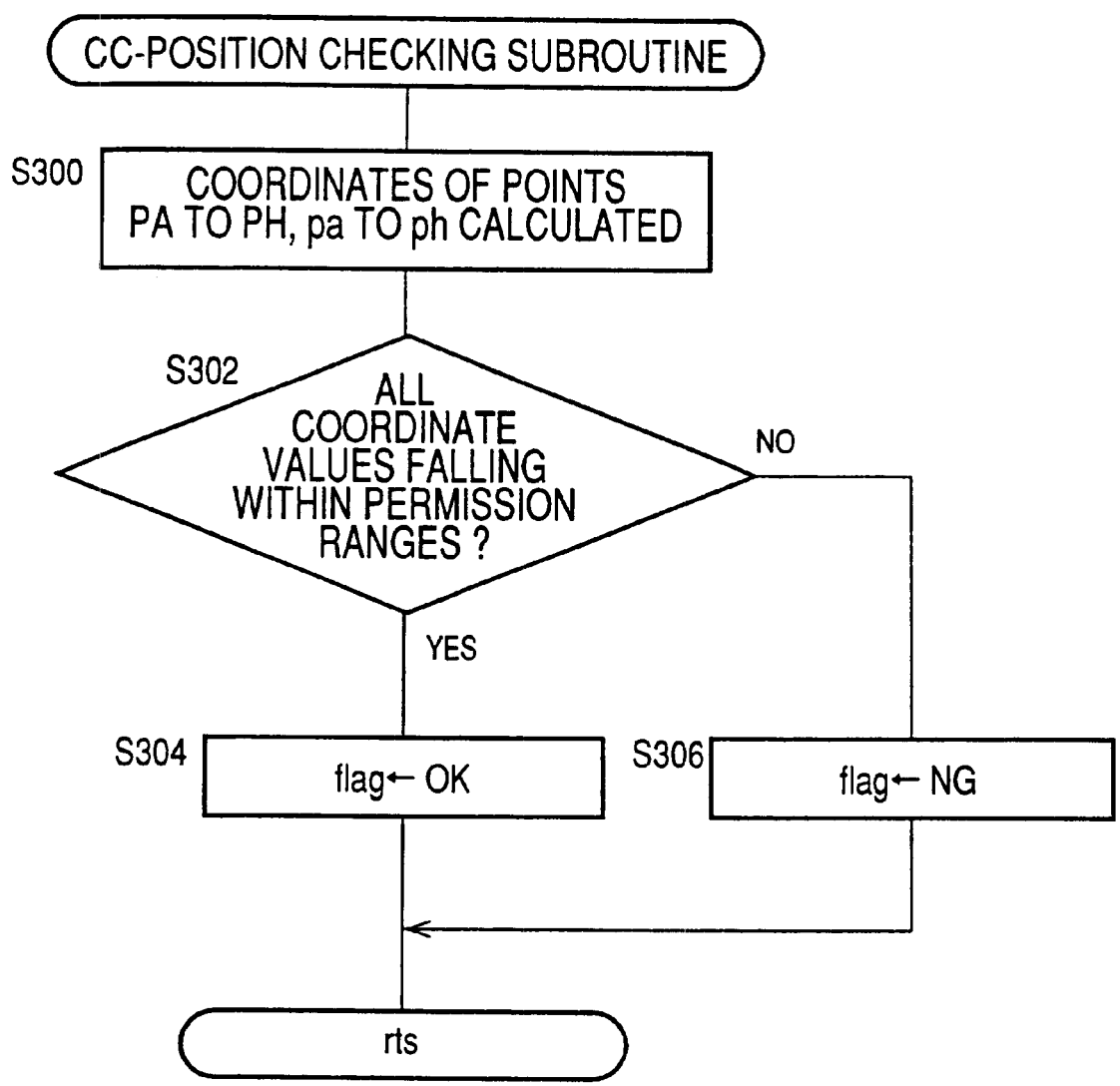
FIG. 23 is a flow chart representing a CC-position checking subroutine which is called at Step S108 of the flow chart of FIG. 20.

FIG. 23 shows the flow chart representing the CC-position checking subroutine which is called at Step S108 of the flow chart of FIG. 18. This subroutine is carried out for judging whether each CC 18 is mounted on the PCB 20 with x-direction and/or y-direction position errors, that is, testing an actual state in which each CC 18 is mounted on the PCB 20. First, at Step S300, the DSP 222 calculates the X and Y or x and y coordinates of each of the points PA to PH and the points pa to ph shown in FIG. 18 (and FIG. 19) according to the above-described manners. Step S300 is followed by Step S302 to judge whether the difference between each of the calculated or measured coordinate values and a corresponding one of reference values prescribed for each CC 18 falls within a corresponding one of permissible ranges prescribed for the same 18. Those reference values and those permissible ranges have already been obtained from the DPRAM 230 at Step S100 as described above. If a positive judgment is made at Step S302, the control goes to Step S304 to set the flag to its OK state; and if not, the control goes to Step S306 to set the flag to its NG state. Then, the CC-position checking subroutine is ended. Data indicative of the reference values and the permissible ranges are contained in the information which is stored in the DPRAM 230 by the control device 34 before the supplying of each interrupt signal. Thus, with the slit lights shown in FIG. 13, the information relating to the x-direction and y-direction absolute positions of each of the left and upper portion, the left and lower portion, the right and upper portion, and the right and lower portion of the upper surface of each CC 18 can be obtained, independent of the differences in shape of the CCs 18 mounted on the PCB 20.

It is not necessary to utilize the respective coordinates of all the points PA to PH and the points pa to ph. For example, it is possible to use the respective coordinates of the points pa to ph only. In the latter case, the CC-position checking operation is carried out based on the CC exposed linear areas 280 to 286 only. It is possible to use only a still less amount of information depending upon the shapes of the CCs 18 used. For example, in the case where the CC 18 has a rectangular parallelopiped shape, it is possible to use either the group of points pa, pd, pf, and pg, or the group of points pb, pc, pe, and ph, only, thereby shortening the time needed for the calculations of the respective coordinates of those points.

In this way, the present CC mounting system 10 tests the actual state in which each CC 18 is mounted on the PCB 20, before the solder reflowing device carries out the final CC-fixing operation in which the CC 18 is finally fixed to the PCB 20. This leads to reducing the cost of production of the electric circuit consisting of the CCs 18 and the PCB 20. Conventionally, the actual state of each CC mounted on a PCB is tested after all CCs are finally fixed to the PCB by a solder reflowing device, or before all CCs are finally fixed to a PCB by a solder reflowing device but after all the CCs are mounted on the PCB, i.e. are temporarily fixed to the same. In either case, it is needed to dispose a testing device in an electric-circuit assembly line and additionally those testing operations need a long time. In contrast, the present CC mounting system 10 can test the actual state of each CC 18 during a regular interval in which the CC 18 is mounted on the PCB 20, before the CC 18 is finally fixed to the same 20. Therefore, if the test result shows that the CC 18 is inappropriately mounted on the PCB 20, the operator can correct the actual state of the CC 18 so that the corrected CC 18 is finally fixed to the PCB 20 by the solder reflowing device. Consequently, the yield of the electric circuits as final products is increased. In addition, the present system 10 can quickly find the occurrence of an inappropriate mounting of a CC 18 on a PCB 20, the operator can take a countermeasure against it. This leads to minimizing the occurrence of inappropriate mounting of CCs 18 on PCBs 20. Moreover, since the present system 10 does not need any exclusive testing device, the system 10 can be produced at reduced cost.

In the case where the unfixed-CC checking subroutine and the CC-position checking subroutine are carried out as described above and show that a CC 18 is not appropriately mounted on a PCB 20, the DSP 222 specifies at least one candidate for the cause of the inappropriate mounting of the CC 18 on the PCB 20, as follows:

(1) The Case where each CC 18 is Absent from the PCB 20:

This may occur for the following reasons:

[i] The difference between the position of the lower end of the suction nozzle 44 being at its lowered position and the position of the upper surface of the PCB 20 is not equal to the height of the CC 18. This occurs, e.g., because the amount of lowering of the suction nozzle 44 is insufficient. Since the CC 18 falls from a position above the PCB 20, the CC 18 may fall off the PCB 20. However, in many cases, the CC 18 does not fall off the PCB 20 and is mounted on the same 20 but at incorrect positions.

[ii] The air pressure at the lower end of the suction nozzle 44 is not decreased to a value sufficiently near the atmospheric pressure. In this case, the CC 18 remains held by the suction nozzle 44 and is not mounted on the PCB 20.

[iii] The air pressure at the lower end of the suction nozzle 44 is decreased to a value near the atmospheric pressure at an incorrect timing. In this case, the suction nozzle 44 cannot release the CC 18 at an appropriate timing and rather releases the same 18 at incorrect positions, so that the CC 18 may fall off the PCB 20.

[iv] The CC 18 is adhered to the suction nozzle 44 with an oil film. In this case, the greater the area in which the CC 18 contacts the nozzle 44 is, the difficult it is for the nozzle 44 to release the CC 18. Thus, the CC 18 is not mounted on the PCB 20, and is moved away.

The reasons for the case where a CC 18 is absent from a PCB 20 include the reason that the suction nozzle 44 fails to suck and hold the CC 18. However, this is detected by another image taking device before the CC 18 is subjected to the CC mounting operation in which the CC 18 is mounted on the PCB 20. Accordingly, the present system 10 does not specify this reason as the candidate. For the above-indicated case [ii] or case [iv], the present system 10 may additionally employ a detecting device which detects a special state in which a CC 18 is not released from the suction nozzle 44 and remains held by the same 44. For example, the detecting device may be provided by an optical sensor which is provided in the vicinity of the lower end of the suction nozzle 44 and detects whether a CC 18 is present at, or absent from, the lower end of the nozzle 44. Alternatively, the detecting device may be provided by a combination of (a) a negative-pressure supplying and regulating device which temporarily switches its switch valve to an negative-pressure supplying state thereof after the suction nozzle 44 passes through the CC mounting position, and (b) a pressure sensor which measures an air pressure inside the nozzle 44 in the vicinity of the lower end thereof. The above-indicated reasons are described by way of examples. In addition, it is difficult to specify the only and one cause of the event that a CC 18 is not mounted on a PCB 20. Accordingly, it is desired that the above-described display indicate the fact that the CC 18 is not mounted on the PCB 20, thereby prompting the operator to check the CC 18 on the PCB 20, and that the display indicate the specified candidate or candidates for the cause of the absence of the CC 18 from the PCB 20.

(2) The Case where each CC 18 is Mounted on the PCB 20 at Incorrect Positions This may occur for the following reasons:

[i] CCs 18 move on the PCB 20 because the suction nozzle 44 or the PCB 20 vibrates. In this case, the directions in which the CCs 18 move and the distances over which the CCs 18, move have no regularity. In addition, the errors of the respective relative positions between the CCs 18 and the PCB 20 in the Z direction are small, because the CCs 18 move on the PCB 20 mainly in the X and Y directions. The DSP 222 stores data indicative of the respective actual positions of the CCs 18 mounted on the PCB 20, and judges whether the directions in which the CCs 18 move and the distances over which the CCs 18 move have regularity to a certain degree. If this judgment is negative and simultaneously the errors of the respective relative positions between the CCs 18 and the PCB 20 in the Z direction are small, the DSP 222 can conclude that at least one of the suction nozzle 44 and the PCB 20 is vibrating. In this case, the control device 34 may take a countermeasure that the vibrating element 44, 20 is stopped at a reduced deceleration.

[ii] CCs 18 fall from positions above the PCB 20. In those cases, each CC 18 would probably be mounted on the PCB 20 but at incorrect positions. It is very rare that CCs 18 which fall from positions above the PCB 20 should be mounted on the PCB 20, at their correct positions and in their correct attitudes. In addition, since the adhesive and the solder paste are present on the PCB 20 for stably mounting the CCs 18 on the PCB 20, there is substantially no possibility that a CC 20 which falls from a position above the PCB 20 should be mounted at its correct position on the PCB 20.

[iii] The amount of solder paste or adhesive applied to the PCB 20 is not appropriate. If the amount of solder paste or adhesive applied to the PCB 20 is not appropriate, each CC 18 may be mounted at incorrect positions on the PCB 20. For example, if the amount of solder paste or adhesive is insufficient, each CC 18 may move on the PCB 20 after being released from the suction nozzle 44. Not only the adhesive but also the solder paste make a role as a temporarily fixing material which temporarily and stably fixes the CCs 18 to the PCB 20. On the other hand, if the amount of solder paste or adhesive is excessive, the mass of the solder paste or adhesive present on the PCB 20 may adversely influence the positions of each CC 18 which are measured using the above-described slit lights. More specifically described, if the excessive amount of solder or adhesive surrounds the CC 18, the slit lights may be incident to not the upper surface of the CC 18 or the PCB 20 but the upper surface of the excessive solder or adhesive, which may only result in introducing errors into the measured positions of the CC 18. In this case, it is desirable that a greater number of slit lights be used for irradiating the CC 18 and the PCB 20, or that the columnar light as shown in FIG. 10 be used for the same purpose. In either case, the area and shape of the excessive solder or adhesive can be determined based on an image taken by the CCD camera 194.

It is usual that the phenomenon that an inappropriate amount of solder paste is applied to each PCB 20 occurs to only respective common portions of the PCBs 20. Generally, solder paste is applied to the PCBs 20 by a screen printing machine. Accordingly, an inappropriate amount of solder paste may be applied to respective common portions of the PCBs 20. Therefore, in the case where the DSP 222 judges that an inappropriate amount of solder paste has been applied to respective common portions of PCBs 20, it is desirable to adjust the screen printing machine so that it can apply an appropriate amount of solder paste to the entire surface of each PCB 20. Japanese Patent Application laid open for inspection under Publication No. 4-284249 discloses a screen printing machine which measures the amount of solder paste supplied thereto; Japanese Patent Application laid open for inspection under Publication No. 6-23946 discloses a screen printing machine which measures the viscosity of solder paste; Japanese Patent Application laid open for inspection under Publication No. 7-76065 discloses a screen printing machine which measures the force with which its squeegee is pressed against its screen; and Japanese Patent Applications laid open for inspection under Publication No. 6-106705 and Publication No. 6-238867 disclose a screen printing machine which detects dirt or clogging on its screen. In the case where one of the above-indicated screen printing machines is used in combination with the present CC mounting system 10, the control device 34 may supply a command signal to a control device of the screen printing machine so that it may apply an appropriate amount of solder paste to each PCB 20. Alternatively, the operator may adjust the screen printing machine so that it can apply an appropriate amount of solder paste to the entire surface of each PCB 20.

It is also usual that the phenomenon that an inappropriate amount of adhesive is applied to each PCB 20 occurs to the entire surface of the PCB 20. For example, if an adhesive is not appropriately supplied to an adhesive applying machine, an insufficient amount of adhesive may be applied to the entire surface of each PCB 20. U.S. Pat. No. 5,881,914, filed on Sep. 26, 1997, and issued Mar. 16, 1999, assigned to the Assignee of the present application teaches that if the conditions (e.g., adhesive's temperature, air pressure applied to an adhesive for releasing each amount of adhesive, and a time duration during which air pressure is applied to an adhesive for releasing thereof) under which an adhesive applying machine applies an adhesive are not appropriate, an inappropriate amount of adhesive is applied to the entire surface of each PCB 20. If the DSP 222 judges that an inappropriate amount of adhesive is applied to a PCB 20, the control device 34 may supply a command signal to a control device of the adhesive applying machine so that it may apply an appropriate amount of adhesive to each PCB 20. Alternatively, the operator may adjust the adhesive applying machine so that it can apply an appropriate amount of adhesive to the entire surface of each PCB 20.

The actual state in which solder paste or adhesive is applied to each PCB 20, for example, the position where the solder paste or adhesive is applied to the PCB 20, or the amount in which the solder paste or adhesive is applied to the PCB 20, can be detected based on an image of the PCB 20 taken by the CCD camera 194. This detecting operation may be carried out for each of the CCs 18 mounted on the PCB 20, or for only the CC or CCs 18 which is or are inappropriately mounted on the PCB 20. The actual state of the solder paste or the adhesive can be detected by detecting the positions of a portion of the surface of the PCB 20 which portion surrounds each CC 20 mounted on the PCB 20. For example, in the case where a plurality of slit-light emitting devices like the slit-light emitting device 190 are employed (the more the better) for emitting respective slit lights toward different positions on a PCB 20, the actual state of a solder paste or an adhesive applied to the PCB 20 can be detected based on the respective shapes of a plurality of PCB exposed linear areas corresponding to the plurality of slit lights, respectively. As described above, the screen printing machine and the adhesive applying device which are used in combination with the present CC mounting system 10 are controlled by their exclusive control devices, and the control device 34 of the CC mounting system 10 supplies those control devices with the information needed for removing the cause of an inappropriate mounting of a CC 18 on a PCB 20, or the information needed for specifying the cause of an inappropriate mounting of a CC 18 on a PCB 20. However, it is possible that the present CC mounting system 10, the screen printing machine, and the adhesive applying machine be controlled by a single common control device for the same purpose.

Thus, each of the CC mounting system 10, the screen printing machine, and the adhesive applying machine includes at least one controllable device which is controllable for preventing CCs 18 from being mounted inappropriately on a PCB 20. The data processing device 198 and the control device 34 cooperate with each other to provide a controllable-device control device which specifies the cause of an inappropriate mounting of a CC 18 on a PCB 20 and controls the controllable devices to remove automatically the specified cause and appropriately mount the CCs 18 on the PCB 20. The CC mounting system 10 includes, as the controllable device thereof, the CC mounting units 40 and the X-Y table 66. As taught by the previously-identified Japanese Patent Application laid open for inspection under Publication No. 6-342998, the respective suction nozzles 44 of the CC mounting units 40 can be rotated about their axis lines each parallel to the Z direction, based on the respective positions of the CCs 18 held thereby. The respective positions of the CCs held by the suction nozzles 44 may be determined based on the respective images of the CCs 18 taken by a different camera than the CCD camera 194. The X-Y table 66 is operable for adjusting the X-direction and Y-direction positions of each CC 18. The DSP 222 can store its output data in the RAM 240, the DPRAM 230, or a memory device (not shown) of the control device 34. The RAM 240, the DPRAM 230, or a memory device (not shown) of the control device 34 provides a memory which stores data indicative of one or more CCs 18 which is or are inappropriately mounted on a PCB 20. The character RAM 246, the display controller 248, the D/A converter 250, the display, etc. cooperate with the display device (not shown) of the control device 34 to provide a test-result output device which outputs the data stored in the memory, so that the operator can recognize the CC or CCs 18 indicated by the data stored in the memory.

In the present embodiment, each of the CC mounting units 40 is lowered to its constant, lower Z-direction position where the CC 18 held by the suction nozzle 44 thereof is mounted on the PCB 20. Therefore, in the case where small CCs 18 are mounted after large CCs 18, or vice versa, the respective Z-direction positions of the Z table 100 and the main frame 67 are adjusted to accommodate the difference of the respective heights of the small and large CCs 18. Thus, all sorts of CCs 18 are mounted on PCBs 20 such that the upper surfaces of the CCs 18 are kept substantially constant. In addition, since the slit-light emitting device 190 is not moved in any directions, each of the CC exposed linear areas takes its prescribed positions in the raw image taken by the CCD camera 194, assuming that each CC 18 has no position errors. Regarding the example shown in FIGS. 7A to 7C, the position of the single CC exposed linear area in the vertical (i.e., Y) direction is constant, assuming that the CC 18 is not mounted in the unfixed state on the PCB 20. The Y-direction position of the PCB exposed linear area can be known in advance based upon the height of the CC 18. Thus, the positions of the CC 18 mounted on the PCB 20 can be measured using the first group of windows 270 and the second group of windows 290 shown in FIGS. 17 to 19. Generally, this sort of measurement can be done, if the positional relationship between the path of the slit light or lights and either one of the PCB 20 and each CC 18 is known. In the present embodiment, the positional relationship between the upper surface of each CC 18 and the path of the slit light or lights is not changed, i.e., constant.

Figure 24A:
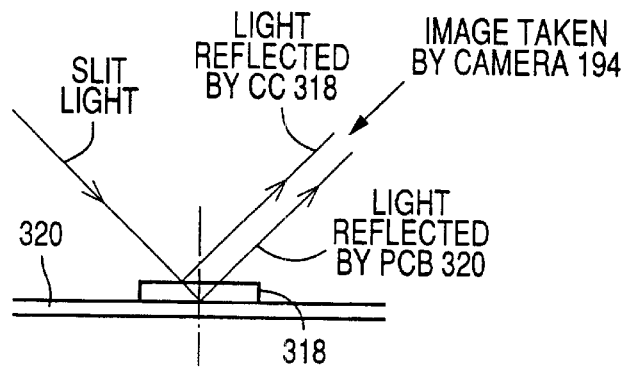
FIG. 24A is a view corresponding to FIG. 7A, showing a geometrical relationship between a slit light emitted by a slit-light emitter of another CC mounting system as a second embodiment of the invention and respective lights reflected by a CC and a PCB.
Figure 24B:
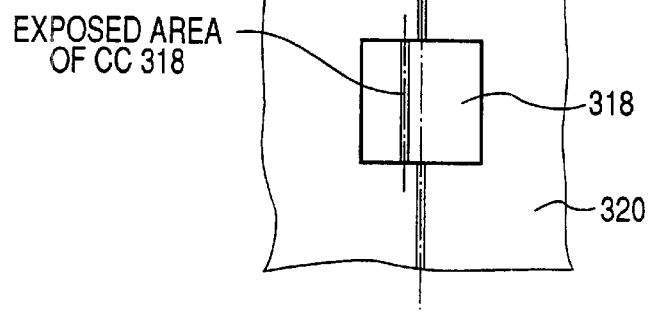
FIG. 24B is a view corresponding to FIG. 7B, showing a plan view showing respective exposed linear areas of the CC and the PCB.
Figure 24C:
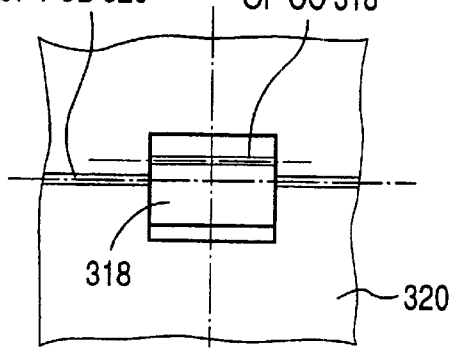
FIG. 24C is a view corresponding to FIG. 7C, showing a raw image taken by a CCD camera of the second CC mounting system.

FIG. 24A is a view corresponding to FIG. 7A, showing a constant positional relationship between the upper surface of a PCB 320 and the path of a slit light emitted by a slit-light emitter of another CC mounting system as a second embodiment of the invention. In the second embodiment, when a CC 318 is mounted on the PCB 320, the Z-direction position of a suction nozzle (not shown) is adjustable based on information indicative of the height of the CC 18. Accordingly, the present CC mounting system does not need the height adjusting device 64 employed in the first CC mounting system 10 for adjusting the Z-direction position of the PCB 20. A slit-light emitting device (not shown) employed in the second CC mounting system is not moved in any directions, like the slit-light emitting device 190 of the first system 10. FIG. 24C shows a raw image taken by a CCD camera (not shown) in which an exposed linear area of the PCB 320 takes its prescribed position in the vertical (i.e., Y) direction. The Y-direction position of an exposed linear area of each CC 318 can be predicated based on the direction of incidence of the slit light and the height of the CC 318. Thus, like the first CC mounting system 10, the second CC mounting system can measure the X-direction, Y-direction, and Z-direction positions of each CC 318 mounted on the PCB 320 using the first and second groups of windows 270, 290 shown in FIGS. 17 to 19. FIG. 24B is a plan view showing the respective exposed linear areas of the CC 318 and the PCB 320.

In the second embodiment, it is possible to employ an adjusting device which adjusts the Z-direction position of the slit-light emitting device so that the adjusted position may correspond to each of the two Z-direction positions of each suction nozzle which respectively correspond to the large and small sizes of the CCs 318 to be mounted on the PCB 320. In this case, too, one or more exposed linear areas on the upper surface of each CC 318, large or small, take prescribed positions in a raw image thereof taken by the CCD camera, like in the first embodiment. On the other hand, in the first embodiment, it is possible to employ an adjusting device which adjusts the Z-direction position of the slit-light emitting device 190 so that the adjusted position may correspond to each of the two Z-direction positions of the Z table 100 and main frame 67 which respectively correspond to the large and small sizes of the CCs 18 to be mounted on the PCB 20. In the last case, too, one or more exposed linear areas on the upper surface of the PCB 20 take prescribed positions in a raw image thereof taken by the CCD camera 194, like in the second embodiment.

In the first embodiment, the slit-light emitting device 190 is employed; and in the second embodiment, the slit-light emitting device similar to the slit-light emitter 190 is employed. However, this is not essential in measuring the positions of each CC 18, 318 just after the CC 18, 318 is mounted on the PCB 20, 320. That is, emitting a slit light toward each CC 18, 318 is not essential for the measurement. In fact, the measurement may be carried out by an "active" method in which a spot light, a pattern light, or the like may be employed in place of the slit light; or by a stereo method in which an image of each CC 18, 318 is taken by two or more CCD cameras 194. Those methods are well known as three-dimensional-shape measuring methods. However, the manner in which one or more slit lights are used is more advantageous than the other manners because it assures that the calculations carried out for determining the positions of each CC 18, 318 are simpler and clearer and are finished in a shorter time. That is, the manner using the slit light or lights is very suitable for measuring the positions of each CC 18, 318 which has just been mounted on the PCB 20, 320, because it assures that the positions of each CC 18, 318 is very quickly determined based on the taken image thereof.

In the first embodiment (and also in the second embodiment), the slit-light emitting device 190 and the CCD camera 194 are symmetrically inclined by the same angle (i.e., 45 degrees) with respect to a plane perpendicular to the upper surface of the PCB 20, so that the CCD camera 194 can take an image of the PCB 20 and the CC 18 based on the light regularly reflected therefrom. However, it is possible that the slit-light emitting device 190 and the CCD camera 194 be asymmetrically inclined by different angles with respect to a plane perpendicular to the upper surface of the PCB 20, so that the CCD camera 194 can take an image of the PCB 20 and the CC 18 based on the light irregularly reflected therefrom. In the latter case, if the CCD camera 194 is inclined by an angle of 45 degrees, the distance between an exposed linear area of each CC 18 and an exposed linear area of the PCB 20 can be regarded as being equal to the distance between the respective upper surfaces of each CC 18 and the PCB 20. If the CCD camera 194 is inclined by an angle other than 45 degrees, it is needed to carry out one or more calculations for converting the above-indicated first distance into the second distance.

In each of the first and second embodiments, any error of a position of each CC 18, 318 in a direction parallel to the upper surface of the PCB 20 is determined by comparing the actual positions of a plurality of points on the contour of each CC 18, 318, with reference positions. However, it is possible to determine or calculate actual X-direction and/or Y-direction positions of a representative point of each CC 18, 318, such as the center point thereof, and an actual angular or rotation position of the same 18, 318 about the representative point, and compare the calculated actual X and/or Y positions with reference X and/or Y positions and compare the calculated actual rotation position with a reference rotation position. In the latter case, an error of the X and/or Y positions of the representative point of each CC 18, 318 can be determined separately from an error of the rotation position of each CC 18, 318 about the representative point thereof.

Figure 25:
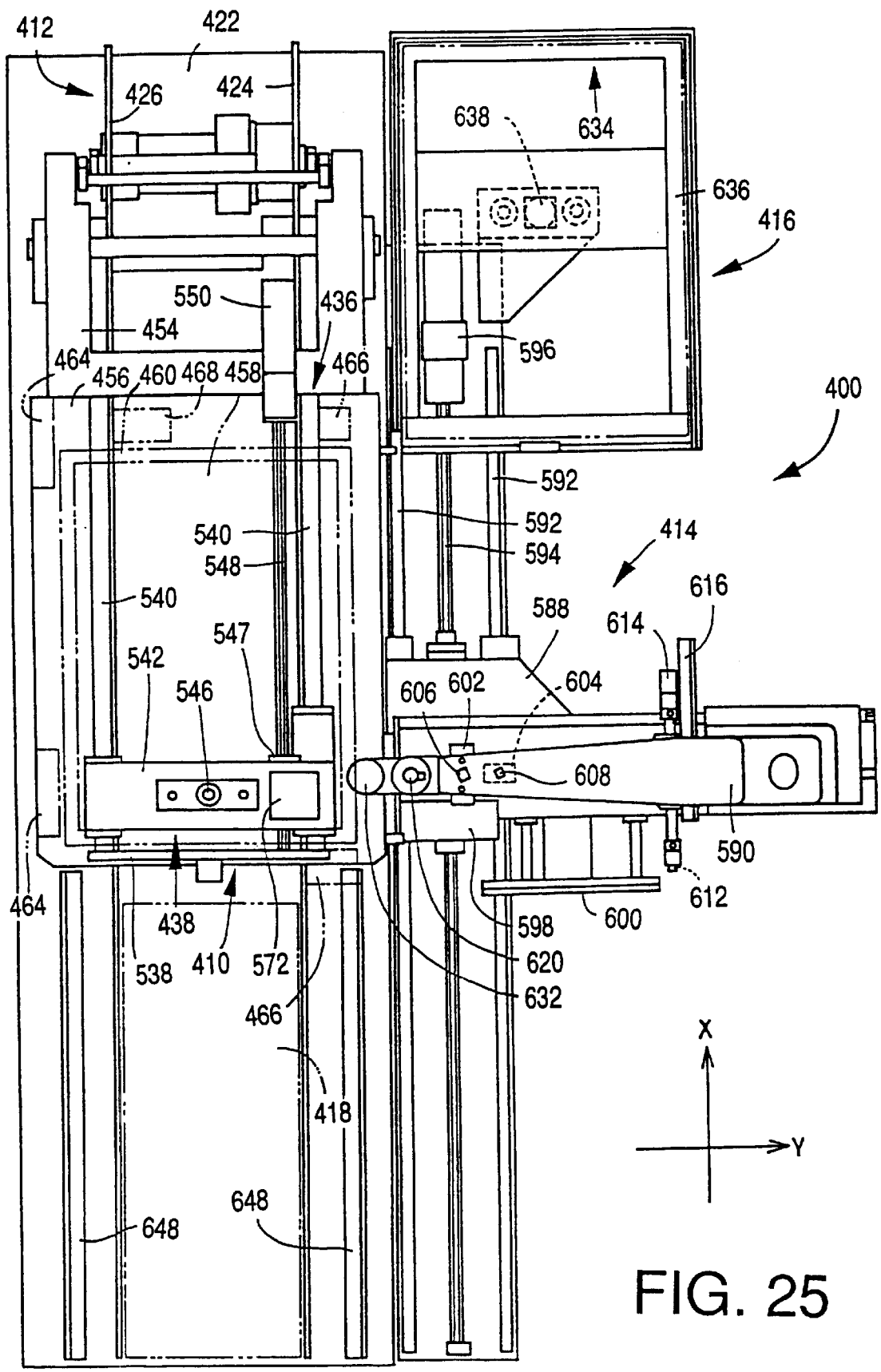
FIG. 25 is a plan view of a screen printing machine which may be used with the CC mounting system of FIG. 1.

FIG. 25 shows a screen printing machine 400 as a temporarily-fixing-material applying device which may be provided on an upstream side of the CC mounting system 10 shown in FIG. 1 in a direction in which a circuit substrate in the form of a PCB 428 is conveyed. The screen printing machine 400 prints solder cream on the PCB 428.

Figure 26:
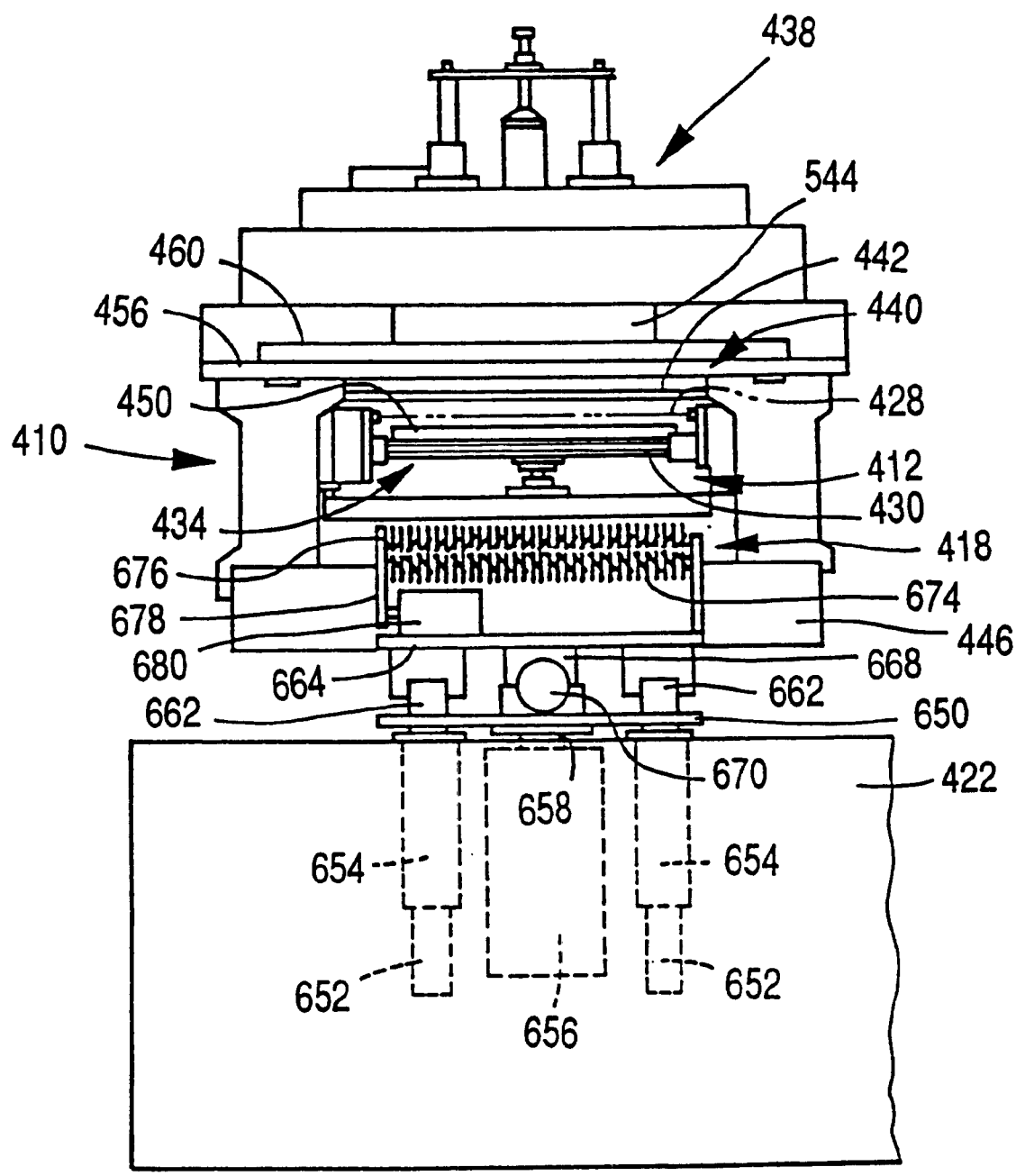
FIG. 26 is a side elevation view of a printing device and a screen cleaning device of the screen printing machine of FIG. 25.

As shown in FIGS. 25 and 26, the screen printing machine 400 includes a printing device 410, a PCB conveying device 412, a screen conveying device 414, a screen storing device 416, and a screen cleaning device 418.

The PCB conveying device 412 is provided on a stationary bed 422, and includes a fixed rail 424 and a movable rail 426 which extend in an X direction. Each of the two rails 424, 426 has, on its inner side, support members (not shown) which cooperate with each other to support an endless rope (not shown). The PCB 428 are placed on the two ropes and, when those ropes are moved or circulated, the PCB 428 is conveyed in the X direction. A plurality of feed screws 430 bridge the fixed and movable rails 424, 426 and, when the feed screws 30 are rotated by an electric motor (not shown), the movable rail 426 is moved toward, and away from, the fixed rail 424. Thus, the distance between the two rails 24, 26 can be adjusted depending upon the dimension (i.e., width) of the PCB 428 used. That is, the width of the PCB conveyor 412 is adjustable.

The printing device 410 has a construction known in the art, which is briefly described below. The printing device 410 includes a PCB positioning and supporting device 434, a screen positioning and supporting device 436, and a squeegeeing device 438, and a PCB hold-down device 440. The PCB hold-down device 440 is provided with the PCB conveyor 412 on the bed 422. The hold-down device 440 includes a PCB hold-down plate 442 which is movable in the X direction and, when the PCB 428 is supported by the PCB positioning and supporting device 434, holds down the PCB 428.

The PCB positioning and supporting device 434, the screen positioning and supporting device 436, and the squeegeeing device 438 are provided on a movable table 446 which is provided on the bed 22 such that the movable table 446 is movable in a Y direction perpendicular to the X direction. When the width of the PCB conveyor 412 is adjusted, the movable table 46 is moved in the same direction in which the movable rail 426 is moved, by half the distance of movement of the movable rail 426. Thus, even if the width of the PCB conveyor 412 is changed, the respective centers of the three devices 434, 436, 438 in the Y direction remain aligned with the Y-direction center of the PCB conveyor 412.

The PCB positioning and supporting device 434 includes a PCB support table 450 as a circuit-substrate support table which can be elevated and lowered in four steps by a multiple-step air-actuated cylinder device (not shown), i.e., can take four height positions. The PCB support table 450 cooperates with the PCB hold-down plate 442 to sandwich the PCB 428, and applies vacuum, i.e., a negative pressure to the PCB 428 to hold the PCB 428. In this state, the PCB support table 450 is moved up to one of the four height positions where the solder cream is printed on the PCB 428.

Figure 27:
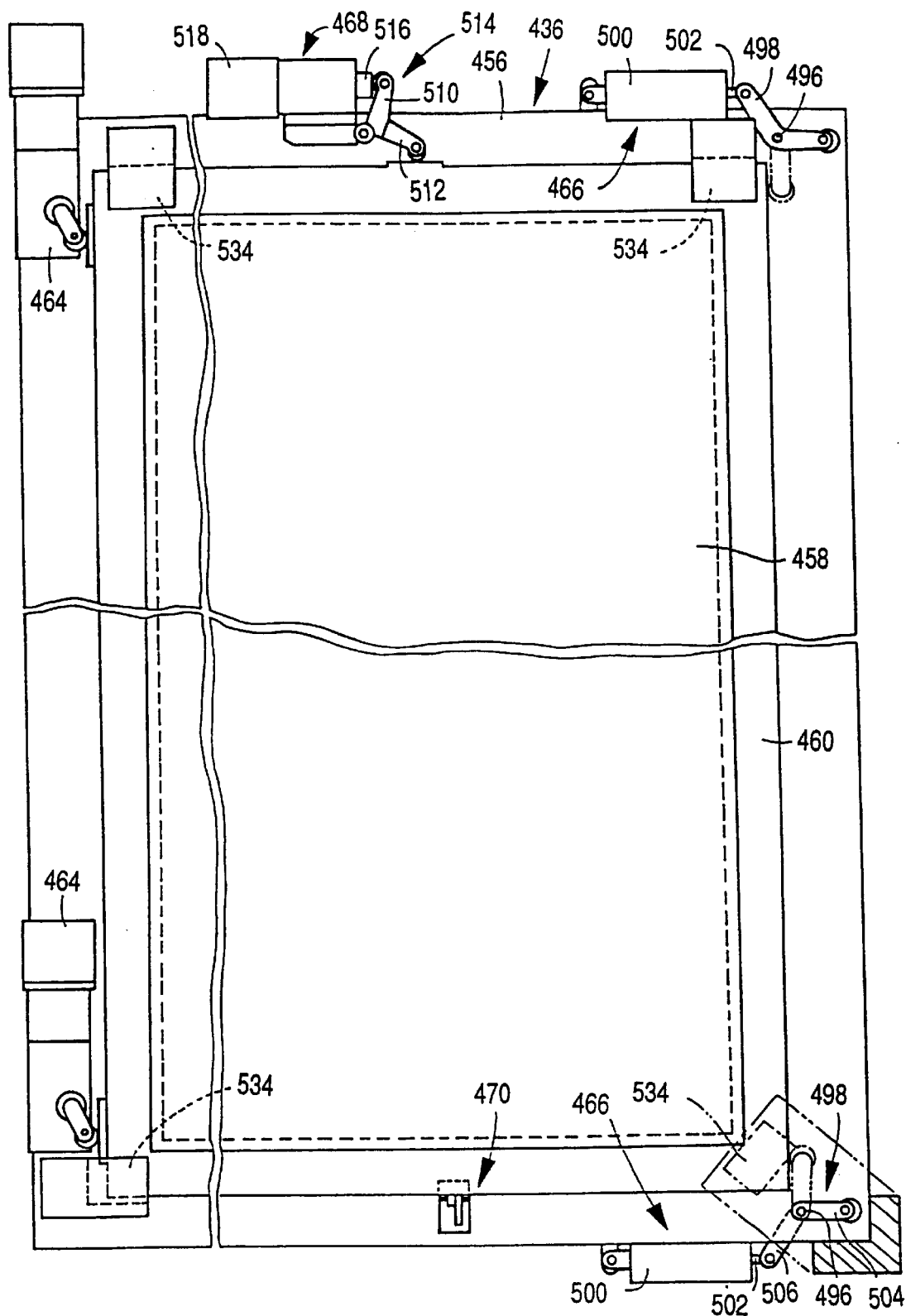
FIG. 27 is a plan view of a screen positioning and supporting device of the printing device of FIG. 26.

The screen positioning and supporting device 436 and the squeegeeing device 438 are supported by a frame 454 which is attached to the movable table 446 such that the frame 454 is rotatable about an axis line parallel to the Y direction. A screen support table 456 is fixed to the frame 454 and, as shown in FIG. 27, supports a screen 458 and a screen frame 460 which is fixed to the periphery of the screen 458.

Figure 28:
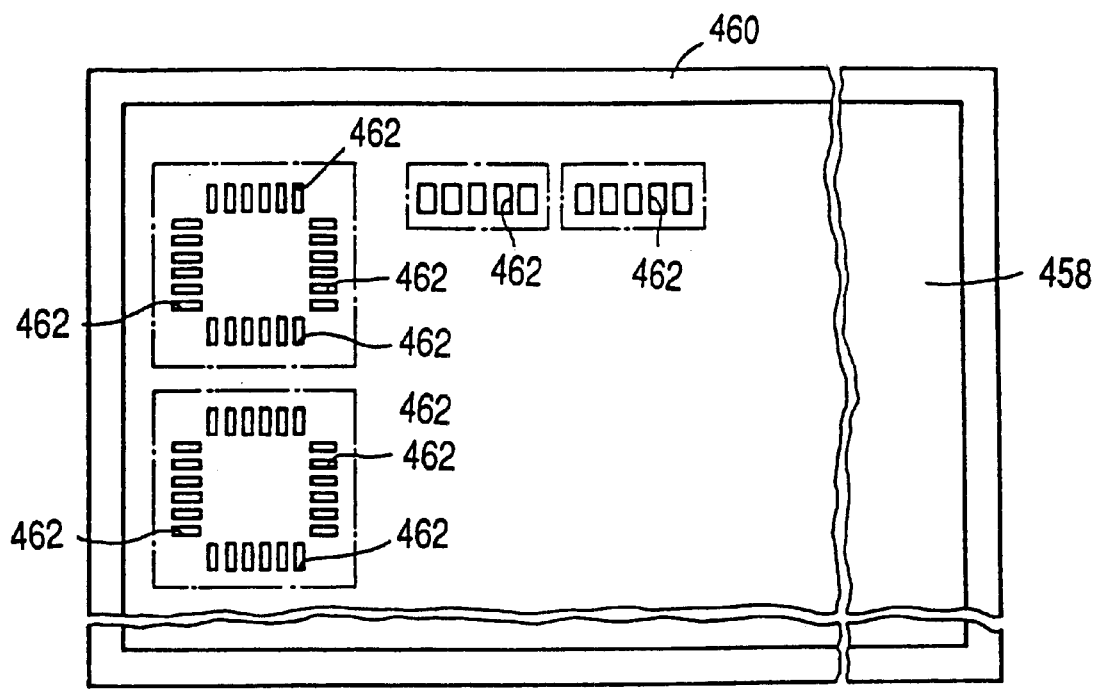
FIG. 28 is a plan view of a screen of the printing device of FIG. 26.
Figure 29:
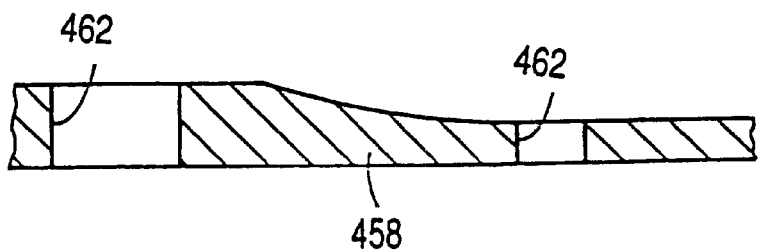
FIG. 29 is a cross-section, side elevation view of a part of the screen of FIG. 28.

As shown in FIGS. 28 and 29, the screen 458 has a number of through-holes 462 formed through the thickness thereof. The holes 462 are formed at positions corresponding to positions on the PCB 428 where lead wires of a flat-package-type circuit component are connected and positions where respective electrodes of a resistor, a capacitor, and etc. are connected. As shown in FIG. 29, the thickness of the screen 458 is not uniform. For example, in the case where a circuit component whose lead wires are thin and dense is mounted on the PCB 428, a small amount of solder cream must be applied to each of the positions where the lead wires are connected. Otherwise, a short circuit would occur. Thus, the holes 462 corresponding to those positions have respective widths corresponding to the diameters and density of the lead wires, and the screen 458 has a small thickness in an area corresponding to those positions, so that a small amount of solder may be printed at each of the positions.

The screen support table 456 is provided by a rectangular frame member having an opening, a pair of side portions each extending in the X direction, and a pair of side portions each extending in the Y direction. Two Y-direction-position defining devices 464 which are distant from each other in the X direction are provided on one of the two X-direction side portions of the support table 456 which one portion is more distant from the screen conveying device 414. Two Y-direction pressing devices 466 which correspond to the two Y-direction-position defining devices 464, respectively, are provided on the other X-direction side portions of the support table 456. A single X-direction-position defining device 468 is provided on one of the Y-direction side portions of the support table 456 which one portion is nearer to the frame 454, and a single X-direction pressing device 470 is provided on the other Y-direction side portion of the support table 456. The X-direction-position and Y-direction-position defining devices 468, 464 and the X-direction and Y-direction pressing devices 470, 466 cooperate with one another to provide the screen positioning and supporting device 436.

Figure 30:
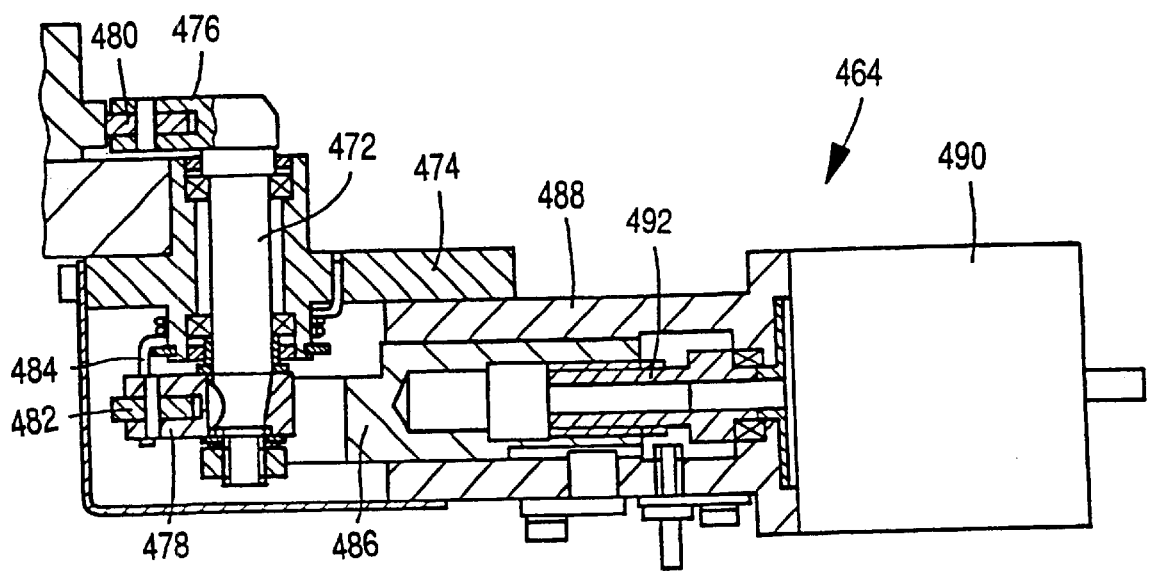
FIG. 30 is a cross-section, front elevation view of a Y-direction-position defining device of the screen positioning and supporting device of FIG. 27.

Each of the Y-direction-position defining devices 464 which cooperate with each other to define a Y-direction position of the screen 458 includes, as shown in FIG. 30, a positioning lever 472 which is rotatable about a vertical axis line. This lever 472 is rotatably supported by a bracket 474 fixed to the screen support table 456, and includes two arm portions 476, 478 which project in different radial directions from a vertical axis portion thereof. The two arm portions 476, 478 support, at their free ends, respective rollers 480, 482 such that the rollers 480, 482 are rotatable. A return spring 484 biases the lever 472 in a direction in which the upper arm portion 476 is moved away from the screen frame 460 and the roller 482 of the lower arm portion 478 is contacted with a free end of a push rod 486.

The push rod 486 is fitted in a block 488 fixed to the bracket 474, such that the push rod 486 is movable or slideable in the X direction. The push rod 486 is threadedly engaged with a screw shaft 492 connected to an output shaft of a stepper motor 490. Thus, when the stepper motor 490 is rotated, the push rod 486 is moved in the X direction. More specifically described, when the stepper motor 490 is rotated in a forward direction, the push rod 486 is moved forward, i.e., leftward as seen in FIG. 30, so that the positioning lever 472 is rotated against the biasing force of the return spring 484 and accordingly the upper arm portion 476 is moved toward the screen frame 460. When the stepper motor 490 is rotated in a reverse or backward direction, the upper arm portion 476 is moved away from the screen frame 460 because of the biasing force of the return spring 484. Thus, the Y-direction position of the screen 458 can be adjusted by rotating the respective stepper motors 490 of the two Y-direction-position defining devices 464 by an appropriate angle in an appropriate direction.

Each of the two Y-direction pressing devices 466 includes, as shown in FIG. 27, a push lever 498 which is supported by the screen support table 456 such that the push lever 498 is rotatable about a vertical axis member 496, i.e., a vertical axis line. The push lever 498 has a generally V-shaped configuration and is connected, at one end portion thereof, to a piston rod 502 of an air cylinder device 500 which is attached to the screen support table 460 such that the cylinder device 500 is rotatable about a vertical axis line. When the piston rod 502 takes its retracted position where the rod 502 is retracted in the housing of the cylinder device 500, the other end portion of the push lever 498 which is opposite to the one end portion thereof connected to the rod 502, is positioned outside the side surface of the corresponding Y-direction side portion of the screen frame 460, as indicated at solid lines. When the piston rod 502 takes its advanced position where the rod 502 is advanced out of the housing of the cylinder device 500, the other end portion of the push lever 498 is moved toward the corresponding X-direction side portion of the screen frame 460, so that the other end portion engages the side surface of the X-direction side portion and presses the screen frame 460 against the corresponding Y-direction-position defining device 464, as indicated at two-dot chain lines. Thus, the screen frame 460 is accurately positioned in the Y direction.

The push lever 498 of one of the two Y-direction pressing devices 466 which is provided on the downstream side of the screen support table 456 in the PCB conveying direction, has an upper arm portion 504 which is attached to an upper portion of the axis member 496 above the support table 456, and a lower arm portion 506 which is attached to a lower portion of the axis member 496 below the support table 456. Thus, in the state in which the push lever 498 takes its position, indicated at solid lines, where the lever 498 does not press the screen frame 460, the arm portions 504, 506 do not interfere with the movement of the screen frame 460 toward the screen conveying device 414 in the Y direction, i.e., rightward as seen in FIG. 27, and the movement of the same 460 in the PCB conveying direction in the X direction, i.e., downward as seen in FIG. 27.

The X-direction-position defining device 468 has a construction similar to that of each Y-direction-position defining device 464. In short, the defining device 468 includes a positioning lever 514 having two arm portions 510, 512, a return spring (not shown) which biases the lever 514, a push rod 516, and a stepper motor 518 which advances and retracts the push rod 516. With the defining device 468, the screen frame 460 is accurately positioned in the X direction.

Figure 31:
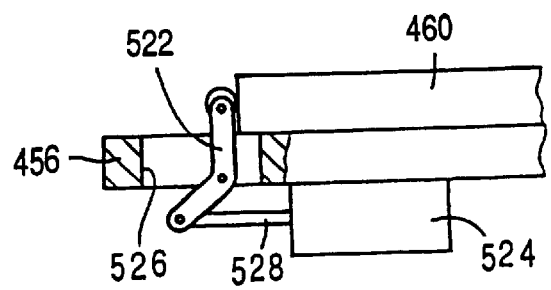
FIG. 31 is a front elevation view of an X-direction pressing device of the screen positioning and supporting device of FIG. 27.

The X-direction pressing device 470 includes a generally V-shaped push lever 522 sown in FIG. 31, and an air cylinder device 524 which rotates the push lever 522 to press the screen frame 460. The screen support table 456 has an elongate hole 526, and the push lever 522 is attached to the support table 456 such that the lever 522 is rotatable about an axis line parallel to the Y direction in the elongate hole 526. One end portion of the push lever 522 is rotatably connected to a piston rod 528 of the air cylinder device 524. When the piston rod 528 is advanced from, and retracted into, the housing of the cylinder device 524, the other end portion of the push lever 522 is moved between an operative position where the other end portion projects above the upper surface of the support table 456 and presses the screen frame 460 and an inoperative position where the other end is retracted in the elongate hole 526 below the upper surface of the support table 456.

Four air cylinder devices 534 are provided at four corners of the screen support table 456, respectively. Each cylinder device 534 is oriented downward. When the screen frame 460 is positioned, a piston rod (not shown) of each cylinder device 534 takes its retracted position where the piston rod is separate from the screen frame 460. After the screen frame 460 has been positioned, the respective piston rods of the four cylinder devices 534 are advanced to fix the screen frame 460 to the support table 456. Two of the four cylinder devices 534 which are provided on the downstream side of the support table 456 in the PCB conveying direction, i.e., the lower two cylinder devices 534 as seen in FIG. 27 are provided at positions where the cylinder devices 534 do not interfere with the movement of the screen frame 460 in the PCB conveying direction.

Next, there will be described the squeegeeing device 438.

As shown in FIG. 25, a frame 538 stands on a portion of the screen support table 456 which portion is remote from the frame 454, and two guide rods 540 extend in the X direction between the two frames 454, 538. A slide 542 is fitted on the guide rods 540 such that the slide 542 is slideable or movable on the guide rods 540 in the X direction. The slide 542 supports a squeegee unit 544 shown in FIG. 32, such that the squeegee unit 544 can be elevated and lowered. An air cylinder device 546 elevates and lowers the squeegee unit 544 between a lower position where the squeegee unit 544 contacts the screen 458 and prints the solder cream on the PCB 428, and an upper position where the squeegee unit 544 is away from the screen 458. The slide 542 is threadedly engaged with a feed screw 548 via a nut 547 and, when the feed screw 548 is rotated by a servomotor 550, the slide 542 and the squeegee unit 544 are reciprocated linearly in the X direction.

Figure 32:
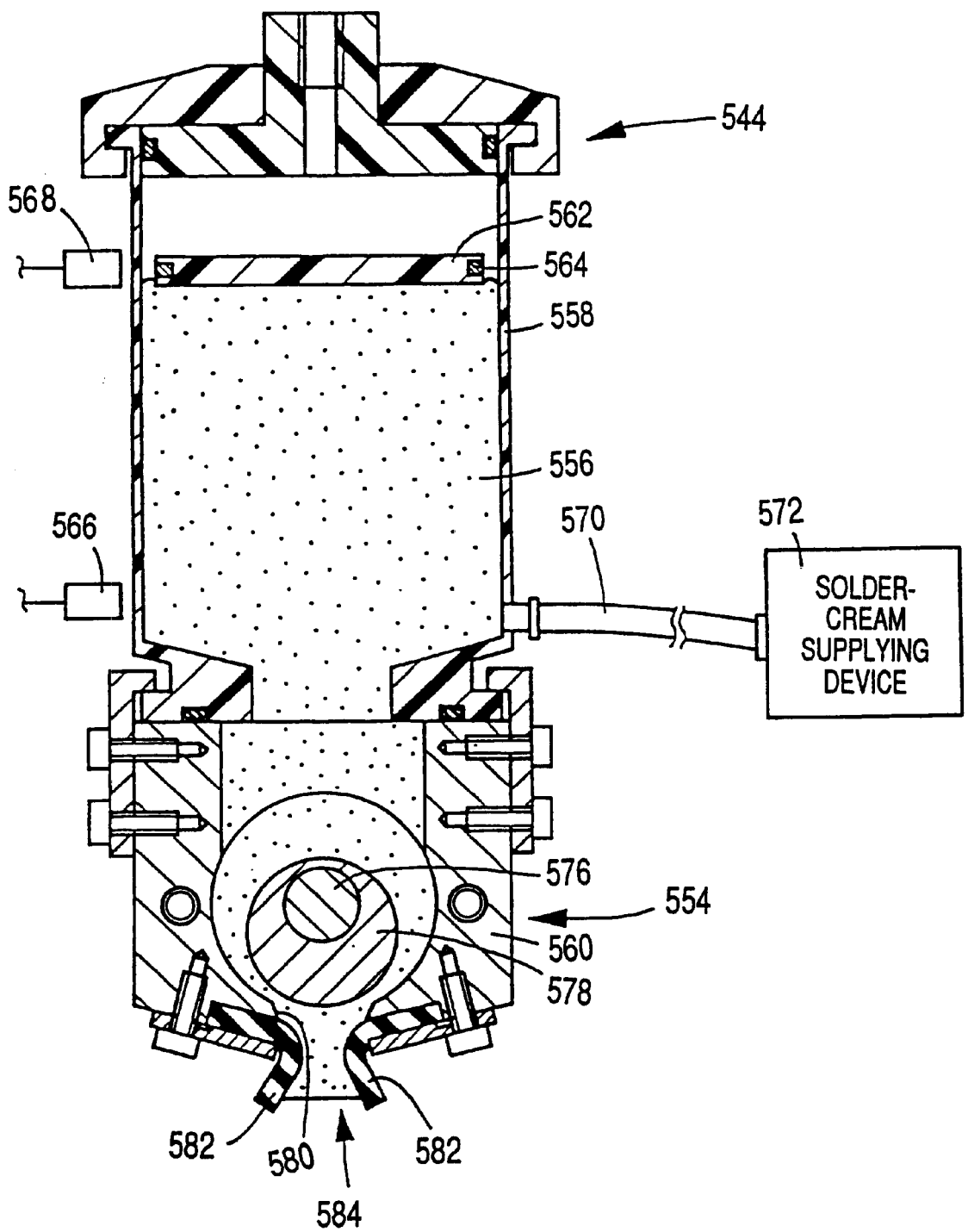
FIG. 32 is a cross-section, front elevation view of a squeegee unit of the printing device of FIG. 26.

The squeegee unit 544 includes, as shown in FIG. 32, an agitator 554 which is elongate in the direction of width of the screen 458, and a syringe 558 in which solder cream 556 is stored. The syringe 558 is detachably attached to a casing 560 of the agitator 554. With the syringe 558 being attached to the casing 560, the solder cream 556 flows into the casing 560 because of the self weight thereof and a low-pressure nitrogen gas supplied to the syringe 558. A float 562 floats on the solder cream 556 stored in the syringe 558. The float 562 is provided by a circular plate formed of a synthetic resin, and an iron ring 564 which fits on the outer circumferential surface of the circular plate. When a first magnetic switch 566 provided outside the syringe 558 detects the iron ring 564, a control device 700 (FIG. 36) identifies that the solder cream 556 stored in syringe 558 has been reduced down to its lower limit amount. A second magnetic switch 568 is provided outside the syringe 558, above the first switch 566 and, when the second switch 568 detects the iron ring 564, the control device 700 identifies that the solder cream 556 stored in the syringe 558 has been increased up to its upper limit amount.

The syringe 558 is connected via a hose 570 to a solder-cream supplying device 572. The supplying device 572 is provided on the slide 542, and the solder cream stored in the supplying device 572 is agitated ceaselessly by an agitator (not shown), so that the solder cream may have a viscosity suitable for the printing thereof on the PCB 428. The control device 700 supplies a supply command to the supplying device 572 to supply automatically the solder cream to the syringe 558.

The casing 560 of the agitator 554 is rotatably attached to a frame (not shown) which is elevated and lowered by the air cylinder device 546. The casing 560 accommodates an axis member 576 which is rotatable about an axis line, and an agitating roller 578 is attached to the axis member 576 such that the roller 578 is eccentric with the axis line of the axis member 576. When the axis member 576 is rotated by an electric motor (not shown), the agitating roller 578 is rotated to agitate the solder cream 556 stored in the casing 560 and maintain the appropriate viscosity of the same 556. The casing 560 has an opening 580 opening in a lower surface thereof, and a pair of rubber-based squeegee members 582 are attached to both sides of the opening so as to define an outlet 584. The casing 560 can be rotated about the axis member 576 by increments of small angles in an appropriate one of opposite directions, so that one of the two squeegee members 582 which is located on the upstream side of the casing 560 in the direction of movement of the squeegee unit 544 may contact the screen 458 and the other squeegee member 582 is slightly separate from the same 582.

The screen 458 can be replaced with another screen, when the current sort of PCBs 428 are changed to another sort of PCBs. When the current screen 458 is replaced with another screen, first, the screen 458 is drawn from the screen support table 456 by the screen conveying device 414, and is stored in the screen storing device 416, and then another screen 458 is taken from the screen storing device 416 and is positioned on the support table 456.

The screen conveying device 414 includes an X-direction slide 588 which is movable in the X direction, and a Y-direction slide 590 which is provided on the X-direction slide 588 such that the Y-direction slide 590 is movable in the Y direction. The X-direction slide 588 is fitted on a pair of guide rails 592 each extending in the X direction, such that the slide 588 is slideable or movable in the X direction. The X-direction slide 588 is threadedly engaged with a ball screw 594 and, when the ball screw 594 is rotated by an X-direction drive motor 596, the slide 588 is moved in the X direction.

A pair of guide rails (not shown) and a ball screw (not shown) are provided on the X-direction slide 588 and, when the ball screw is rotated by a Y-direction drive motor 598, the Y-direction slide 590 is moved in the Y direction. In addition, a plate-like guide member 600 extending in the Y direction is also provided on the X-direction slide 588.

The Y-direction slide 590 is elongate in the Y direction, and engageable members 602, 604 each having a generally U-shaped cross section are attached to a lower surface of a front end portion of the Y-direction slide 590. The first engageable member 602 is lowered by a lowering air cylinder device 606, and is biased upward by a spring (not shown). The engageable member 602 has a pair of walls which correspond to the two arm portions of its U-shaped cross section, respectively, and which extend in the X direction. Like the first engageable member 602, the second engageable member 604 is lowered by a lowering air cylinder device 608, and is biased upward by a spring (not shown), so that the second member 608 can be lowered and elevated. The second member 602 has a pair of walls which correspond to the two arm portions of its U-shaped cross section, respectively, but those walls extend in the Y direction.

An engageable pin 612, a third engageable member 614 having a generally U-shaped cross section, and a support member 616 are attached to a rear end portion of the Y-direction slide 590. The third engageable member 614 is attached to the Y-direction slide 590, such that a pair of walls of the third member 614 which correspond to the two arm portions of its U-shaped cross section, respectively, extend in the Y direction. The engageable pin 612 and the third engageable member 614 are lowered by respective lowering air cylinder devices (not shown), and are biased upward by respective springs (not shown). The support member 616 extends in the X direction.

Figure 33:
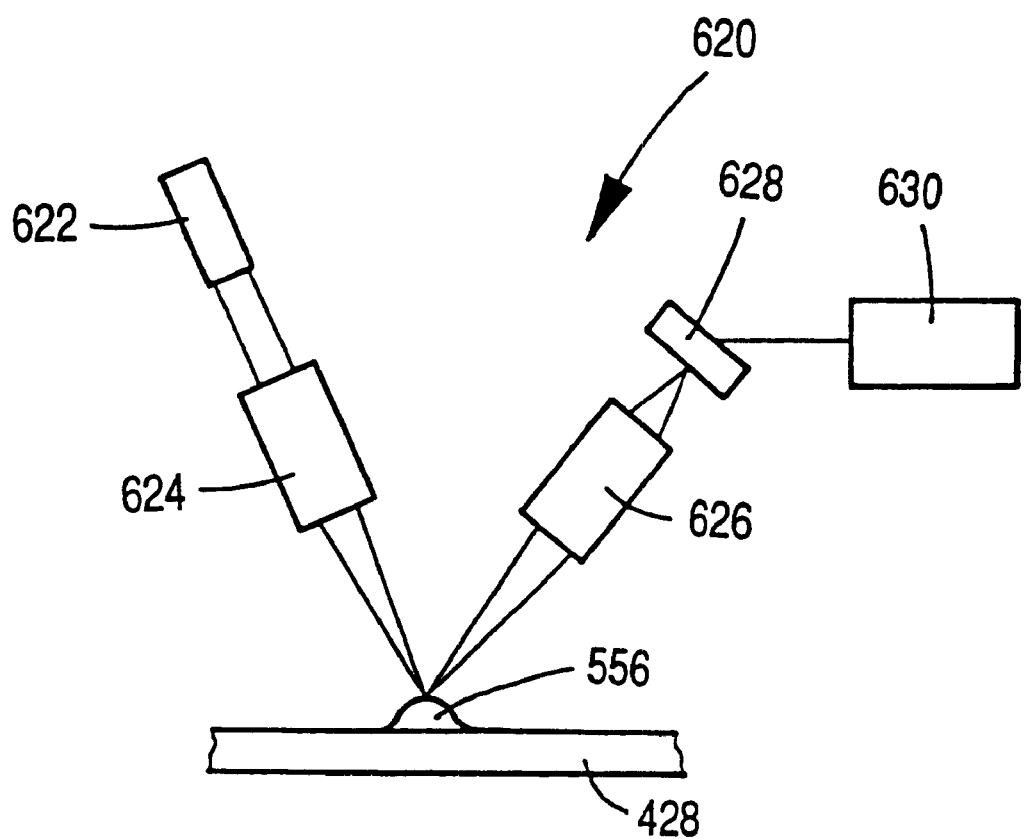
FIG. 33 is a view illustrating the principle of operation of a laser displacement sensor which detects solder printed on a PCB.

A laser displacement sensor 620 is attached to the front end portion of the Y-direction slide 590. As shown in FIG. 33, the laser sensor 620 includes a laser-beam generator 622 which generates or emits a laser beam; a first optical system 624 which converges the laser beam emitted by the laser-beam generator 622 and causes the converged laser beam to be incident to the solder cream 556 printed on the PCB 428; a second optical system 626 which converges the light reflected from the solder cream 556 and causes the converged light to be incident to a semiconductor position sensor element 628; and an analog arithmetic circuit 630 which calculates or determines a position where the light reflected from the solder 556 is incident to the position sensor 628. This position changes depending upon the height of the solder 556. Therefore, the arithmetic circuit 630 can determine not only the position where the solder 556 is printed on the PCB 428, but also the height of the same 556.

As shown in FIG. 25, a CCD camera 632 is attached to the front end portion of the Y-direction slide 590, such that the CCD camera 632 is more distant than the laser sensor 620 from the rear end of the slide 590. The CCD camera 632 can be moved to any desired position on a horizontal plane by the movements of the X-direction slide 588 and the Y-direction slide 590.

The screen storing device 416 includes a casing 634 having an upper and a lower screen storing portion 636, 636; and an elevating and lower air cylinder device 638 which elevates and lowers the casing 634 so that a selected one of the two screen storing portions 636 is positioned at a screen hand-over position. The manner in which two screens are automatically replaced with each other is well known in the art and accordingly is described briefly below.

In the case where the two screens 458 are replaced with each other when the current sort of PCBs 428 are changed to another sort of PCBs 428, first, the first engageable member 602 attached to the Y-direction slide 590 is engaged with the screen frame 460, and the screen frame 460 is drawn from the screen support table 456 in the Y direction over a distance equal to about half the Y-direction dimension of the frame 460. Then, the engageable pin 612 is engaged with the screen frame 460, and the screen frame 460 is entirely drawn from the screen support table 456 while being guided by the guide member 600. In this state, the X-direction slide 588 is moved in this state, so that the screen frame 460 is moved with the guide member 600 toward the screen storing device 416 over a distance equal to about half the X-direction dimension of the frame 460. In this state, the third engageable member 614 is engaged with the screen frame 460 and is moved in the X direction, so that the screen frame 460 and the current screen 458 are stored in the upper screen storing portion 636 of the screen storing device 416. Next, the lower screen storing portion 636 is positioned at the screen hand-over position, so that another screen 458 and its screen frame 460 are moved onto the screen support table 456 in steps reverse to the steps in which each screen 458 and its screen frame 460 are stored in the screen storing device 416. The new screen 458 or its screen frame 460 is positioned on the screen support table 456 and is used for the screen printing operation.

Next, there will be described the screen cleaning device 418. The screen cleaning device 418 is provided on a downstream side of the printing device 410 on the bed 422 in the direction of conveying of the PCB 428. As shown in FIG. 25, a pair of guide rails 648 are provided above the PCB conveyor 412 and the screen cleaning device 418 on the bed 422. The guide rails 648 guide the screen frame 460 when the frame 460 is unloaded from the screen support table 456.

The screen cleaning device 418 has a width slightly smaller than the greatest possible distance between the fixed and movable rails 424, 426 of the PCB conveying device 412. As shown in FIG. 26, the cleaning device 418 includes an elevator table 650 which is provided on the bed 422 such that the elevator tale 650 is movable upward and downward. Four guide rods 652 are fixed to a lower surface of the elevator table 650, and are fitted in respective bushings 654 which are embedded in the bed 422 such that the guide rods 652 are slideable or movable in the bushings 654. The elevator table 650 is connected to a piston rod 658 of an elevating and lowering air cylinder device 656 which is accommodated in the bed 422. Thus, when the piston rod 658 is advanced from, and retracted into, the housing of the air cylinder 656, the elevator table 650 is elevated and lowered.

Figure 34:
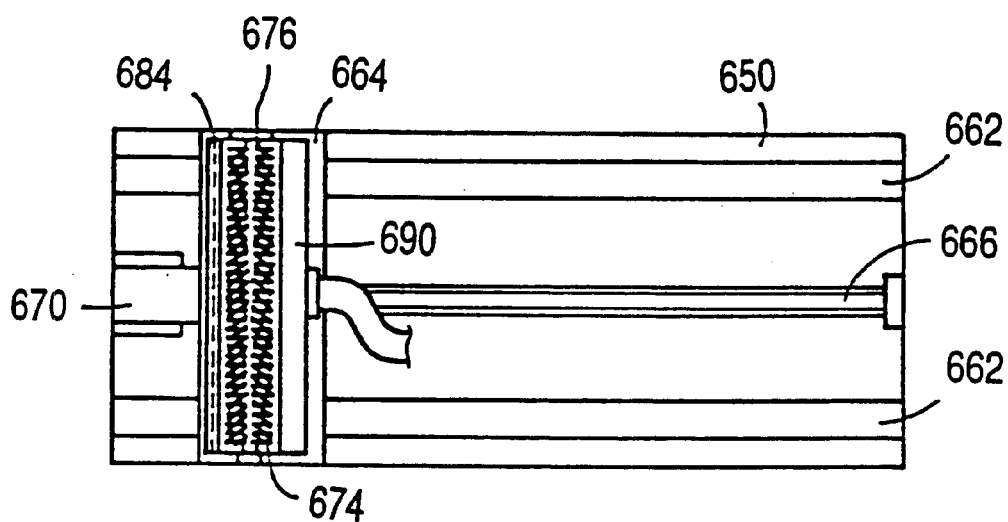
FIG. 34 is a plan view of the screen cleaning device of FIG. 26.

A pair of guide rails 662 are provided on the elevator table 650, such that the guide rails 662 extend in the X direction. A slide 664 is fitted on the two guide rails 662, such that the slide 664 is slideable or movable on the guide rails 662. As shown in FIG. 34, the slide 664 is threadedly engaged with a ball screw 666 via a nut 668 (FIG. 26). When the ball screw 666 is rotated by a drive motor 670, the slide 664 is moved on the guide rails 662 in the X direction. On the slide 664, there is provided a brush 674 which is elongate in the Y direction, such that the brush 674 is rotatable about an axis member 676, i.e., an axis line parallel to the X direction.

Figure 35:
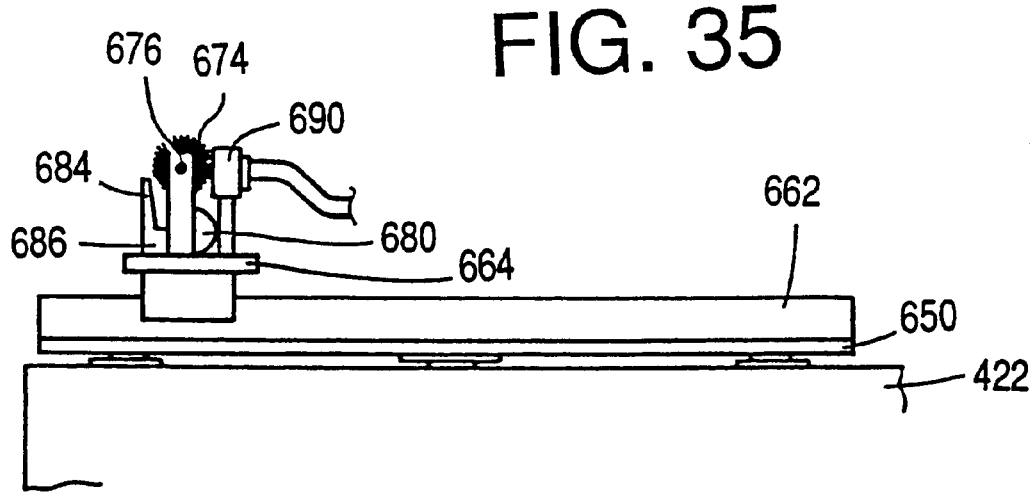
FIG. 35 is a front elevation view of the screen cleaning device of FIG. 26.

As shown in FIG. 26, the axis member 676 is rotated by a drive motor 680 via a pulley (not shown) fixed to one end portion of the axis member 676, a belt 678, etc. As shown in FIGS. 34 and 35, a solvent spraying nozzle 684 and a solvent supplying device 686 are provided on the slide 664. The solvent spraying nozzle 684 sprays a solvent toward the screen 458, for dissolving the solder cream 556 adhered to the same 458. On the slide 664, there is also provided a vacuum suction device 690 along the elongate brush 674. The vacuum suction device 690 is connected to a vacuum source 692 (FIG. 36), and is supplied with vacuum, i.e., a negative pressure for sucking the solder cream 556 adhered to the brush 674.

Figure 36:
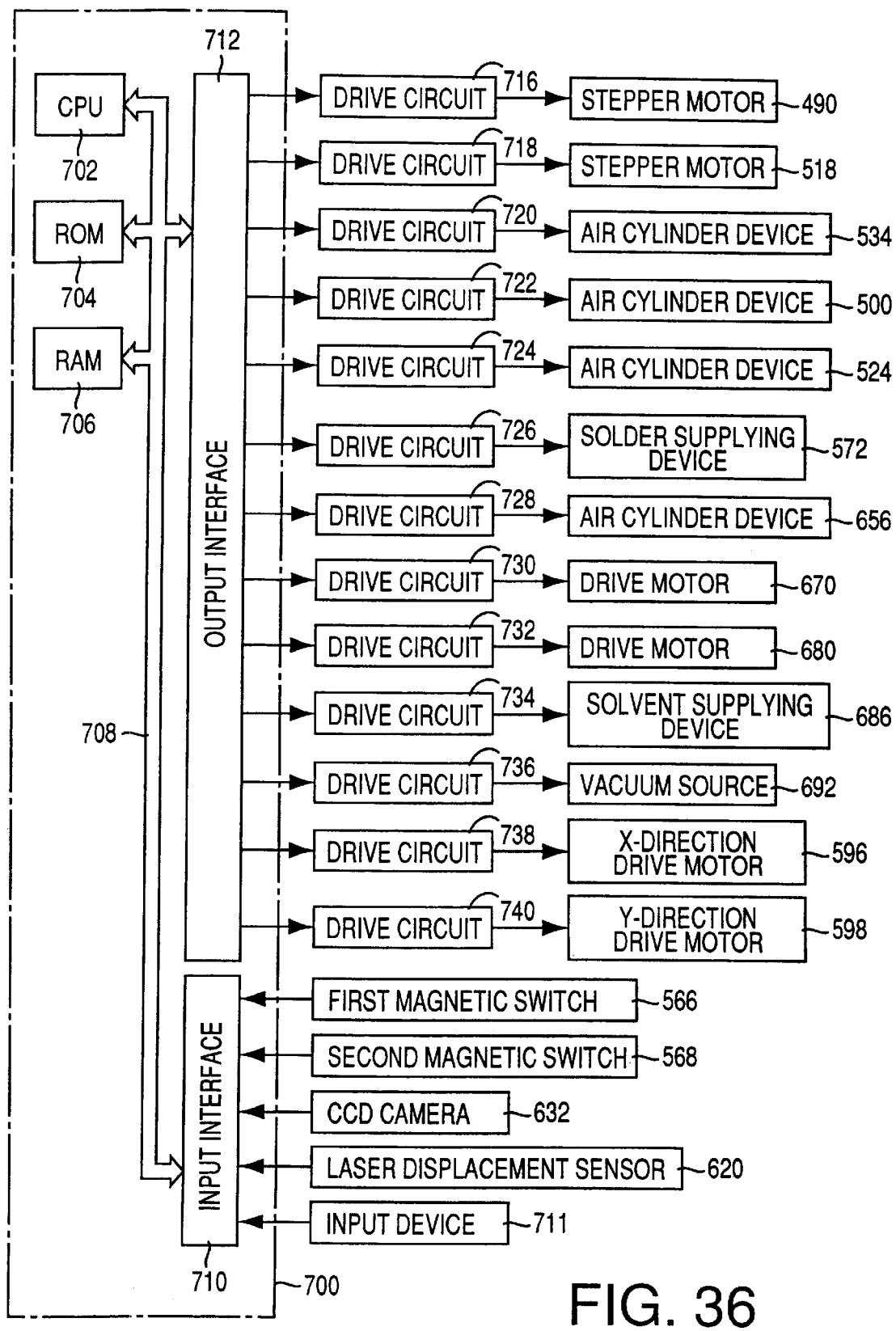
FIG. 36 is a block diagram of a control device which controls the screen printing machine of FIG. 25.

The present screen printing machine 400 is controlled by a control device 700 shown in FIG. 36. The control device 700 is essentially provided by a computer including a central processing unit (CPU) 702, a read only memory (ROM) 704, a random access memory (RAM) 706, and a bus 708 which connects those elements 702, 704, 706 with one another. The bus 708 is connected to an input interface 710 to which the first and second magnetic switches 566, 568, the laser displacement sensor 620, the CCD camera 632, and an input device 711 are connected. The input device 711 has numeral keys, alphabet keys, and function keys, and is manually usable by an operator for inputting data indicative of the thickness of the screen 458, etc. or operating the PCB conveying device 412, the screen conveying device 414, or the other devices of the present screen printing machine 400.

The bus 708 is also connected to an output interface 712 which are connected to the stepper motors 490, 518, the air cylinders 534, 500, 524, the solder supplying device 572, the air cylinder 656, the drive motor 670, 680, the solvent supplying device 686, the vacuum source 692, and the X-direction and Y-direction drive motors 596, 598, via respective drive circuits 716, 718, 720, 722, 724, 726, 728, 730, 732, 734, 736, 738, 740. Although the output interface 712 is also connected to the drive motors of the printing device 410 and the PCB conveyor 412, those motors are omitted from FIG. 36.

Next, there will be described the operation of the screen printing machine 400.

Before the screen printing operation is started, the screen 458 is positioned on the screen support table 456, and an image of the screen 458 is taken by the CCD camera 632. However, the CCD camera 632 takes an image of only a specific portion or portions of the screen 458 which is or are designated by the operator through the input device 711. Experiences teach that inappropriate screen printings, such as insufficient amount of printed solder, incorrect print position, etc., occur to only a specific portion or portions of a PCB 428. Therefore, the CCD camera 632 takes an image of only a specific portion or portions of the screen 458 which corresponds to the specific portion or portions of the PCB 428.

When the image is taken by the CCD camera 632, a light absorbing member is placed under the screen 458. Therefore, in the image taken, the through-holes 462 of the screen 458 are distinguished from the remaining portion of the same 458. The operator inputs, through the input device 711, commands to move the X-direction slide 588 and/or the Y-direction slide 590 and thereby move the CCD camera 632 to a desired position (hereinafter, referred to as the "image-taking position"). At the image-taking position, the CCD camera 632 takes an image of each of specific portions of the screen 458 each of which is indicated at one-dot chain line in FIG. 28. The CPU 702 stores, in the RAM 706, sets of image-taking-position data each set of which is representative of a corresponding one of image-taking positions corresponding to the specific portions of the screen 458, and sets of taken-image-data which is representative of a corresponding one of respective images of those specific portions taken by the CCD camera 632, such that each set of image-taking-position data and a corresponding set of taken-image-data are associated with a corresponding specific portion of the screen 458. In addition, since the thickness of the screen 458 is known from the design specification for the same 458, the operator inputs, when the images are taken, the thickness of each of the specific portions of the screen 458. The CPU 702 stores, in the RAM 706, sets of screen-thickness data each of which is representative of a corresponding one of the respective thicknesses of the specific portions of the screen 458, such that each set of image-taking-position data, each set of taken-image-data, and each set of screen-thickness data which correspond to each of the specific portions of the screen 458 are associated with one another.

After all the respective images of the specific portions of the screen 458 are taken, the control device 700 produces, based on the sets of image-taking-position data, the sets of taken-image data, and the sets of screen-thickness data, sets of reference-print-position data each set of which is representative of the X-direction and Y-direction positions, and the two-dimensional shape, of a corresponding one of reference print portions where the solder cream 556 should be printed on each PCB 428; sets of reference-print-area data each set of which is representative of a corresponding one of respective areas of the reference print portions; and sets of reference-solder-cream-amount data each set of which is representative of a corresponding one of reference solder-cream amounts which should be printed on the reference print portions, respectively. More specifically, the control device 700 produces, based on the sets of image-taking-position data and the sets of taken-image data, the sets of reference-print-position data each set of which is representative of the X-direction and Y-direction positions of, and the two-dimensional shape, of a corresponding one of the through-holes 462 of the screen 458. In the case where the holes 462 have a rectangular or square cross section, the control device 700 determines the respective positions of three vertices of the rectangle or square of each hole 462 and produces the sets of reference-print-position data each set of which is representative of the determined respective positions of the three vertices of a corresponding one of the holes 462; and in the case where the holes 462 have a circular cross section, the control device 700 determines the position of the center, and the radius, of the circle of each hole 462 and produces the sets of reference-print-position data each set of which is representative of the determined center position and radius of a corresponding one of the holes 462. The CPU 702 stores, in the RAM 706, the sets of reference-print-position data such that each set of reference-print-position data is associated with a corresponding one of sequential numbers which are assigned to the above-described specific portions of the screen 458, respectively.

The control device 700 produces, based on the sets of taken-image data, the sets of reference-print-area data each set of which is representative of the cross-section area of a corresponding one of the through-holes 462. The CPU 702 stores, in the RAM 706, the sets of reference-print-area data such that each set of reference-print-area data is associated with a corresponding one of the sets of reference-print-position data. And, the control device 700 produces, based on the sets of reference-print-area data and the sets of screen-thickness data, the sets of reference-solder-cream-amount data each of which is representative of the volume of a corresponding one of the through-holes 462. The volume of each through-hole 462 of the screen 458 is equal to the amount of solder cream 556 to be printed on a corresponding print portion on the PCB 428. The CPU 702 stores, in the RAM 706, the sets of reference-solder-cream-amount data such that each set of reference-solder-cream-amount data is associated with a corresponding one of the sets of reference-print-position data.

When the screen printing operation is performed, the width of the PCB conveyor 412 is adjusted, as needed, to be a value corresponding to the width of the PCB 428 to be used. After the PCB 428 is conveyed to a position right below the screen 458, the PCB 428 is positioned and supported by the PCB support table 450, and is elevated to contact the lower surface of the screen 458. In this state, the squeegee unit 544 is moved so that the solder cream 556 is printed on the PCB 428 via the screen 458.

After the screen printing operation, the PCB 428 is lowered away from the screen 458, and is conveyed to the downstream side of the printing device 410 by the PCB conveyor 412, where the PCB 428 is positioned by a positioning device (not shown). Then, the reference marks provided on the PCB 428 are read by the laser displacement sensor 620. The sensor 620 also detects the state in which the solder cream 556 is printed on the PCB 428. More specifically, the X-direction slide 588 and the Y-direction slide 590 of the screen feeding device 414 are moved, so that the sensor 620 is moved over the PCB 428 while detecting the position and height of the solder cream 556 printed on each print portion of the PCB 428. It is noted that the sensor 620 is moved over only the areas of the PCB 428 which correspond to the areas of the screen 658 whose images had been taken by the CCD camera 632. The sets of position data representative of the respective positions of the through-holes 662 are modified based on the error of positioning of the PCB 428 which is calculated based on the detected positions of the reference marks of the PCB 428. The thus modified sets of position data are utilized for producing movement data according to which the sensor 620 is moved for taking the image of the solder cream 556 printed on each print portion of the PCB 428, and thereby detecting the position and height of the same 556.

Then, the control device 700 calculates the actual position, area, and amount of the solder cream 556 printed on each print portion of the PCB 428 corresponding to each through-hole 662 of the screen 458. A set of actual-print-position data representative of the actual position and a set of actual-print-area data representative of the actual area are produced based on the detected position of the solder cream 556 printed on each print portion of the PCB 428, and are stored in the RAM 706 such the set of actual-print-position data and the set of actual-print-area data are associated with a sequential number assigned to each specific portion of the PCB 428 corresponding to each of the above-indicated specific portions of the screen 458. A set of actual-solder-cream-amount data representative of the actual solder-cream amount is produced based on the detected height of the solder cream 556 printed on each print portion of the PCB 428, and is stored in the RAM 706 such the set of actual-printed-volume data is associated with the sequential number assigned to each specific portion of the PCB 428.

Next, the control device 700 checks the thus obtained results or data against the reference data. More specifically described, the control device 700 calculates the errors or differences between the actual position, area, and amount of the solder cream 556 printed on each print portion of the PCB 428, and the reference position, area, and amount of the same 556, and judges whether the printing of the solder cream 556 should pass the test.

First, the actual print area of the solder cream 556 is checked. The control device 700 compares the actual print area with the reference print area. If the actual print area is not smaller than a predetermined ratio of the reference print area, the control device 700 judges that the printing of the solder cream 556 should pass the test and, if not, the control device 700 judges that the printing of the solder cream 556 should not pass the test. In the case where almost all solder creams 556 printed on respective print portions of the PCB 428 have passed the test but only one or a few solder creams 556 has or have not passed the test, the control device 700 judges that the inappropriate printing of the solder cream or creams 556 resulted from the clogging of the through-hole or through-holes 662 of the screen 458, and automatically starts the screen cleaning device 418.

First, the air-cylinder devices 534 are operated to release the screen frame 460, and the X-direction and Y-direction pressing devices 470, 466 are operated to release the screen frame 460. Next, the X-direction and Y-direction slides 588, 590 of the screen feeding device 414 are moved so that the second engaging member 604 engages the Y-direction extending portion of the screen frame 460, and additionally the X-direction slide 588 is moved so that the screen frame 460 is guided by the guide rails 648 and moved from the screen support table 456 to a position above the screen cleaning device 418.

Then, the width of the PCB conveyor 412 is maximized, and the elevator table 650 is elevated so that the brush 674 contacts the lower surface of the screen 458. While the brush 674 is rotated, the brush 674 is moved along the screen 458 by the slide 664. Thus, the solder cream 556 clogging the through-hole or through-holes 662 of the screen 458 is removed. In addition, the solvent spraying nozzle 684 is operated to spray the solvent to the screen 458 and thereby remove the solder cream 556 adhered to the screen 458. Moreover, the solder cream 556 adhered to the brush 674 is sucked up by the vacuum device 690.

Next, the actual amount of the solder cream 556 printed on each print portion of the PCB 428 is checked. The control device 700 compares the actual solder-cream amount with the reference solder-cream amount of the same 556. In the case where it is judged for each of a predetermined number of print portions of the PCB 428 that the actual amount of the solder cream 556 printed at each print portion is not greater than a predetermined ratio of the reference solder-cream mount of the same 556, the control device 700 outputs an operation command to the solder-cream supplying device 572 to supply the solder cream 556 to the syringe 558. This solder-cream supplying operation continues under a small pressure which does not cause the solder scream 556 to be released from the outlet 584, until the second magnetic switch 568 detects the ring 564 of the float 562.

Meanwhile, when the first magnetic switch 566 detects the shortage of the solder cream 556 in the syringe 558, the control device 700 commands the solder-cream supplying device 572 to supply the solder cream 556 to the syringe 558. However, if the first magnetic switch 566 is out of order, or if the control device 700 malfunctions, the shortage of the solder cream 556 is not detected, or the solder cream 556 is not supplied to the syringe 558 even if the shortage of the solder cream 556 is detected. In those cases, the shortage of the solder cream 556 can be identified based on the above-described test results obtained from the solder creams 556 printed on the respective print portions of the PCB 428, and the solder cream 556 can be supplied to the syringe 558. Thus, the screen printing operation can be continued.

Furthermore, the actual position of the solder cream 556 printed on each print portion of the PCB 428 is checked. The control device 700 compares the actual print position of the solder cream 556 with the reference print position of the same 556. In the case where the error or difference between the actual print position and the reference print position is not smaller than a tolerable or permissible value, the position of the screen 458 is adjusted. More specifically, the control device 700 determines the direction in which the position of the screen 458 is adjusted and calculates the amount of adjusting of the position of the screen 458. Next, the air-cylinder devices 534 and the X-direction and Y-direction pressing devices 470, 466 are operated to release the screen frame 460, and the stepper motors 490, 518 are started to adjust the respective positions of the positioning levers 472, 514. Then, the pressing devices 470, 466 are operated to press the screen frame 460 against the positioning levers 472, 514. Thus, the position of the screen 458 is adjusted to a position where the solder cream 556 is printed without errors on each PCB 428. In the present screen printing machine 400, the X-direction and Y-direction position defining devices 468, 464 and the X-direction and Y-direction pressing devices 470, 466 cooperate with one another to provide a screen-position adjusting device which automatically adjusts the position of the screen 458 on the screen support table 456.

The control device 700 receives, from the control device 34 of the CC mounting system 10, data indicative of one or more candidates for the cause of an inappropriate mounting of a CC 18 on a PCB 20. If the candidate is that the one or more through-holes 662 of the screen 458 is clogged with the solder cream 556, the control device 700 controls the screen cleaning device 418 to remove the solder cream 556 clogging the holes 662 of the screen 458. If the candidate is that the solder cream 556 stored in the syringe 558 is short, the control device 700 controls the solder-cream supplying device 572 to supply the solder cream 556 to the syringe 558. If candidate is that the position of the screen 458 is not appropriate, the control device 700 controls the screen positioning device 436 to adjust the position of the screen 458.

Figure 37:
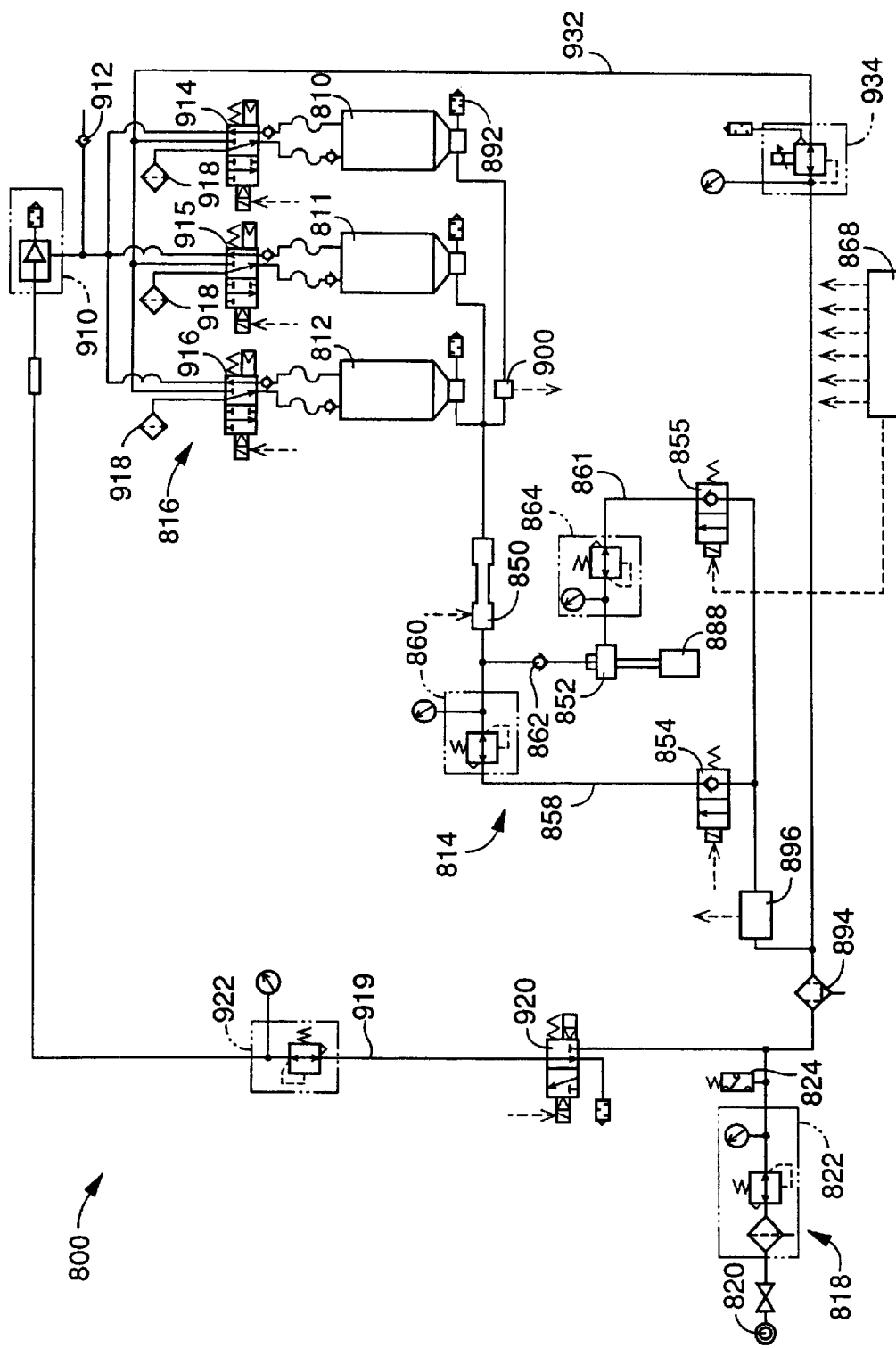
FIG. 37 is a diagram showing an overall circuit of an adhesive dispenser which may be used with the CC mounting system of FIG. 1.

FIG. 37 shows an adhesive dispenser 800 as a temporarily-fixing-material applying device which may be provided on an upstream side of the CC mounting system 10 shown in FIG. 1 in a direction in which a circuit substrate such as a PCB is conveyed.

In FIG. 37, reference numerals 810, 811, 812 designate a first, a second, and a third adhesive applying heads, respectively; reference numeral 814 designates an adhesive-temperature ("AT") control device; and reference numeral 816 designates a pressure ("P") control device. The AT control device 814 and the P control device 816 have a common pressurized-air supply device 818, which supplies a pressurized air to each of the two control devices 814, 816.

The pressurized-air supply device 818 includes a high-pressure air source 820, an air-pressure regulator 822, a pressure switch 824, etc. The air-pressure regulator 822 includes a pressure-decrease valve with a relief member. In the present embodiment, the air-pressure regulator 822 regulates the pressurized air supplied from the high-pressure air source 820, to 0.5 MPa. The pressure switch 824 opens when the air pressure exceeds a predetermined value, e.g., 0.5 MPa. Adhesive is applied to PCBs by the adhesive applying heads 810–812.

Figure 38:
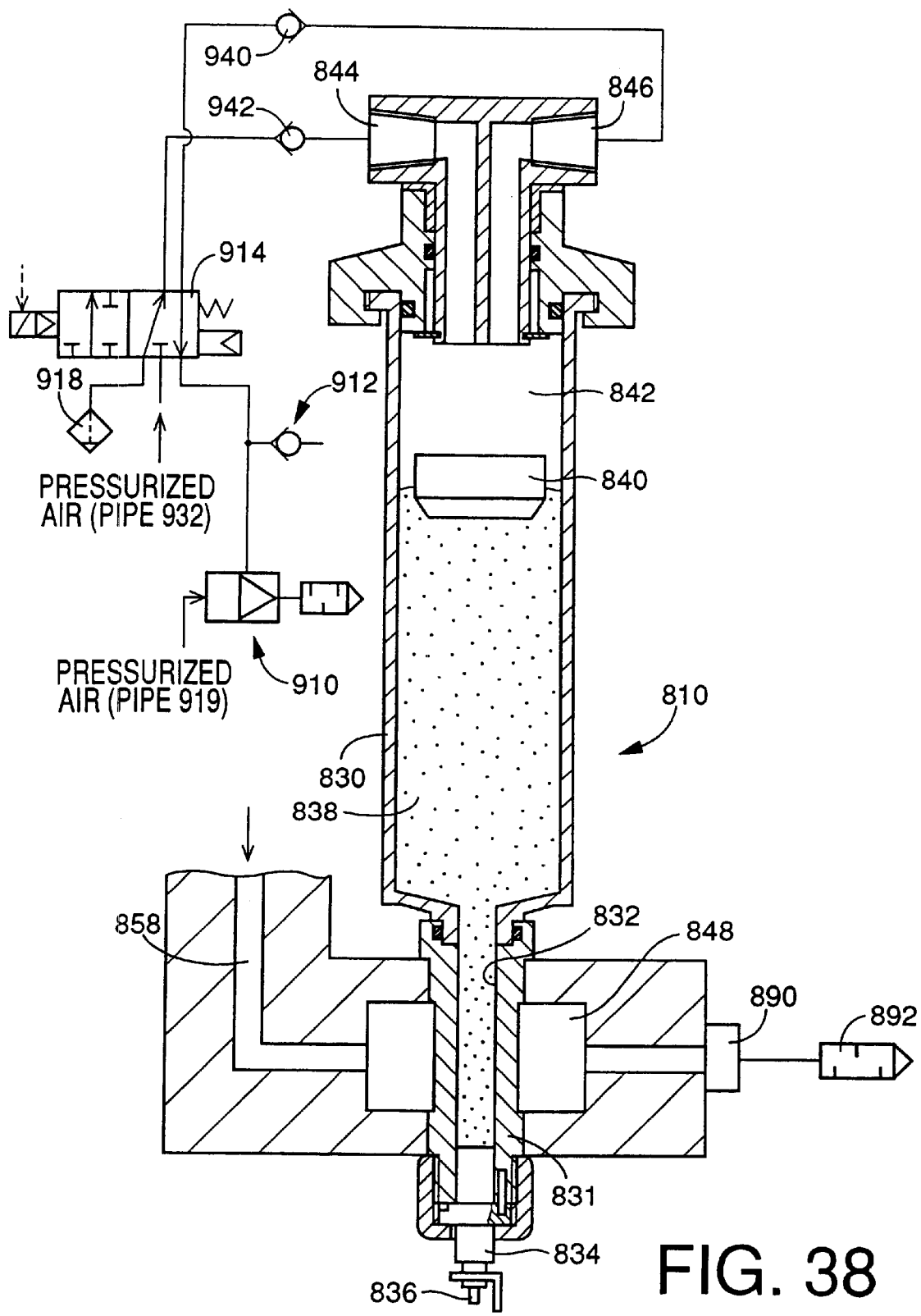
FIG. 38 is a cross-section view of an adhesive applying head of the adhesive dispenser of FIG. 37.

FIG. 38 shows the first adhesive applying head 810 as a representative of the first to third heads 810, 811, 812 which have the same construction. The first head 810 has a syringe 830, and a nozzle 834 which is connected via a supply passage 832 of a connector pipe 831 to a lower end portion of the syringe 830. A spout pipe 836 is attached to the nozzle 834. An adhesive 838 is stored in the syringe 830, and a float 840 floats on an upper surface of the adhesive 838 stored in the syringe 830, for detecting a remaining amount of the adhesive 838. An air supply passage 844 and an air suction passage 846 are connected to a space 842 above the float 840 in the syringe 830.

An axially intermediate portion of the supply passage 832, that is, an axially intermediate portion of the connector pipe 831 is surrounded by an annular passage 848 as an air passage. The annular passage 848 is supplied with an air whose temperature has been controlled to a desired value in a manner described later. In the present embodiment, the temperature of the adhesive 838 present in the supply passage is controlled by controlling the temperature of the air supplied to the annular passage 848.

The AT control device 814 includes, in addition to the pressurized-air supply device 818 and the annular passage 848, an in-line heater 850 as an air heating device, a vortex tube 852, solenoid-operated valves 854, 855, etc.

A piping 858 is connected at its one end to the pressurized-air supply device 818 and at its other end to the annular passage 848. In the piping 858, there are provided the in-line heater 850, a heater-pressure regulator 860, and the solenoid-operated valve 854 in series. The pressurized air of the supply device 818 is supplied to the in-line heater 850 after the air pressure has been decreased to a predetermined heater pressure (in the present embodiment, 0.04

MPa) by the heater-pressure regulator 860. A piping 861 connects the supply device 818 and the in-line heater 850, by by-passing the heater-pressure regulator 860 and the solenoid-operated valve 854. In the piping 861, there are provided a check valve 862, the vortex tube 852, a cooler-pressure regulator 864, and the solenoid-operated valve 854 in series.

Thus, the in-line heater to which the heater-pressure regulator 860 and the vortex tube 852 are connected is supplied with an air whose temperature is substantially equal to that of the ambient air, or an air which has been cooled by the vortex tube 852.

The in-line heater 850 heats the air supplied thereto, to a temperature corresponding to a command from a control device 868 which will be described later. The air heated by the in-line heater 850 is supplied to the annular passage 848. When the air whose temperature is substantially equal to that of the ambient air is supplied to the heater 850, the annular passage 848 is supplied with an air whose temperature is not lower than that of the ambient air; on the other hand, when the air which has been cooled by the vortex tube 852 is supplied to the heater 850, the annular passage 848 is supplied with an air whose temperature is between the temperature of the cooled air and the temperature of the ambient air, i.e., is lower than the temperature of the ambient air. Thus, the annular passage 848 can be supplied with the air whose temperature is, or is not, lower than that of the ambient air. Thus, the temperature of the adhesive 838 can be controlled at values not lower than that of the ambient air, or values lower than that of the ambient air.

Figure 39:
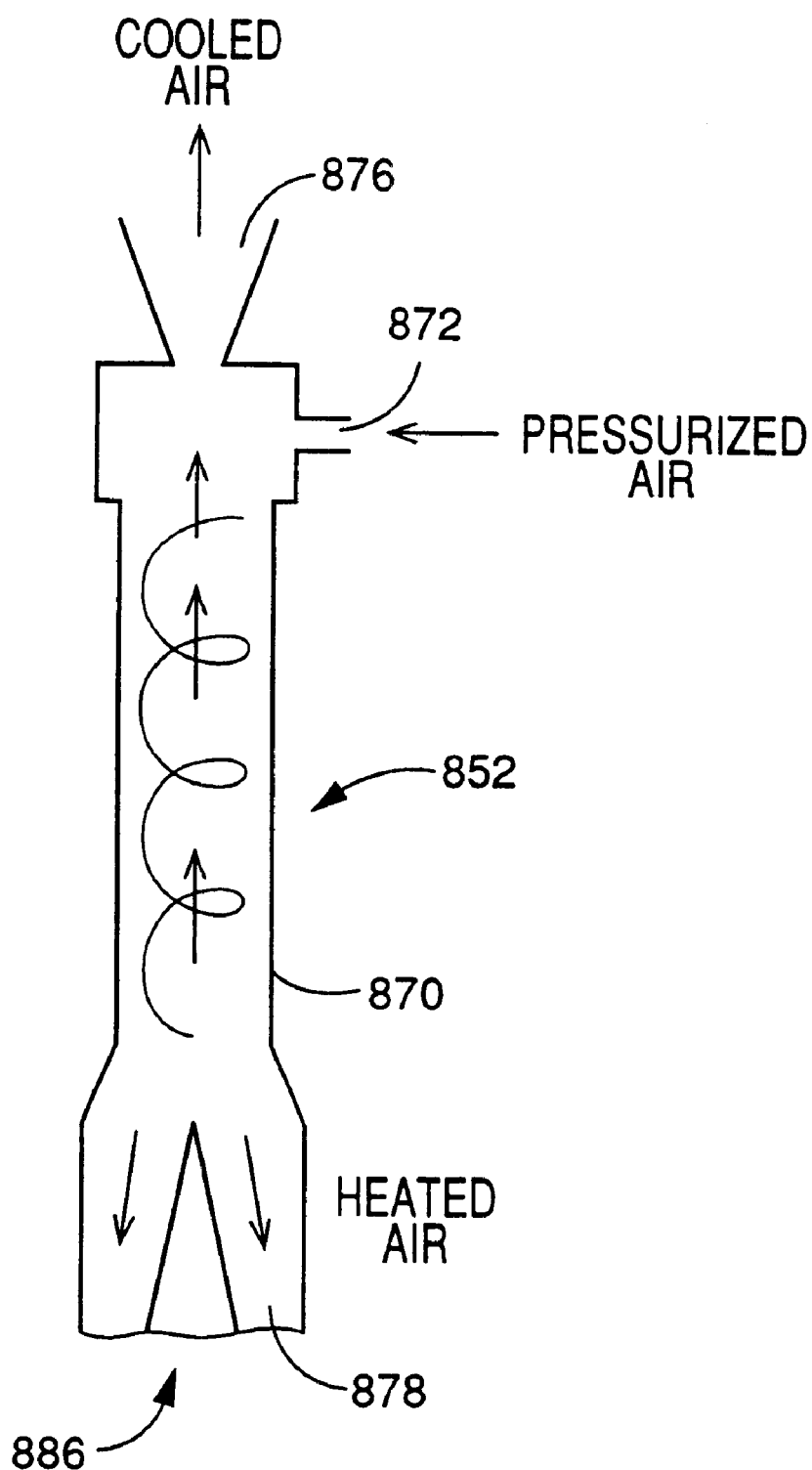
FIG. 39 is an illustrative view of a vortex tube employed in the adhesive dispenser of FIG. 37.

As shown in FIG. 39, the vortex tube 852 has a generally cylindrical shape, and has a compressed-air inlet 872 which is provided in one end portion of a main body 870 thereof. The tube 852 has a cooled-air outlet 876 at one end thereof, and a heated-air outlet 878 at the other end thereof. The cooler-pressure regulator 864 is connected to the compress-air inlet 872 via the piping 861, and the heated-air outlet 876 is connected to the in-line heater 850 via the check valve 862. A valve device 886 is provided in the heated-air outlet 878, so that the area of opening of the heated-air outlet 878 can be changed by operating the valve device 886. As the area of opening of the outlet 878 decreases, the amount of the cooled air supplied from the cooled-air outlet 876 increases but the temperature of the cooled air increases. A silencer 888 (FIG. 37) is connected to the heated-air outlet 878, so as to reduce noise which is generated when the heated air is released into the ambient air.

The compressed air which has passed the compressed-air inlet 872 expands in the main body 870 and moves downward like a vortex, so that a portion of the air is released via the heated-air outlet 878 and the remaining air moves upward through a central portion of the main body and passes through the cooled-air outlet 876.

Each of the solenoid valves 854, 855 is switchable to a communication position in which each valve communicates the supply device 818 and the in-line heater 850 with each other, and a shut-off position in which each valve does not. Each valve 854, 855 is switched by a drive circuit (not shown) in response to a command from the control device 868.

While both the solenoid valves 854, 855 are in their initial positions shown in FIG. 37, that is, while an operation for applying the adhesive 838 to PCBs is not carried out, no air is supplied to the annular passage 848.

While the valve 854 is in its communication position and the valve 855 is in its shut-off position, the in-line heater 850 is supplied with the air which is supplied from the heater-pressure regulator 860 and whose temperature is substantially equal to that of the ambient air. The heater 850 heats the air to a desired temperature not lower than that of the ambient air, and supplies the heated air to the annular passage 848. The annular passage 848 is supplied with the air whose temperature has been controlled to the desired temperature not lower than that of the ambient air. Thus, the temperature of the adhesive 838 present in the supply passage 832 is controlled to be substantially equal to that of the air present in the passage 848. The air supplied to the annular passage 848 is released into the atmosphere via an outlet 890 provided with a silencer 892. Hereinafter, this state in which only the air which has flown through only the in-line heater 850 is supplied to the annular passage 848 but no air which has flown through the vortex tube 852 is supplied to the same 848, will be referred to as the "heated-air supplying state".

In the heated-air supplying state, the check valve 862 provided in the piping 861 prevents the air supplied from the heater-pressure regulator 860 to the in-line heater 850, from flowing into the vortex tube 852 through the cooled-air outlet 876 thereof. If the air would flow into the vortex tube 852 through the cooled-air outlet 876, it would directly flow out of the heated-air outlet 878, thereby decreasing the overall amount of air supplied to the in-line heater 850 or the annular passage 848.

While the solenoid valve 854 is in its shut-off position and the solenoid valve 855 is in its communication position, the vortex tube 852 is supplied with the compressed air whose pressure has been regulated by the cooler-pressure regulator 864. The vortex tube 852 decreases the temperature of the air supplied thereto, by about 20° C., and the cooled air is supplied to the in-line heater 850 via the cooled-air outlet 876. The heater 850 heats the cooled air up to a desired temperature, and the heated air is supplied to the annular passage 848. Thus, the temperature of the air supplied to the annular passage 848 can take any desired value between the temperature of the ambient air and the temperature lower by about 20° C. than the ambient-air temperature, that is, value lower than the ambient-air temperature. Therefore, the temperature of the adhesive 838 can be controlled to any desired value lower than the ambient-air temperature.

In the above-indicated state, the heater-pressure regulator 860 prevents, like the check valve 862, the air supplied to the in-line heater 850 via the piping 861, from flowing into the solenoid valve 854. Hereinafter, this state in which only the air which has flown both the vortex tube 852 and the in-line heater 850 is supplied to the annular passage 848 but no air which has flown through only the in-line heater 850 is supplied to the same 848, will be referred to as the "cooled-air supplying state".

In the present embodiment, the pressurized-air supply device 818, the solenoid valves 854, 855, the pipings 858, 861, etc. cooperate with one another to provide an air supplying device.

In the piping 858, there are provided a filter 894 and a temperature sensor 896 between the supply device 818 and the solenoid valve 854. The filter 894 removes oil, dust, dirt, etc. from the air supplied from the supply device 818, and the temperature sensor 896 measures the temperature of the air before the air temperature is controlled, that is, the temperature of the air as supplied from the supply device that is substantially equal to the ambient-air temperature. In the piping 858, another temperature sensor 900 is provided between the in-line heater 850 and the annular passage 848. This temperature sensor 900 measures the temperature of the air after the air temperature has been controlled, that is, the temperature of the air as supplied to the annular passage 848. The respective output signals of the two sensors 896, 900 are supplied to the control device 868.

The P control device 816 which controls the pressure of the space 842 above the adhesive 838 stored in the syringe 830 of the applying head 810 includes, in addition to the pressurized-air supply device 818, an aspirator 910, a check valve 912, three solenoid-operated valves 914, 915, 916 provided for the three heads 810, 811, 812, respectively, a filter 918, etc. In the following description, the valve 914 will be described as a representative of the three valves 914, 915, 916.

The aspirator 910 is a suction device which utilizes a pressure difference caused by air flow, and is employed for sucking air from the space 842 above the adhesive 838 stored in the head 810. The aspirator 910 has an air inlet which is connected via a piping 919 to the pressurized-air supply device 818. In the piping 919, there are provided a solenoid-operated valve 920, a suction-pressure regulator 922, etc.

The solenoid valve 920 is switchable to a release position in which the valve 920 communicates the air inlet of the aspirator 910 with the atmosphere, and to a connect position in which the valve 920 communicates the air inlet of the aspirator 910 with the supply device 818. While the valve 920 is normally in its release position shown in FIG. 37, it is switched to its connect position at least while the aspirator 910 is operating. Thus, the pressurized air is supplied from the supply device 818 via the valve 920 to the suction-pressure regulator 922, which results in decreasing the pressure of the air. This air is supplied to the aspirator 910. The higher the pressure of the air regulated by the regulator 922 is, the greater the pressure difference which occurs in the aspirator 910 is, and the greater the amount of air sucked by the aspirator 910 is.

The check valve 912 permits the air in the space 842 to be released into the atmosphere when the pressure on the side of the solenoid valve 914, that is, the pressure of the space 842 is higher than the atmospheric pressure, and the valve 912 inhibits air from flowing from the atmosphere into the space 842 when the pressure of the space 842 is lower than the atmospheric pressure. The check valve 912 is connected to the space 842, in parallel with the aspirator 910.

The filter 918 serves as a restrictor which decreases the amount of air flowing from the atmosphere into the space 842. This flow-in amount of air is substantially equal to the flow-out amount of air sucked from the space 842 by the aspirator 910, when the pressure of the space 842 takes a predetermined negative pressure.

The solenoid valve 914 is connected to the supply device 918, the air inlet of the aspirator 110 and the check valve 912, the filter 918, the air-supply passage 844 connected to the space 842, and the air-suction passage 846. The valve 914 and the supply device 818 are connected to each other via a piping 932, and an application-pressure regulator 934 is provided in the piping 932. The pressurized air whose pressure has been regulated by the regulator 934 is supplied to the space 842 for applying a positive pressure to the adhesive 838 and thereby spouting or releasing a desired amount of adhesive 838 from the head 810.

A check valve 940 is provided between the solenoid valve 914 and the air-suction passage 846, and another check valve 942 is provided between the solenoid valve 914 and the air-supply passage 844. The check valve 940 permits the air to flow from the space 842 to the valve 914 and inhibits the air from flowing from the valve 914 to the space 482, and the check valve 942 permits the air to flow from the valve 914 to the space 842 and inhibits the air from flowing from the space 842 to the valve 914. The check valves 940, 942 are employed for preventing the air from flowing back, so that the air appropriately circulates in the space 842.

The solenoid valve 914 is normally in its suction position (i.e., non-application position) shown in FIGS. 37 and 38. In this position, the air-suction passage 846 is connected to the air-supply inlet of the aspirator 910 and the check valve 912, and the air-supply passage 844 is connected to the filter 918. If the valve 914 is switched to its press position (i.e., application position), the air-supply passage 844 is connected via the piping 932 to the supply device 818, and the air-suction passage 846 is disconnected from the aspirator 910 and the check valve 912.

While the solenoid valve 914 is in its press position, the space 842 is supplied with the pressurized air whose pressure has been regulated by the application-pressure regulator 934, as described above. When the pressure of the space 842 increases, the adhesive 838 is pressed, and spouted from the head 810. Hereinafter, this state will be referred to as the "adhesive pressing" state.

When the solenoid valve 914 is switched to its suction position, the space 842 is communicated with the air inlet of the aspirator 910, the filter 918, and the atmosphere via the check valve 912. For a while following this switching, the pressure of the space 842 is higher than the atmospheric pressure. Accordingly, the air in the space 842 is released into the atmosphere via the check valve 912, and is sucked by the aspirator 910. Thus, the pressure of the space 842 quickly decreases. This state is the "adhesive sucking" state and simultaneously the "air releasing" state. When the pressure of the space 842 decreases down to a predetermined negative pressure, the flow-out amount of air sucked from the space 842 by the aspirator 910 becomes equal to the flow-in amount of air supplied to the space 842 from the atmosphere via the filter 918, as described above. Therefore, the pressure of the space 842 is held at the predetermined negative pressure. In this state, no air is supplied to the space 842 from the atmosphere via the check valve 912. This state is the "negative-pressure holding" state.

The control device 868 includes a computer as an essential part thereof, and has input ports connected to the temperature sensors 896, 900, etc. and output ports connected to respective solenoids of the solenoid-operated valves 854, 855, 914, 915, 916, 920, a heater element of the in-line heater 850, etc. via respective drive circuits (not shown). The computer has a read only memory (ROM) in which a number of control programs for applying an adhesive to PCBs are stored. According to the control programs, the control device 868 controls each of the solenoid valves 914–916 so that the adhesive 838 is applied to each PCB at a predetermined timing, and controls the solenoid valves 854, 855, the in-line heater 850, etc. based on the output signals from the temperature sensors 896, 900, etc. In the present embodiment, when the adhesive 838 is applied to each PCB, the solenoid valve 920 is held at its connect position in which the valve 920 permits the pressurized air to be supplied to the air-supply inlet of the aspirator 910.

Next, there will be described the operation of the adhesive dispenser 800 constructed as described.

Before the adhesive 838 is applied to the object, the temperature of the adhesive 838 present in the supply passage 838 is controlled to a predetermined value suitable for the application of the adhesive 838. In the case where the predetermined value is higher than the ambient-air temperature detected by the temperature sensor 896, the solenoid valve 854 is switched to its communication position and the valve 855 is held at its shut-off position. Accordingly, the in-line heater 850 is supplied with the air whose temperature is substantially equal to the ambient-air temperature, and heats the air up to the predetermined value. The air heated is supplied to the annular passage 848. Thus, in the case where the temperature, $T_1$, of the air (i.e., ambient-air temperature) is not higher than the predetermined value, $T_0$, that is, in the case of $T_0 \geq T_1$, the AT control device 814 only heats the air up to the predetermined value $T_0$.

On the other hand, in the case where the predetermined value $T_0$ is lower than the ambient-air temperature $T_1$, the solenoid valve 855 is switched to its communication position and the valve 854 is held at its shut-off position. The air supplied to the vortex tube 852 is cooled down to a value lower by about 20° C. than the ambient-air atmosphere $T_0$, and the air cooled is supplied to the in-line heater 850. The heater 850 heats the air up to the predetermined value $T_0$, and the air heated is supplied to the annular passage 848. Thus, in the case where the air temperature $T_1$ is higher than the predetermined value $T_0$, that is, in the case of $T_0 < T_1$, the AT control device 814 cools the air down to a value, $T_2$, lower than the predetermined value $T_0$ ($T_1 > T_0 > T_2$) and then heats the cooled air up to the predetermined value $T_0$.

In the present embodiment, the annular passage 848 is supplied with the air having the predetermined or desired temperature $T_0$, and accordingly the temperature of the adhesive 838 present in the supply passage 832 is controlled to the predetermined value $T_0$. Thus, the present adhesive dispenser 800 can control the temperature of the adhesive 838 to the predetermined value $T_0$, in a shorter time than the known adhesive dispensers. In addition, the present adhesive dispenser 800 can control the temperature of the adhesive 838 to the predetermined value $T_0$, with less energy than the known adhesive dispensers, without having to increase the overall size thereof.

When the adhesive 838 stored in the syringe 830 is applied to the PCB, the solenoid valve 914 is switched to its press position. The space 842 is supplied via the piping 932 with the pressurized air whose pressure has been regulated to an application pressure, and an appropriate amount of the adhesive 838 is spouted or released from the spout pipe 836. Then, the valve 914 is switched to its suction position as shown in FIGS. 37 and 38. Thus, the space 842 is communicated with the filter 918 and the aspirator 910, and simultaneously is communicated with the atmosphere via the check valve 912. The air in the space 842 is sucked by the aspirator 910 and is released into the atmosphere via the check valve 912. As a result, the pressure in the space 842 is quickly decreased, and accordingly the spouting of the adhesive from the spout pipe 836 is quickly stopped. Once the pressure of the space 842 is decreased down to the predetermined negative pressure, the flow-in amount of air supplied from the atmosphere via the filter 918 is substantially equal to the flow-out amount of air sucked by the aspirator 910, so that the pressure of the space 842 is held at the predetermined negative pressure.

Since the pressure in the space 842 is quickly decreased when the valve 914 is switched from its press position to its suction position, the pressure of the space 842 is more quickly decreased down to a value at which the spouting of the adhesive 838 from the head 810 stops, than in the case where the space 842 is just communicated with the atmosphere. That is, the spouting of the adhesive 838 is more quickly stopped. Therefore, the present adhesive dispenser 800 enjoys an improved accuracy of control of the amount of adhesive 838 applied to each position on a PCB. In addition, since the pressure of the space 842 is held at the predetermined negative pressure, the spouting of the adhesive 838 from the spout pipe 836 is stopped with reliability, and accordingly bubbles do not occur in the adhesive 838 stored in the syringe 830.

As is apparent from the foregoing description, the present adhesive dispenser 800 can control the temperature of the adhesive 838 to a desired value in a shortened time duration, and can quickly stop the spouting or releasing of the adhesive 838 from the spout pipe 836. Thus, the present dispenser 800 enjoys an improved degree of operability with respect to the adhesive applying operation.

The control device 868 additionally controls a PCB positioning and supporting device (not shown) which positions and supports each PCB to which the adhesive 838 is applied by the adhesive applying heads 810–812. The control device 868 receives, from the control device 34 of the CC mounting system 10, data indicative of one or more candidates for the cause of an inappropriate mounting of a CC 18 on a PCB 20. If the candidate is that the adhesive dispenser 800 applied an inappropriate (excessive or insufficient) amount of adhesive to the PCB 20, the control device 868 controls the AT control device 814 and the P control device 816 so that the adhesive applying heads 810–812 apply an appropriate amount of adhesive to each PCB 18. If the candidate is that the adhesive dispenser 800 applied the adhesive 836 to an incorrect position on the PCB 20, the control device 868 controls the PCB positioning and supporting device to position each PCB at adjusted X-direction, Y-direction, and rotation positions.

It is to be understood that the present invention may be embodied with other changes, improvements, and modifications that may occur to those skilled in the art without departing from the scope and spirit of the invention defined in the appended claims.

What is claimed is:

1. A method of automatically mounting, with a component mounting device, each one of a plurality of circuit components on a circuit substrate for producing an electric circuit, while automatically inspecting, with an inspecting device, whether said each one circuit component has been appropriately mounted on the circuit substrate, comprising the steps of:
   automatically causing the component mounting device to perform a circuit component mounting operation to mount said each one circuit component on the circuit substrate and temporarily fix, with a temporary fixing material, said each one circuit component to the circuit substrate, and
   automatically causing the inspecting device to inspect, after said circuit component mounting operation has been performed and before a next circuit component mounting operation is performed, whether said each one circuit component has been appropriately temporarily mounted on the circuit substrate.

2. A method according to claim 1, further comprising the step of applying, to a plurality of component-mount places on a surface or the circuit substrate, the temporary fixing material which temporarily and stably fixes said each one circuit component to a corresponding one of the component-mount places on the surface of the circuit substrate, wherein the inspecting step comprises inspecting whether said each one circuit component has been appropriately temporarily fixed, at said one component-mount place to the circuit substrate with the temporary fixing material.

3. A method according to claim 2, further comprising the step of controlling, when said each one circuit component has not been appropriately mounted on the circuit substrate, a controllable device for preventing the other circuit components from being mounted on the circuit substrate in respective states different from respective reference states thereof.

4. A method according to claim 1, further comprising the steps of storing data indicating said each one circuit component when said each one circuit component has not been appropriately temporarily mounted on the circuit substrate, and outputting, after all the circuit components ate mounted on the circuit substrate, the stored data, so that an operator can recognize said each one circuit component indicated by the outputted data.

5. A method according to claim 1, further comprising the step of temporarily stopping, when said each one circuit component has not been appropriately mounted on the circuit substrate, the other circuit component mounting operations, so that the other circuit components are not mounted on the circuit substrate.

6. A method according to claim 1, wherein the inspecting step comprises inspecting whether said each one circuit component has been appropriately temporarily mounted on the circuit substrate, with respect to at least one of a number of situations including (a) whether said each one circuit component is present on the circuit substrate, (b) whether said each one circuit component is positioned substantially correctly at at least one reference position in at least one of a plurality of first directions parallel to the circuit substrate and a second direction perpendicular to the circuit substrate, and (c) whether said each one circuit component is positioned substantially correctly at a reference angular position about an axis line perpendicular to the circuit substrate.

7. A method according to claim 1, wherein the inspecting step comprises emitting a planar light running along a plane which is inclined with respect to a surface of the circuit substrate and intersects a surface of said each one circuit component mounted on said surface of the circuit substrate, taking an image of at least an area of said surface of said each one circuit component which area is exposed to the planar light, and judging, based on the taken image, whether said each one circuit component has been appropriately temporarily mounted on the circuit substrate.

8. A method according to claim 1, wherein the inspecting step comprises emitting a planar light running along a plane which is inclined with respect to a surface of the circuit substrate and intersects said surface of the circuit substrate and a surface of said each one circuit component mounted on said surface of the circuit substrate, taking a two-dimensional image of at least an area of said surface of the circuit substrate and a two-dimensional image of at least an area of said surface of said each one circuit component which areas are exposed to the planar light, and judging whether said each one circuit component has been appropriately temporarily mounted on the circuit substrate, based on a positional relationship between respective images formed by the planar light on the respective areas of the respective surfaces of the circuit substrate and said each one circuit component.

9. A method according to claim 1, wherein the inspecting step comprises:

taking an image of at least an area of a surface of said each one circuit component, and judging, based on the taken image, whether said each one circuit component has been appropriately temporarily mounted on the circuit substrate.

10. A method according to claim 1, wherein the temporary fixing material is selected from the group consisting of an adhesive and a solder paste.

\* \* \* \* \*